(12) United States Patent
Park et al.

(10) Patent No.: US 11,877,478 B2
(45) Date of Patent: Jan. 16, 2024

(54) DISPLAY DEVICE

(71) Applicant: Samsung Display Co., LTD., Yongin-si (KR)

(72) Inventors: Do Yeong Park, Hwaseong-si (KR); Kyung Bae Kim, Seongnam-si (KR); Mee Hye Jung, Suwon-si (KR); Chong Chul Chai, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 211 days.

(21) Appl. No.: 17/395,004

(22) Filed: Aug. 5, 2021

(65) Prior Publication Data

US 2022/0059628 A1 Feb. 24, 2022

(30) Foreign Application Priority Data

Aug. 24, 2020 (KR) ........................ 10-2020-0106305

(51) Int. Cl.
  *H10K 59/122* (2023.01)
  *H10K 59/35* (2023.01)

(52) U.S. Cl.
  CPC ......... *H10K 59/122* (2023.02); *H10K 59/353* (2023.02)

(58) Field of Classification Search
  None
  See application file for complete search history.

(56) References Cited

U.S. PATENT DOCUMENTS

| | | | |
|---|---|---|---|
| 7,030,556 B2 | 4/2006 | Adachi et al. |
| 7,279,833 B2 | 10/2007 | Adachi et al. |
| 7,812,515 B2 | 10/2010 | Adachi et al. |
| 8,049,405 B2 | 11/2011 | Adachi et al. |
| 8,193,697 B2 | 6/2012 | Adachi et al. |
| 8,558,449 B2 | 10/2013 | Adachi et al. |

(Continued)

FOREIGN PATENT DOCUMENTS

| | | |
|---|---|---|
| KR | 10-2018-0003335 | 1/2018 |
| KR | 10-2018-0009014 | 1/2018 |

(Continued)

OTHER PUBLICATIONS

International Search Report corresponding to International Application No. PCT/KR2021/011194 dated Nov. 30, 2021.

(Continued)

*Primary Examiner* — Michelle Mandala
(74) *Attorney, Agent, or Firm* — KILE PARK REED & HOUTTEMAN PLLC

(57) ABSTRACT

A display device includes subpixels each comprising an emission area, electrodes which are disposed in the emission area, extend in a first direction, and are spaced apart in a second direction intersecting the first direction, a first insulating layer disposed on the electrodes, a first bank, and light emitting elements. The first bank includes a first bank part disposed on the first insulating layer and surrounding the emission area, and a second bank part connected to the first bank part and disposed in the emission area. The light emitting elements are disposed on the electrodes spaced apart in the second direction. A height of the second bank part of the first bank is lower than a height of the first bank part of the first bank.

19 Claims, 33 Drawing Sheets

(56) References Cited

U.S. PATENT DOCUMENTS

| | | |
|---|---|---|
| 8,791,632 B2 | 7/2014 | Adachi et al. |
| 8,928,221 B2 | 1/2015 | Adachi et al. |
| 8,987,765 B2 | 3/2015 | Bibl et al. |
| 9,153,634 B2 | 10/2015 | Adachi et al. |
| 9,240,397 B2 | 1/2016 | Bibl et al. |
| 9,276,052 B2 | 3/2016 | Adachi et al. |
| 9,570,427 B2 | 2/2017 | Bibl et al. |
| 9,595,573 B2 | 3/2017 | Adachi et al. |
| 9,799,714 B2 | 10/2017 | Adachi et al. |
| 9,876,000 B2 | 1/2018 | Moss et al. |
| 9,966,421 B2 | 5/2018 | Adachi et al. |
| 10,192,942 B2 | 1/2019 | Adachi et al. |
| 10,256,221 B2 | 4/2019 | Bibl et al. |
| 10,573,629 B2 | 2/2020 | Bibl et al. |
| 11,004,836 B2 | 5/2021 | Bibl et al. |
| 2019/0006626 A1* | 1/2019 | Kim ................ H10K 50/85 |
| 2019/0165326 A1* | 5/2019 | Kim ................ H10K 50/865 |
| 2021/0313305 A1 | 10/2021 | Bibl et al. |
| 2021/0375194 A1 | 12/2021 | Kwag et al. |
| 2022/0069004 A1* | 3/2022 | Kang ................ H01L 33/58 |
| 2023/0109516 A1* | 4/2023 | Saitoh ............ H10K 77/111 257/40 |

FOREIGN PATENT DOCUMENTS

| | | |
|---|---|---|
| KR | 10-2018-0011404 | 2/2018 |
| KR | 10-1888941 | 8/2018 |
| KR | 10-1987196 | 6/2019 |
| KR | 10-2024098 | 9/2019 |
| KR | 10-2020-0034896 | 4/2020 |
| KR | 10-2020-0034905 | 4/2020 |
| KR | 10-2020-0042075 | 4/2020 |
| KR | 10-2020-0070493 | 6/2020 |
| KR | 10-2021-0055829 | 5/2021 |

OTHER PUBLICATIONS

Written Opinion corresponding to International Application No. PCT/KR2021/011194 dated Nov. 30, 2021.

* cited by examiner

FIG. 1
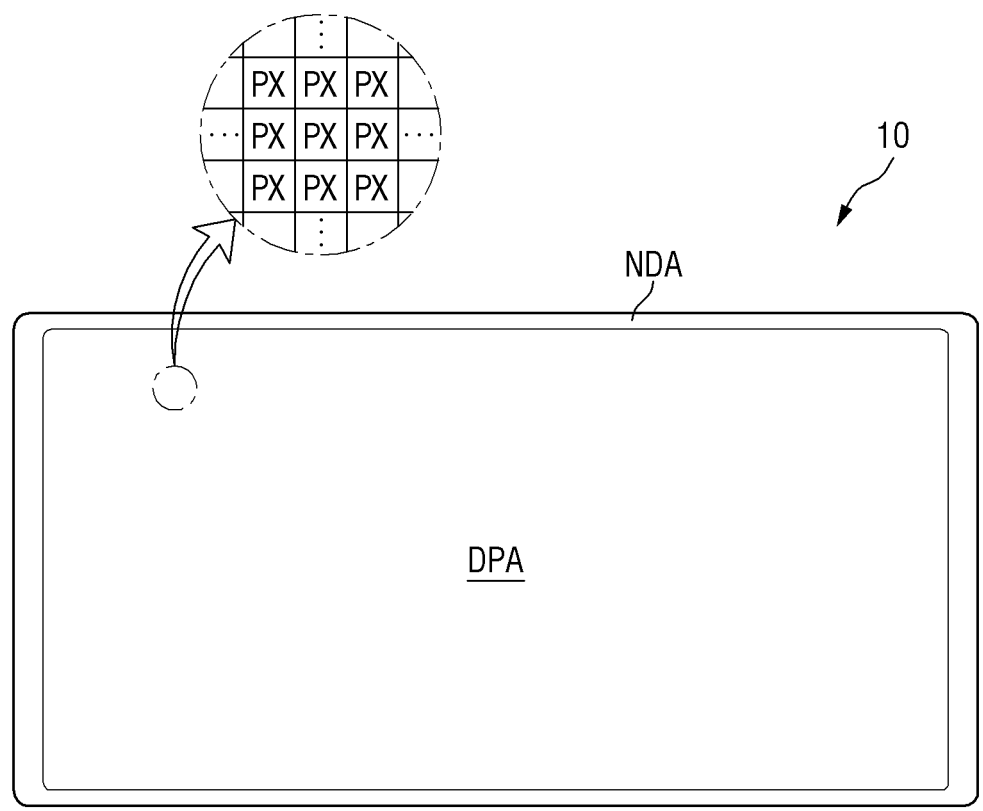
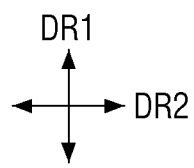

DISPLAY DEVICE

CROSS-REFERENCE TO RELATED APPLICATION(S)

This application claims priority to and benefits of Korean Patent Application No. 10-2020-0106305 under 35 U.S.C. § 119, filed on Aug. 24, 2020 in the Korean Intellectual Property Office, the entire contents of which are incorporated herein by reference.

BACKGROUND

1. Field

The disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device which can reduce the number of light emitting elements that are aligned in an unwanted area and lost.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include subpixels each comprising an emission area, electrodes which may be disposed in the emission area, extend in a first direction, and are spaced apart in a second direction intersecting the first direction, a first insulating layer disposed on the electrodes, a first bank, and light emitting elements. The first bank may include a first bank part disposed on the first insulating layer and surrounding the emission area, and a second bank part connected to the first bank part and disposed in the emission area. The light emitting elements may be disposed on the electrodes spaced apart in the second direction. A height of the second bank part of the first bank may be lower than a height of the first bank part of the first bank.

The display device may include a second insulating layer which may be disposed on the light emitting elements and the second bank part and may expose the ends of each of the light emitting elements, and contact electrodes which may be disposed on the electrodes and the second insulating layer and may contact the light emitting elements.

The first insulating layer may include first contact portions which partially expose upper surfaces of the electrodes. The display device may include first contact holes which may be formed on the first contact portions and may penetrate the second bank part and the second insulating layer.

A sidewall of the second insulating layer may be aligned with a sidewall of the second bank part in the first contact holes.

At least one of the contact electrodes may electrically contact at least one of the electrodes through at least one of the first contact holes and at least one of the first contact portions.

The first insulating layer may include second contact portions which partially expose the upper surfaces of the electrodes. The display device may include a third insulating layer which may be disposed on the second insulating layer, and second contact holes which may be formed on the second contact portions. The second contact holes may penetrate the second bank part, the second insulating layer, and the third insulating layer.

At least one of the contact electrodes may electrically contact at least one of the electrodes through at least one of the second contact holes and at least one of the second contact portions.

The display device may include third contact holes which may be formed on the second contact portions and penetrate the second bank part and the second insulating layer. The display device may include third contact portions which may be formed on the third contact holes to penetrate the third insulating layer. At least one of the contact electrodes may electrically contact at least one of the electrodes through at least one of the third contact portions, at least one of the third contact holes, and at least one of the second contact portions.

The display device may include bridge electrodes which may be disposed on the second insulating layer and may be disposed on the second contact portions and the third contact holes. At least one of the contact electrodes may electrically contact the bridge electrodes through at least one of the third contact portions.

The third contact portions may be formed on the second contact portions.

The first insulating layer may include fourth contact portions which may partially expose the upper surfaces of the electrodes. The display device may include fourth contact holes which may be formed on the fourth contact portions and may penetrate the second bank part and the second insulating layer. The display device may include fifth contact portions which penetrate the third insulating layer and do not overlap the fourth contact holes.

The display device may include bridge electrodes which may be disposed on the second insulating layer and may be disposed on the fourth contact portions and the fourth contact holes, wherein at least one of the contact electrodes may electrically contact at least one of the bridge electrodes through at least one of the fifth contact portions.

The electrodes may include a first electrode group and a second electrode group spaced apart from the first electrode group in the first direction. The first bank may include a first opening and a second opening. The first opening may overlap the first electrode group and may expose the first insulating layer. The second opening may be spaced apart from the first opening in the first direction, may overlap the second electrode group, and may expose the first insulating layer.

The light emitting elements may be disposed on the first insulating layer in the first opening and in the second opening.

The second bank part may include a third opening which is disposed between the first opening and the second opening. The first insulating layer may be not disposed in the third opening, and the first electrode group and the second electrode group may be spaced apart in the first direction in the third opening.

The display device may include a sub area which is located in the first direction of the emission area. The first bank part may surround the sub area.

According to an embodiment, a display device may include an emission area, a sub area which is spaced apart from the emission area in a first direction, a first electrode group, a second electrode group, a first insulating layer, a first bank, and light emitting elements. The first electrode group may include electrodes that may extend in the first direction and may be spaced apart in a second direction intersecting the first direction. The second electrode group may be spaced apart from the first electrode group in the first direction and may include electrodes. The first insulating layer may be disposed on the electrodes of the first electrode group and the second electrode group, and may include first contact portions and second contact portions that expose the upper surfaces of the electrodes of the first electrode group and the second electrode group. The first bank may include a first bank part that may be disposed on the first insulating layer and may surround the emission area and the sub area. The first bank may also include a second bank part that may be connected to the first bank part, may be disposed in the emission area, and may partially overlap the electrodes. The light emitting elements may be disposed on the electrodes of the first electrode group and the second electrode group that are spaced apart in the second direction. The second bank part may include a first opening which overlaps the first electrode group and exposes the first insulating layer, and may include a second opening which overlaps the second electrode group and exposes the first insulating layer. The light emitting elements may be disposed in the first opening or the second opening.

The height of the second bank part may be lower than the height of the first bank part.

The display device may include a second insulating layer, a third insulating layer, first contact holes, and second contact holes. The second insulating layer may be disposed on the second bank part and the light emitting elements and may expose both ends of each of the light emitting elements. The third insulating layer may be disposed on the second insulating layer. The first contact holes may penetrate the second insulating layer and the second bank part and may be disposed on the first contact portions. The second contact holes may penetrate the second bank part, the second insulating layer and the third insulating layer and may be disposed on the second contact portions.

The display device may include contact electrodes which may be disposed on the electrodes of the first electrode group and the second electrode group and may electrically contact the light emitting elements. At least one of the contact electrodes may be disposed on the second insulating layer any may electrically contact at least one of the electrodes through a first contact hole. At least one of the contact electrodes may be disposed on the third insulating layer and may electrically contact at least one of the electrodes through a second contact hole.

BRIEF DESCRIPTION OF THE DRAWINGS

The above and other aspects and features of the embodiments will become more apparent by describing embodiments thereof in detail with reference to the attached drawings, in which:

FIG. 1 is a schematic plan view of a display device according to an embodiment;

DETAILED DESCRIPTION OF THE EMBODIMENTS

Figure 2:
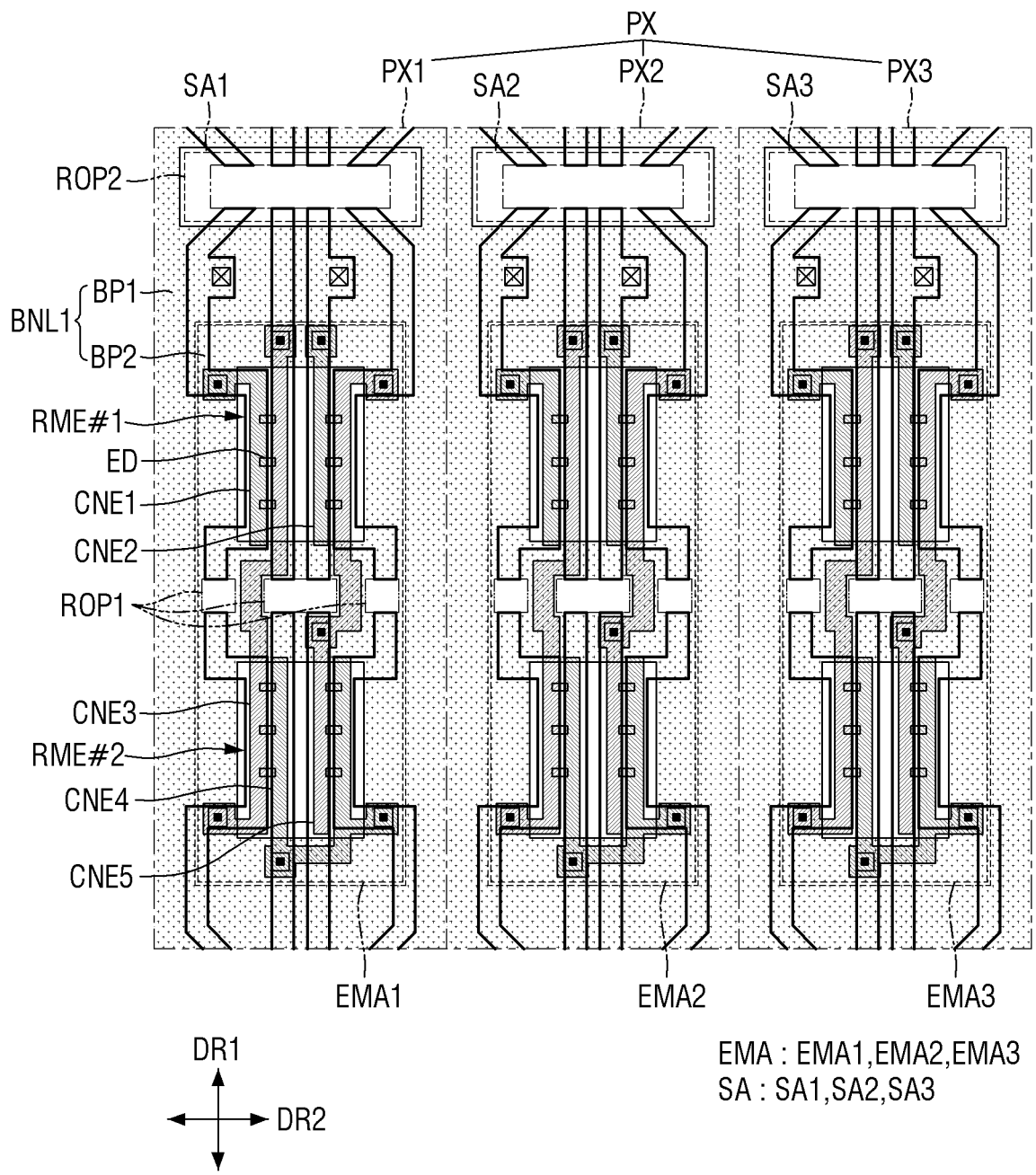
FIG. 2 is a schematic plan view of a pixel of the display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween. It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the attached drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and camcorders, all of which provide a display screen.

The display device 10 includes a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the embodiments are not limited to this case, and other display panels can also be applied as long as the same technical spirit is applicable.

The shape of the display device 10 may be modified in various ways. For example, the display device 10 may have various shapes such as a horizontally long rectangle, a vertically long rectangle, a square, a quadrangle with rounded corners (vertices), other polygons, or a circle. The shape of a display area DPA of the display device 10 may also be similar to the overall shape of the display device 10. In FIG. 1, the display device 10 is shaped like a rectangle that is long in a second direction DR2.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix pattern. Each of the pixels PX may be rectangular or square in a plan view. However, embodiments are not limited thereto, and each of the pixels PX may also have a rhombic planar shape having each side inclined with respect to a direction. The pixels PX may be alternately arranged in a stripe or a PenTile® pattern. Each of the pixels PX may include one or more light emitting elements which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In the non-display areas NDA, wiring or circuit drivers included in the display device 10 may be disposed, or external devices may be mounted.

FIG. 2 is a schematic plan view of a pixel PX of the display device 10 according to the embodiments.

Referring to FIG. 2, each of the pixels PX of the display device 10 may include multiple subpixels PXn (where n is 1 to 3). For example, a pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the embodiments are not limited thereto, and the subpixels PXn may also emit light of the same color. Although a pixel PX includes three subpixels PXn in FIG. 2, the embodiments are not limited thereto, and the pixels PX may also include a larger number of subpixels PXn.

Each subpixel PXn of the display device 10 may include an emission area EMA and a non-emission area (not illustrated). The emission area EMA may be an area in which light emitting elements ED are disposed to emit light of a specific wavelength band, and the non-emission area may be an area in which the light emitting elements ED are not disposed and from which no light is output because light emitted from the light emitting elements ED does not reach this area. The emission area EMA may include an area in which the light emitting elements ED are disposed and an area which is adjacent to the light emitting elements ED and to which light emitted from the light emitting elements ED is output.

However, the embodiments are not limited thereto, and the emission area EMA may also include an area from which light emitted from the light emitting elements ED is output after being reflected or refracted by other components. The light emitting elements ED may be disposed in each subpixel PXn, and an area where the light emitting elements ED are disposed and an adjacent area may form the emission area EMA.

Although a first emission area EMA1 of the first subpixel PX1, a second emission area EMA2 of the second subpixel PX2, and a third emission area EMA3 of the third subpixel PX3 have substantially the same area in the drawing, the embodiments are not limited thereto. In some embodiments, the emission area EMA of each subpixel PXn may have a different area according to the color or wavelength band of light emitted from the light emitting elements ED disposed in the corresponding subpixel PXn.

Each subpixel PXn may further include a sub area SA disposed in the non-emission area. The sub area SA may be disposed on a first side of the emission area EMA in a first direction DR1 and may be disposed between the emission areas EMA of subpixels PXn neighboring in the first direction DR1. For example, emission areas EMA may be arranged side by side and the sub areas SA may be arranged side by side in the second direction DR2. But the emission areas EMA and the sub areas SA may be arranged to alternate in the first direction DR1. A first bank BNL1 may be disposed between the sub areas SA and the emission areas EMA, and a gap between them may vary according to the width of the first bank BNL1. Light may not exit from the sub area SA because the light emitting elements ED are not disposed in the sub area SA, but parts of the electrodes RME disposed in each subpixel PXn may be disposed in the sub area SA. The electrodes RME disposed in some subpixels PXn may be separated from each other in the sub area SA.

The first bank BNL1 may include parts extending in the first direction DR1 and the second direction DR2 in a plan view to form a lattice pattern over the entire display area DPA. The first bank BNL1 may be disposed at the boundary of each subpixel PXn to separate neighboring subpixels PXn. The first bank BNL1 may surround the emission area EMA and the sub area SA disposed in each subpixel PXn to separate them from each other.

According to an embodiment, the first bank BNL1 of the display device 10 may include a first bank part BP1 which separates neighboring subpixels PXn and surrounds the emission areas EMA and the sub areas SA and a second bank part BP2 which is disposed in the emission areas EMA and has a lower height than the first bank part BP1. The first bank BNL1 may surround and separate multiple areas defined in the display area DPA, for example, the subpixels PXn, the emission areas EMA, and the sub areas SA. The first bank BNL1 may further include a part disposed in each emission area EMA in which the light emitting elements ED are disposed to facilitate the alignment of the light emitting elements ED. The first bank BNL1 may also include openings OP1 through OP4 (refer to FIG. 3) and contact holes CNT1 and CNT2 (refer to FIG. 4) across the entire display area DPA in addition to the first bank parts BP1 and the second bank parts BP2 integrated with each other. The structure of the first bank BNL1 will be described below with reference to other drawings.

Figure 3:
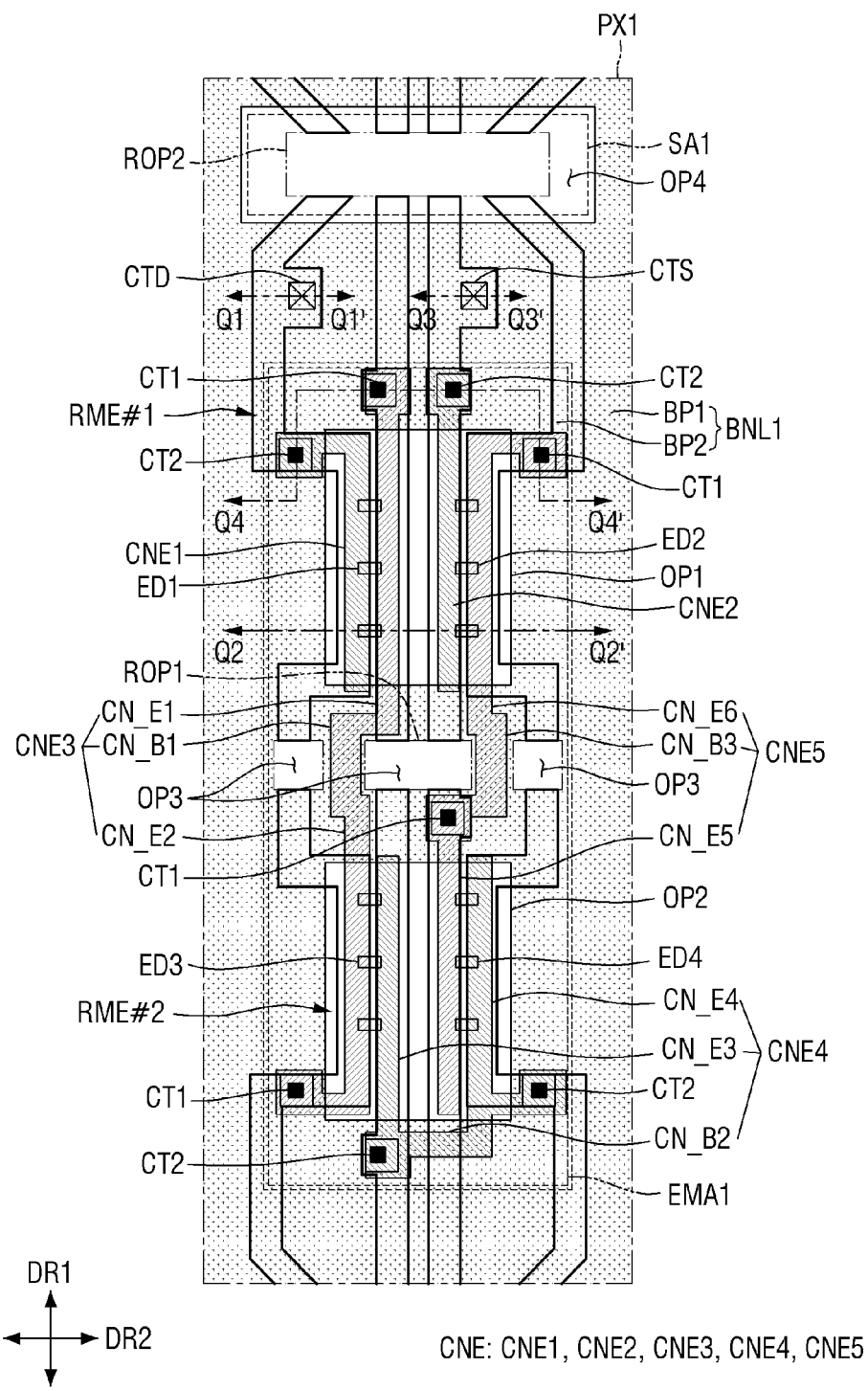
FIG. 3 is a schematic plan view of a first subpixel of FIG. 2.
Figure 4:
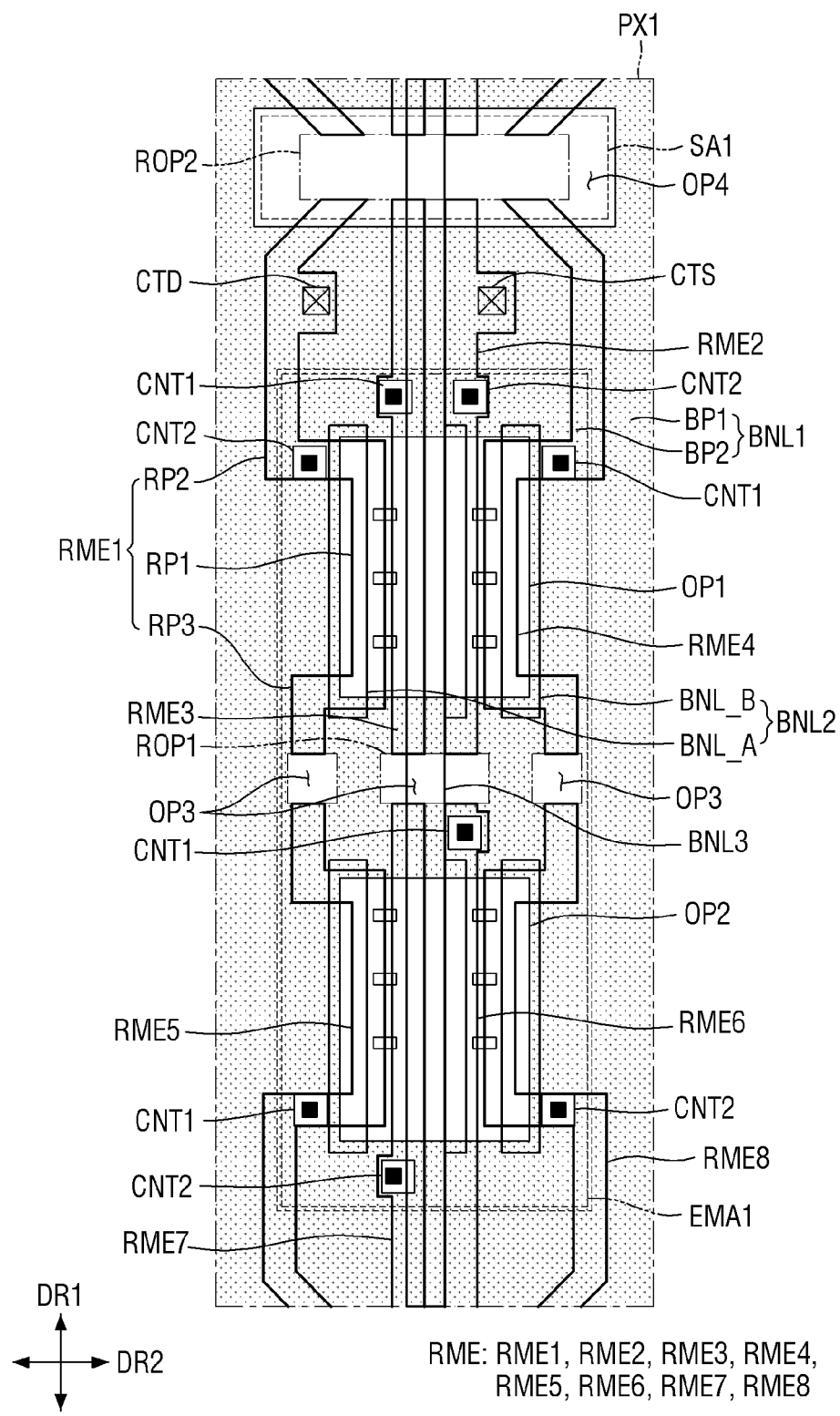
FIG. 4 is a schematic plan view illustrating the schematic arrangement of electrodes and banks disposed in the first subpixel of FIG. 2.
Figure 5:
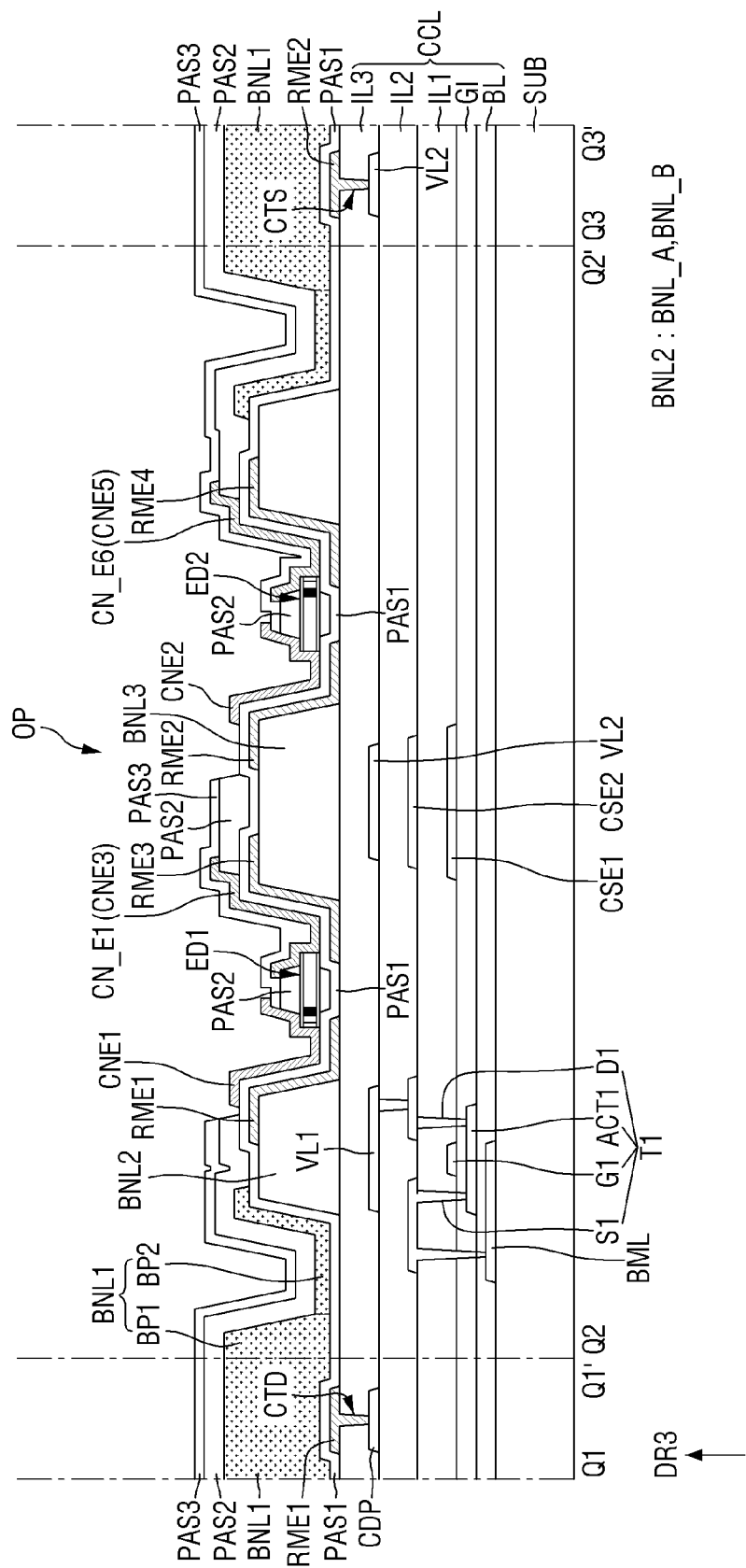
FIG. 5 is a schematic cross-sectional view taken along lines Q1-Q1', Q2-Q2', and Q3-Q3' of FIG. 3.
Figure 6:
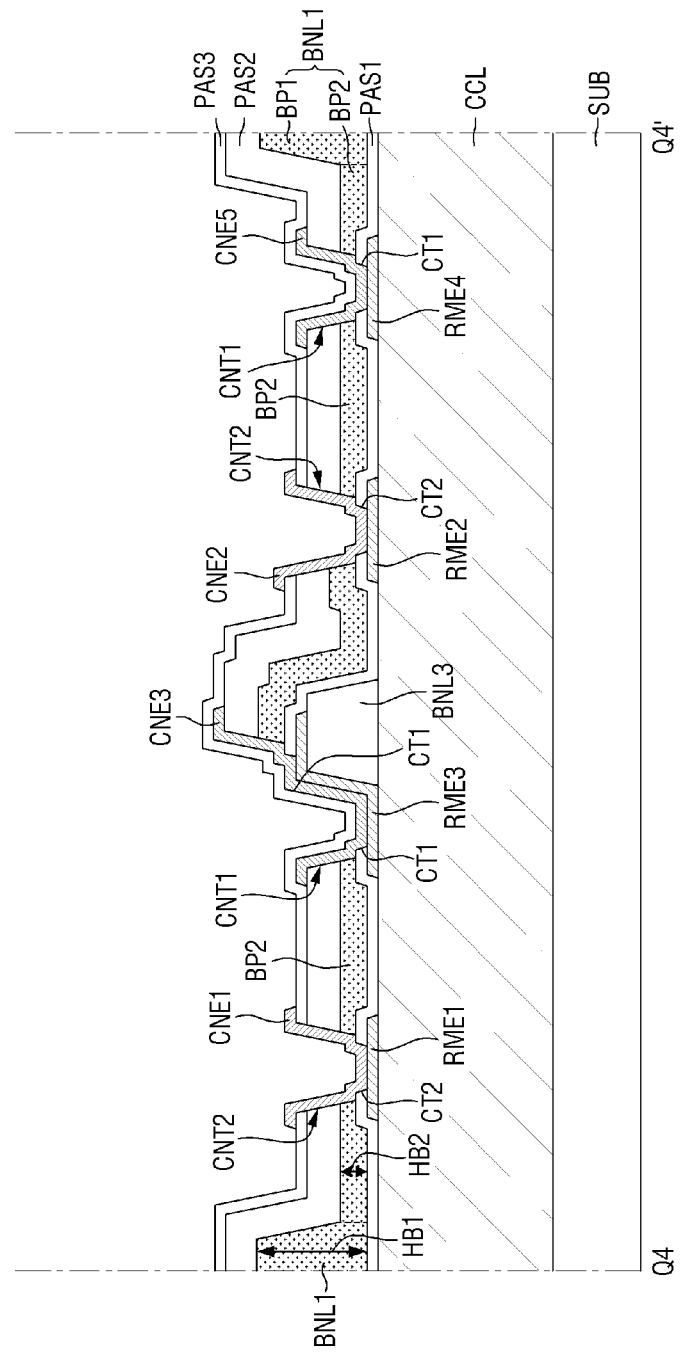
FIG. 6 is a schematic cross-sectional view taken along line Q4-Q4' of FIG. 3.

FIG. 3 is a schematic plan view of the first subpixel PX1 of FIG. 2 according to the embodiments. FIG. 4 is a schematic plan view illustrating the schematic arrangement of electrodes RME and banks BNL1, BNL2, and BNL3 disposed in the first subpixel PX1 of FIG. 2 according to the embodiments. FIG. 5 is a schematic cross-sectional view taken along lines Q1-Q1', Q2-Q2', and Q3-Q3' of FIG. 3. FIG. 6 is a schematic cross-sectional view taken along line Q4-Q4' of FIG. 3. FIG. 3 illustrates the first subpixel PX1 included in a pixel PX, and FIG. 4 illustrates the relative arrangement of the banks BNL1 through BNL3 and the electrodes RME disposed in a subpixel PXn. FIG. 5 illustrates a cross section across both ends of the light emitting elements ED disposed in a subpixel PXn. FIG. 6 illustrates a cross section of contact portions CT1 and CT2 through which the electrodes RME and contact electrodes CNE are connected.

Referring to FIGS. 3 through 6 in conjunction with FIG. 2, in the embodiments, the display device 10 may include a first substrate SUB and a semiconductor layer, multiple conductive layers and multiple insulating layers disposed on the first substrate SUB. The semiconductor layer, the conductive layers, and the insulating layers may constitute a circuit layer CCL and a display element layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate that can be bent, folded, rolled, etc.

A first conductive layer may be disposed on the first substrate SUB. The first conductive layer may include a bottom metal layer BML, and the bottom metal layer BML, may be overlapped by an active layer ACT1 of a first transistor T1. The bottom metal layer BML may include a light blocking material to prevent light from entering the active layer ACT1 of the first transistor T1. However, in other embodiments, the bottom metal layer BML may be omitted.

A buffer layer BL may be entirely disposed on the bottom metal layer BML and the first substrate SUB. The buffer layer BL may be formed on the first substrate SUB to protect transistors of each pixel PX from moisture introduced through the first substrate SUB which is vulnerable to moisture penetration and may perform a surface planarization function.

The semiconductor layer is disposed on the buffer layer BL. The semiconductor layer may include the active layer ACT1 of the first transistor T1. They may be partially overlapped by a gate electrode G1 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although only the first transistor T1 is illustrated in the drawings, the embodiments are not limited thereto. The display device 10 may include a larger number of transistors.

A first gate insulating layer GI is disposed on the semiconductor layer and the buffer layer BL. The first gate insulating layer GI may function as a gate insulating film of each transistor.

The second conductive layer is disposed on the first gate insulating layer GI. The second conductive layer may include the gate electrode G1 of the first transistor T1 and a first capacitive electrode CSE1 of a storage capacitor. The gate electrode G1 may overlap a channel region of the active layer ACT1 in a thickness direction. The first capacitive electrode CSE1 may be overlapped by a second capacitive electrode CSE2, which will be described below, in the thickness direction. In some embodiments, the first capacitive electrode CSE1 may be integrally connected to the gate electrode G1.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first source electrode S1 and a first drain electrode D1 of the first transistor T1 and the second capacitive electrode CSE2.

The first source electrode S1 and the first drain electrode D1 of the first transistor T1 may contact the active layer ACT1 respectively through contact holes penetrating the first interlayer insulating layer IL1 and the first gate insulating layer GI. The first source electrode S1 may contact the bottom metal layer BML, through another contact hole.

The second capacitive electrode CSE2 may overlap the first capacitive electrode CSE1 in the thickness direction. The storage capacitor may be formed between the first capacitive electrode CSE1 and the second capacitive electrode CSE2. In some embodiments, the second capacitive electrode CSE2 may be integrally connected to the first source electrode S1.

A second interlayer insulating layer IL2 may be disposed on the third conductive layer. The second interlayer insulating layer IL2 may function as an insulating film between the third conductive layer and other layers disposed on the third conductive layer and may protect the third conductive layer.

A fourth conductive layer may be disposed on the second interlayer insulating layer IL2. The fourth conductive layer may include a first voltage wiring VL1, a second voltage wiring VL2, and a first conductive pattern CDP. A high potential voltage (or a first power supply voltage) supplied to the first transistor T1 may be applied to the first voltage wiring VL1, and a low potential voltage (or a second power supply voltage) supplied to a second electrode RME2 may be applied to the second voltage wiring VL2.

The first conductive pattern CDP may be electrically connected to the first transistor T1. The first conductive pattern CDP may also contact a first electrode RME1 to be described below, and the first transistor T1 may send the first power supply voltage received from the first voltage wiring VL1 to the first electrode RME1.

Each of the buffer layer BL, the first gate insulating layer GI, the first interlayer insulating layer IL1 and the second interlayer insulating layer IL2 described above may be composed of multiple inorganic layers stacked alternately. For example, each of the buffer layer BL, the first gate insulating layer GI, the first interlayer insulating layer IL1, and the second interlayer insulating layer IL2 may be a double layer in which inorganic layers including at least any one of silicon oxide ($SiO_x$), silicon nitride ($SiN_x$) and silicon oxynitride ($SiO_xN_y$) are stacked or may be a multilayer in which the inorganic layers are alternately stacked. However, the embodiments are not limited thereto, and each of the buffer layer BL, the first gate insulating layer GI, the first interlayer insulating layer IL1, and the second interlayer insulating layer IL2 may also be one inorganic layer including any one of the above insulating materials.

Each of the second conductive layer, the third conductive layer, and the fourth conductive layer may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same. However, the embodiments are not limited thereto.

A third interlayer insulating layer IL3 may be disposed on the fourth conductive layer. The third interlayer insulating layer IL3 may include an organic insulating material, for example, an organic material such as polyimide (PI) and perform a surface planarization function.

The banks BNL1 through BNL3, the electrodes RME, the light emitting elements ED, and the contact electrodes CNE may be disposed as the display element layer on the third interlayer insulating layer IL3. Multiple insulating layers PAS1 through PAS3 may be disposed on the third interlayer insulating layer IL3.

The second banks BNL2 may be directly disposed on the third interlayer insulating layer IL3. The second banks BNL2 may be disposed in the emission area EMA of each subpixel PXn and spaced apart from each other. For example, the second banks BNL2 may include sub banks BNL_A and BNL_B spaced apart from each other in the second direction DR2 in each emission area EMA. A first sub bank BNL_A may be disposed on a left side of a center of the emission area EMA, and a second sub bank BNL_B may be disposed on a right side of the center of the emission area EMA. The sub banks BNL_A and BNL_B may extend in the first direction DR1, but their lengths may be smaller than the length of the second bank part BP2 of the first bank BNL1 in the first direction DR1. The sub banks BNL_A and BNL_B may be disposed in the emission area EMA of each subpixel PXn, and there may be more than one of each of the sub banks BNL_A and BNL_B in the emission area EMA. The sub banks BNL_A and BNL_B may each be spaced apart from each other in the first direction DR1. For example, two first sub banks BNL_A and two second sub banks BNL_B may be disposed in one subpixel PXn, and the sub banks BNL_A and BNL_B may each be spaced apart from each other in the first direction DR1. The second banks BNL2 may form island-shaped patterns having a relatively narrow width and extend in a predetermined direction in the across the display area DPA.

A third bank BNL3, like the second banks BNL2, may be directly disposed on the third interlayer insulating layer IL3. The third bank BNL3 may extend in the first direction DR1 between the first sub banks BNL_A and the second sub banks BNL_B. Some portions of the third bank BNL3 disposed in the emission area EMA may have a large width. In an embodiment, the portions of the third bank BNL3 which face the second banks BNL2 may have a large width. The third bank BNL3 may be longer than the second banks BNL2 in the first direction DR1 and may extend beyond the emission area EMA into the sub area SA. A third bank BNL3 may be disposed over multiple subpixels PXn neighboring in the first direction DR1 to form linear patterns across the entire display area DPA.

At least a part of each of the second and third banks BNL2 and BNL3 may protrude from an upper surface of the third interlayer insulating layer IL3. The protruding part of each of the second and third banks BNL2 and BNL3 may have inclined side surfaces, and light emitted from the light emitting elements ED may be reflected by the electrodes RME disposed on the second and third banks BNL2 and BNL3 to travel toward above the third interlayer insulating layer IL3. However, the embodiments are not limited thereto, and each of the second and third banks BNL2 and BNL3 may also be shaped as a semi-circle or as a semi-ellipse with a curved outer surface. The second and third banks BNL2 and BNL3 may include, but are not limited to, an organic insulating material such as polyimide (PI). The second and third banks BNL2 and BNL3 may be omitted in the embodiments.

The electrodes RME extend in one direction and are disposed in each subpixel PXn. For example, the electrodes RME may extend in the first direction DR1 and may be spaced apart from each other in the second direction DR2 in each subpixel PXn. The electrodes RME of the display device 10 may include electrodes directly connected to the fourth conductive layer thereunder through electrode contact holes CTD and CTS penetrating the third interlayer insulating layer IL3. In some embodiments, the display device 10 may also include electrodes not directly connected to the fourth conductive layer.

In an embodiment, the electrodes RME may be divided into electrode groups RME #1 and RME #2, each including multiple electrodes spaced apart from each other in the second direction DR2. The electrode groups RME #1 and RME #2 may be spaced apart from each other in the first direction DR1.

For example, one subpixel PXn may include a first electrode group RME #1 and a second electrode group RME #2. The first electrode group RME #1 may be disposed on the upper side of the center of the emission area EMA which is a first side of the first direction DR1, and the second electrode group RME #2 may be spaced apart from the first electrode group RME #1 in the first direction DR1 and disposed on a lower side of the emission area EMA. The first electrode group RME #1 and the second electrode group RME #2 of the subpixel PXn may be spaced apart from each other by a first separation part ROP1 located in the emission area EMA.

The electrodes RME of the first electrode group RME #1 may extend beyond the first bank part BP1 of the first bank BNL1 to a part of the sub area SA in the subpixel PXn, and the electrodes RME of the second electrode group RME #2 may also extend beyond the first bank part BP1 to a part of the sub area SA of another subpixel PXn. The first electrode group RME #1 and the second electrode group RME #2 of different subpixels PXn may be disposed in the sub area SA and spaced apart from each other. The first electrode group RME #1 and the second electrode group RME #2 of different subpixels PXn may be spaced apart from each other by a second separation part ROP2 located in the sub area SA of any one subpixel PXn.

The electrodes RME of different electrode groups RME #1 and RME #2 may be disposed side by side and spaced apart in the first direction DR1. For example, the electrodes belonging to the first electrode group RME #1 may be disposed next to the electrodes belonging to the second electrode group RME #2 in the first direction DR1. This arrangement of the electrodes RME may be obtained by forming a single electrode line extending in the first direction DR1 and then separating the electrode line in a subsequent process after the light emitting elements ED are placed. The electrode lines may be utilized to generate an electric field in each subpixel PXn to align the light emitting elements ED during a process of manufacturing the display device 10. The light emitting elements ED may be aligned on the electrodes RME by a dielectrophoretic force due to the electric field generated on the electrode lines. After the light emitting elements ED are aligned, the electrode lines may be separated in the first separation part ROP1 and the second separation part ROP2 to form the electrode groups RME #1 and RME #2 spaced apart from each other in the first direction DR1.

As for the electrodes included in each electrode group RME #1 or RME #2, each electrode group RME #1 or RME #2 may include four electrodes spaced apart from each other in the second direction DR2. For example, the first electrode group RME #1 may include the first electrode RME1, the second electrode RME2, a third electrode RME3 and a fourth electrode RME4, and the second electrode group RME #2 may include a fifth electrode RME5, a sixth electrode RME6, a seventh electrode RME7 and an eighth electrode RME8. The electrodes RME disposed in each subpixel PXn may respectively be disposed on the second banks BNL2 spaced apart from each other or the third bank BNL3.

The first electrode RME1 of the first electrode group RME #1 may be disposed on an upper left side of the center of the emission area EMA. A part of the first electrode RME1 is disposed on a first sub bank BNL_A disposed on an upper side of the emission area EMA. The first electrode RME1 may include a part extending in the first direction DR1 and parts connected to the above part, bent in the second direction DR2 and then bent again in the first direction DR1. For example, the first electrode RME1 may include a first electrode part RP1 disposed on the first sub bank BNL_A and extending in the first direction DR1, a second electrode part RP2 connected to an upper side of the first electrode part RP1 and extending to the second separation part ROP2 of the sub area SA, and a third electrode part RP3 connected to a lower side of the first electrode part RP1 and extending to the first separation part ROP1 of the emission area EMA.

The first electrode part RP1 of the first electrode RME1 may be disposed on the first sub bank BNL_A to face another electrode spaced apart in the second direction DR2. The first electrode part RP1 may be disposed closer to another electrode than the second electrode part RP2 and the third electrode part RP3, and multiple light emitting elements ED may be disposed on the first electrode part RP1. The second electrode part RP2 may extend into the second separation part ROP2 of the sub area SA, intersecting a portion of the first bank BNL1 which extends in the second direction DR2. From its connection with the first electrode part RP1, the second electrode part RP2 may be bent outward in the second direction DR2, and then bent again in the first direction DR1. The second electrode part RP2 may overlap the first bank BNL1 in the thickness direction. The third electrode part RP3 may extend into the first separation part ROP1 of the emission area EMA. From its connection with the first electrode part RP1, the third electrode part RP3 may also be bent outward in the second direction DR2, and then bent again in the first direction DR1. The first electrode RME1 may be spaced apart from another electrode neighboring in the second direction DR2 by a different distance for each of the electrode parts RP1, RP2 or RP3. A distance between the first electrode part RP1 and the neighboring electrode RME may be smaller than the distance between the second electrode part RP2 or the third electrode part RP3 which extends in the first direction DR1. An electric field generated on the electrodes RME spaced apart in the second direction DR2 may induce the light emitting elements ED to be concentrated on the first electrode part RP1 of the first electrode RME1.

The second electrode RME2 may be spaced part from the first electrode RME1 in the second direction DR2 and may be disposed adjacent to the center of the emission area EMA. A part of the second electrode RME2 may be disposed on a side of the third bank BNL3 which faces a second sub bank BNL_B. Unlike the first electrode RME1, the second electrode RME2 may extend in the first direction DR1 and may extend from the first separation part ROP1 of the emission area EMA to the second separation part ROP2 of the sub area SA.

Each of the first electrode RME1 and the second electrode RME2 may be a first type electrode connected to the fourth conductive layer disposed thereunder. The first electrode RME1 and the second electrode RME2 may be directly connected to the fourth conductive layer respectively through the electrode contact holes CTD and CTS formed in parts overlapping the first bank BNL1. For example, the second electrode part RP2 of the first electrode RME1 may contact the first conductive pattern CDP through a first electrode contact hole CTD penetrating the third interlayer insulating layer IL3 disposed under the second electrode part RP2. The second electrode RME2 may contact the second voltage wiring VL2 through a second electrode contact hole CTS penetrating the third interlayer insulating layer IL3 disposed under the second electrode RME2. The first electrode RME1 may be electrically connected to the first transistor T1 through the first conductive pattern CDP to receive the first power supply voltage, and the second electrode RME2 may be electrically connected to the second voltage wiring VL2 to receive the second power supply voltage. Since the first electrode RME1 and the second electrode RME2 are disposed separately for each subpixel PXn, the light emitting elements ED of different subpixels PXn may emit light individually. Although the first electrode contact hole CTD and the second electrode contact hole CTS are formed at positions overlapping a part of the first bank BNL1 which extends in the second direction DR2 in the drawings, the embodiments are not limited thereto. For example, the electrode contact holes CTD and CTS may also be located in the emission area EMA in which the second bank part BP2 of the first bank BNL1 is disposed.

The third electrode RME3 may be disposed between the first electrode RME1 and the second electrode RME2. The third electrode RME3 may be spaced apart from the first electrode RME1 to face the first electrode RME1 and may be spaced apart from the second electrode RME2 on the third bank BNL3. A part of the third electrode RME3 may be disposed on the other side of the third bank BNL3 which faces the first sub bank BNL_A located on the upper side of the emission area EMA. The third electrode RME3 may have a similar shape to the second electrode RME2 and may extend from the first separation part ROP1 of the emission area EMA to the second separation part ROP2 of the sub area SA.

The fourth electrode RME4 may be spaced apart from the second electrode RME2 in the second direction DR2. The fourth electrode RME4 may face the second electrode RME2 and may be disposed on an upper right side of the center of the emission area EMA. A part of the fourth electrode RME4 may be disposed on a side of the second sub bank BNL_B, which faces the third bank BNL3. The fourth electrode RME4 may have a similar shape to the first electrode RME1. The fourth electrode RME4 may also include a first electrode part RP1 disposed on the second sub bank BNL_B and a second electrode part RP2 and a third electrode part RP3 connected to the first electrode part RP1. The fourth electrode RME4 may have the same shape as the first electrode RME1 except for a part of the first electrode RME1 which is disposed on the first electrode contact hole CTD and may be structured symmetrically to the first electrode RME1 with respect to a center line of the subpixel PXn in the first direction DR1.

The fifth electrode RME5 of the second electrode group RME #2 may be disposed on a lower left side of the center of the emission area EMA. The fifth electrode RME5 may be spaced apart from the first electrode RME1 in the first direction DR1, and a part of the fifth electrode RME5 is disposed on a side of a first sub bank BNL_A disposed on the lower side of the emission area EMA. The fifth electrode RME5 may have a similar shape to the first electrode RME1. The fifth electrode RME5 may also include a first electrode part RP1 disposed on the first sub bank BNL_A and a second electrode part RP2 and a third electrode part RP3 connected to the first electrode part RP1. The fifth electrode RME5 may have the same shape as the first electrode RME1 except for the part of the first electrode RME1 which is disposed on the first electrode contact hole CTD and may be structured symmetrically to the first electrode RME1 with respect to a center line of the subpixel PXn in the second direction DR2. The second electrode part RP2 of the fifth electrode RME5 may extend to the second separation part ROP2 located in the sub area SA of another subpixel PXn neighboring in the first direction DR1.

The sixth electrode RME6 may be spaced apart from the fifth electrode RME5 in the second direction DR2 and may be disposed adjacent to the center of the emission area EMA and spaced apart from the second electrode RME2 in the first direction DR1. A part of the sixth electrode RME6 may be disposed on a side of the third bank BNL3 which faces a second sub bank BNL_B located on the lower side of the emission area EMA. The sixth electrode RME6 may have a similar shape to the second electrode RME2 and may extend from the first separation part ROP1 of the emission area EMA to the second separation part ROP2 located in the sub area SA of another subpixel PXn.

The seventh electrode RME7 may be disposed between the fifth electrode RME5 and the sixth electrode RME6. The seventh electrode RME7 may be spaced apart from the fifth electrode RME5 to face the fifth electrode RME5 and may be spaced apart from the sixth electrode RME6 on the third bank BNL3. A part of the seventh electrode RME7 may be disposed on the other side of the third bank BNL3 which faces the first sub bank BNL_A located on the lower side of the emission area EMA. The seventh electrode RME7 may have a similar shape to the sixth electrode RME6 and may extend from the first separation part ROP1 of the emission area EMA to the second separation part ROP2 located in the sub area SA of another subpixel PXn.

The eighth electrode RME8 may be spaced apart from the sixth electrode RME6 in the second direction DR2. The eighth electrode RME8 may face the sixth electrode RME6 and may be disposed on a lower right side of the center of the emission area EMA and spaced part from the fourth electrode RME4 in the first direction DR1. A part of the eighth electrode RME8 may be disposed on a side, which faces the third bank BNL3, of the second sub bank BNL_B disposed on the lower side. The eighth electrode RME8 may have a similar shape to the fifth electrode RME5. The eighth electrode RME8 may also include a first electrode part RP1 disposed on the second sub bank BNL_B and a second electrode part RP2 and a third electrode part RP3 connected to the first electrode part RP1. The eighth electrode RME8 may have the same shape as the fifth electrode RME5 and may be structured symmetrically to the fifth electrode RME5 with respect to the center line of the subpixel PXn in the first direction DR1.

Each of the third through eighth electrodes RME3 through RME8 may be a second type electrode not directly connected to the fourth conductive layer disposed thereunder, unlike the first type electrodes. The second type electrodes may receive electrical signals, which are directly transmitted to the first type electrode, through the light emitting elements ED or through contact electrodes CNE. Although the third through eighth electrodes RME3 through RME8 are not directly connected to the fourth conductive layer disposed under them, electrical signals transmitted from the fourth conductive layer may be transmitted to the third through eighth electrodes RME3 through RME8 such that the third through eighth electrodes RME3 through RME8 are not floating.

In an embodiment, a width of each electrode RME measured in the second direction DR2 may be smaller than a maximum width of each of the second and third banks BNL2 and BNL3 measured in the second direction DR2. Each electrode RME may be disposed to cover at least one side surface of a second bank BNL2 or the third bank BNL3 to reflect light emitted from the light emitting elements ED. The gaps between the electrodes RME in the second direction DR2 may be smaller than the gaps between the second and third banks BNL2 and BNL3. At least a part of each electrode RME may be directly disposed on the third interlayer insulating layer IL3 so that the electrodes RME lie in the same plane.

The electrodes RME may be electrically connected to the light emitting elements ED. The electrodes RME may be connected to the ends of the light emitting elements ED through the contact electrodes CNE to be described below and may transmit electrical signals received from the fourth conductive layer to the light emitting elements ED. Electrical signals for causing the light emitting elements ED to emit light may be directly transmitted to the first electrode RME1 and the second electrode RME2 and may be transmitted to other electrodes through the contact electrodes CNE and the light emitting elements ED to be described below.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels towards a side surface of a second bank BNL2 or the third bank BNL3 after being emitted from the light emitting elements ED, towards the upper side of each subpixel PXn.

However, the embodiments are not limited thereto, and each electrode RME may further include a transparent conductive material. For example, each electrode RME may include materials such as ITO, IZO or ITZO. In some embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO.

A first insulating layer PAS1 may be disposed on the electrodes RME, the second banks BNL2, and the third bank BNL3. The first insulating layer PAS1 may be disposed to entirely cover these components and may protect the electrodes RME while insulating them from each other. The first insulating layer PAS1 may prevent the light emitting elements ED disposed on the first insulating layer PAS1 from directly contacting other components and thus being damaged.

In an embodiment, the first insulating layer PAS1 may be stepped such that a part of an upper surface of the first insulating layer PAS1 is recessed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1. However, the embodiments are not limited thereto.

The first insulating layer PAS1 may include multiple contact portions CT1 and CT2 partially exposing upper surfaces of the electrodes RME, respectively. The contact portions CT1 and CT2 may penetrate the first insulating layer PAS1, and the contact electrodes CNE to be described below may contact the electrodes RME exposed through the contact portions CT1 and CT2.

The first bank BNL1 may be disposed on the first insulating layer PAS1. The first bank BNL1 may include parts extending in the first direction DR1 and the second direction DR2 to form a lattice pattern in a plan view. The first bank BNL1 may be disposed at the boundary of each subpixel PXn to separate neighboring subpixels PXn. The first bank BNL1 may surround the emission area EMA and the sub area SA disposed in each subpixel PXn to separate them from each other.

According to an embodiment, the first bank BNL1 may include the first bank part BP1 surrounding the emission area EMA and the sub area SA and the second bank part BP2 connected to the first bank part BP1 and disposed in the emission area EMA. The first bank part BP1 is a part disposed at the boundary of each subpixel PXn and between the emission area EMA and the sub area SA and may have a predetermined height HB1 to separate each area from another. For example, the first bank part BP1 may extend in the first direction DR1 and the second direction DR2 and surround the emission area EMA and the sub area SA to expose them. A fourth opening OP4 in which the first bank part BP1 is not disposed may be the sub area SA of each subpixel PXn, and an area in which the second bank part BP2 connected to the first bank part BP1 is disposed may be the emission area EMA.

In an embodiment, of parts of the first bank part BP1 which extend in the first direction DR1, a part disposed between the emission areas EMA may be wider than a part disposed between the sub areas SA, and a gap between the sub areas SA may be smaller than a gap between the emission areas EMA. However, the embodiments are not limited thereto, and the width of the first bank part BP1 may also be changed so that the gap between the sub areas SA is greater than the gap between the emission areas EMA.

The first bank BNL1 may be formed to have a height similar to those of the second banks BNL2 and the third bank BNL3. The first bank BNL1 may include the same material as the second banks BNL2, and the first bank part BP1 may have substantially the same height as the second banks BNL2. However, the embodiments are not limited thereto. The first bank part BP1 of the first bank BNL1 may also be formed to be higher than the second banks BNL2 and the third bank BNL3. The first bank part BP1 may prevent ink from overflowing to adjacent subpixels PXn in an inkjet printing process during the manufacturing process of the display device 10. Therefore, the first bank part BP1 may separate inks in which different light emitting elements ED are dispersed for different subpixels PXn, so that the inks are not mixed with each other.

The second bank part BP2 may be disposed in the emission area EMA among the areas surrounded by the first bank part BP1. The second bank part BP2 may be formed integrally with the first bank part BP1 and may have a height HB2 smaller than that of the first bank part BP1. For example, the second bank part BP2 may be lower than the second banks BNL2. Unlike the first bank part BP1, the second bank part BP2 is not a member disposed to separate different areas. Therefore, the second bank part BP2 may just be high enough to allow the contact holes CNT1 and CNT2 to be described below to be easily formed. In an embodiment, the height HB2 of the second bank part BP2 may be, but is not limited to, in the range of about 20% to about 50% of the height HB1 of the first bank part BP1.

According to an embodiment, the second bank part BP2 of the first bank BNL1 may include multiple openings OP1 through OP3 and multiple contact holes CNT1 and CNT2. The second bank part BP2 may cover the entire emission area EMA but may have areas through members disposed on the first bank BNL1 are connected to members disposed under the first bank BNL1.

For example, the second bank part BP2 may include a first opening OP1 and a second opening OP2 formed to overlap the electrodes RME. The first opening OP1 may be formed to partially overlap the first electrode group RME #1, the second opening OP2 may be formed to partially overlap the second electrode group RME #2, and the first opening OP1 and the second opening OP2 may be spaced apart from each other in the first direction DR1. The first opening OP1 may be formed to partially overlap an area between the electrodes of the first electrode group RME #1 and partially overlap the electrodes. The first opening OP1 may be formed to overlap the first electrode part RP1 of the first electrode RME1, the first electrode part RP1 of the fourth electrode RME4, and parts of the second electrode RME2 and the third electrode RME3 which face the first electrode parts RP1 of the first and fourth electrodes RME1 and RME4. Similarly, the second opening OP2 may be formed to partially overlap an area between the electrodes of the second electrode group RME #2 and partially overlap the electrodes. The second opening OP2 may be formed to overlap the first electrode part RP1 of the fifth electrode RME5, the first electrode part RP1 of the eighth electrode RME8, and parts of the sixth electrode RME6 and the seventh electrode RME7 which face the first electrode parts RP1 of the fifth and eighth electrodes RME5 and RME8. The first opening OP1 and the second opening OP2 may expose parts of the first insulating layer PAS1 disposed on the electrodes RME and may form spaces in which the light emitting elements ED are disposed.

The second bank part BP2 may further include third openings OP3 disposed between the first opening OP1 and the second opening OP2. The third openings OP3 may be disposed between the first electrode group RME #1 and the second electrode group RME #2 spaced apart in the first direction DR1. Electrodes spaced apart in the first direction DR1 may be formed by forming electrode lines (refer to RM1 through RM4 in FIG. 8) in the manufacturing process of the display device 10 and then separating the electrode lines into parts in a subsequent process. The second bank part BP2 may be formed to cover the electrode lines, but the third openings OP3 may be formed to expose the bottom of the second bank part BP2 so that the electrode lines may be separated. The third openings OP3 may be formed before the process of separating the electrode lines, and the electrode lines exposed by the formation of the third openings OP3 may be removed. Accordingly, the electrodes RME spaced apart in the first direction DR1 may be separated from each other in the first separation part ROP1 in which the third openings OP3 are located. In the third openings OP3, the first insulating layer PAS1 and the electrodes RME under the third openings OP3 may not be disposed, and the upper surface of the third interlayer insulating layer IL3 may be exposed.

Similarly, the first bank part BP1 of the first bank BNL1 may also include the fourth opening OP4 located in the sub area SA to separate the electrode lines. However, the fourth opening OP4 may be formed in a different process from the third openings OP3 and may be formed together with the first opening OP1 and the second opening OP2. The electrode lines located in the fourth opening OP4 may have their upper surfaces exposed in a process for forming a second insulating layer PAS2 to be described below and may be separated in a subsequent process. Accordingly, the electrodes RME of different pixels PXn may be separated from each other in the second separation part ROP2 in which the fourth opening OP4 is located.

The second bank part BP2 may include contact holes CNT1 and CNT2. The first insulating layer PAS1 may include contact portions CT1 and CT2 partially exposing upper surfaces of the electrodes RME, and the contact holes CNT1 and CNT2 may be formed to overlap the contact portions CT1 and CT2. Members disposed on the second bank part BP2 may be connected to the electrodes RME disposed under the second bank part BP2 through the contact holes CNT1 and CNT2. For example, the second bank part BP2 may include first contact holes CNT1 formed to overlap first contact portions CT1 of the first insulating layer PAS1 and second contact holes CNT2 formed to overlap second contact portions CT2. The first contact holes CNT1 may partially overlap the third electrode RME3, the fourth electrode RME4, the fifth electrode RME5, and the sixth electrode RME6. The second contact holes CNT2 may partially overlap the first electrode RME1, the second electrode RME2, the seventh electrode RME7, and the eighth electrode RME8. The second insulating layer PAS2 and a third insulating layer PAS3 to be described below may be disposed on the second bank part BP2. According to an embodiment, the contact holes CNT1 and CNT2 of the second bank part BP2 may be formed in a process of forming the second insulating layer PAS2 or the third insulating layer PAS3, and each of the contact holes CNT1 and CNT2 may penetrate not only the second bank part BP2 but also other insulating layers disposed on the second bank part BP2. The first contact holes CNT1 may be formed together with the second insulating layer PAS2 to penetrate the second insulating layer PAS2 and the second bank part BP2, and the second contact holes CNT2 may be formed together with the third insulating layer PAS3 to penetrate the second insulating layer PAS2, the third insulating layer PAS3 and the second bank part BP2. The contact holes CNT1 and CNT2 may be wider than the contact portions CT1 and CT2 formed in the first insulating layer PAS1, and the upper surfaces of the electrodes RME may be partially exposed by the contact portions CT1 and CT2 and the contact holes CNT1 and CNT2.

In the manufacturing process of the display device 10, the light emitting elements ED may be disposed on the electrode lines by an electric field generated on the electrode lines. The light emitting elements ED may be disposed on electrode lines spaced apart in the second direction DR2 among the electrode lines. The first insulating layer PAS1 is disposed on the electrode lines used to form the electrodes RME. The first insulating layer PAS1 includes the contact portions CT1 and CT2 partially exposing the upper surfaces of the electrodes RME or the electrode lines. The electrode lines may include parts whose upper surfaces are exposed by the contact portions CT1 and CT2 and parts on which the first insulating layer PAS1 is disposed. If an electric field is generated in a state where the upper surfaces of the electrode lines are exposed by the contact portions CT1 and CT2, a relatively strong electric field may be generated in areas adjacent to the contact portions CT1 and CT2.

In the display device 10 according to the embodiment, the first bank BNL1 disposed on the first insulating layer PAS1 includes the second bank part BP2 to prevent the light emitting elements ED from being concentrated in the areas adjacent to the contact portions CT1 and CT2. The second bank part BP2 may be formed before a process of placing the light emitting elements ED and may cover the electrode lines exposed by the contact portions CT1 and CT2. The second bank part BP2 of the first bank BNL1 may include the first opening OP1 and the second opening OP2 to induce the light emitting elements ED to be disposed on the electrode lines in the openings OP1 and OP2. In the display device 10 according to the embodiment, the first bank BNL1 includes the second bank part BP2 to minimize the loss of the light emitting elements ED due to the placement of the light emitting elements ED in an unwanted area. The contact portions CT1 and CT2 may be exposed in a process of forming the contact holes CNT1 and CNT2 in the second bank part BP2 after the alignment of the light emitting elements ED. The contact holes CNT1 and CNT2 formed during the manufacturing process of the display device 10 will be described below with reference to other drawings.

The light emitting elements ED may be disposed on the first insulating layer PAS1. The light emitting elements ED may be spaced apart from each other along the first direction DR1 in which each electrode RME extends and may be aligned substantially parallel to each other. The direction in which each electrode RME extends and the direction in which the light emitting elements ED extend may be substantially perpendicular to each other. However, the embodiments are not limited thereto, and the light emitting elements ED may also extend obliquely to the direction in which each electrode RME extends.

Each light emitting element ED may include semiconductor layers doped with different conductivity types. Each light emitting element ED including the semiconductor layers may be oriented such that an end faces a specific direction according to the direction of an electric field generated on the electrodes RME. Each light emitting element ED may include a light emitting layer 36 (refer to FIG. 7) to emit light of a specific wavelength band. The light emitting elements ED disposed in each subpixel PXn may emit light of different wavelength bands according to the material that forms the light emitting layer 36. However, the embodiments are not limited thereto, and the light emitting elements ED disposed in each subpixel PXn may also emit light of the same color.

Each light emitting element ED may include multiple layers disposed in a direction parallel to an upper surface of the first substrate SUB. The direction in which the light emitting elements ED of the display device 10 extend may be parallel to the first substrate SUB, and multiple semiconductor layers included in each light emitting element ED may be sequentially arranged along the direction parallel to the upper surface of the first substrate SUB. However, the embodiments are not limited thereto. In some cases, when the light emitting elements ED have a different structure, the layers may be arranged in a direction perpendicular to the first substrate SUB.

The light emitting elements ED may be disposed on the electrodes RME spaced apart in the second direction DR2 between the second and third banks BNL2 and BNL3. The length of each light emitting element ED (refer to h in FIG. 7) may be greater than the gap between the electrodes RME spaced apart from each other in the second direction DR2, and both ends of each light emitting element ED may be disposed on different electrodes. In an embodiment, the light emitting elements ED may be disposed in the first opening OP1 and the second opening OP2 of the second bank part BP2 disposed on the first insulating layer PAS1. For example, the light emitting elements ED may include first light emitting elements ED1 and second light emitting elements ED2 having both ends disposed on the electrodes of the first electrode group RME #1 in the first opening OP1. The first light emitting elements ED1 may be disposed on the first electrode RME1 and the third electrode RME3 in the first electrode group RME #1, and the second light emitting elements ED2 may be disposed on the second electrode RME2 and the fourth electrode RME4 in the first electrode group RME #1. The light emitting elements ED may include third light emitting elements ED3 and fourth light emitting elements ED4 having both ends disposed on the electrodes of the second electrode group RME #2 in the second opening OP2. The third light emitting elements ED3 may be disposed on the fifth electrode RME5 and the seventh electrode RME7 in the second electrode group RME #2, and the fourth light emitting elements ED4 may be disposed on the sixth electrode RME6 and the eighth electrode RME8 in the second electrode group RME #2. An end of each light emitting element ED may be disposed on the first electrode parts RP1 of the first electrode RME1, the fourth electrode RME4, the fifth electrode RME5, or the eighth electrode RME8.

Each light emitting element ED may include multiple semiconductor layers, and a first end and a second end opposite the first end may be defined based on one of the semiconductor layers. Each light emitting element ED may be disposed such that each of the first end and the second end lies on a specific electrode RME. For example, the first light emitting elements ED1 may be disposed such that the first ends lie on the first electrode RME1 and the second ends lie on the third electrode RME3. The second light emitting elements ED2 may be disposed such that the first ends lie on the fourth electrode RME4 and the second ends lie on the second electrode RME2. Similarly, the third light emitting elements ED3 may be disposed such that the first ends lie on the fifth electrode RME5 and the second ends lie on the seventh electrode RME7. The fourth light emitting elements ED4 may be disposed such that the first ends lie on the eighth electrode RME8 and the second ends lie on the sixth electrode RME6. However, the embodiments are not limited thereto, and the light emitting elements ED may also be disposed such that only one end of each light emitting element ED lies on an electrode RME according to the direction in which the light emitting elements ED are oriented between the electrodes RME. The first through fourth light emitting elements ED1 through ED4 may respectively be disposed in areas defined by the electrodes RME and the openings OP1 and OP2 of the second bank part BP2 and may be electrically connected to each other through the contact electrodes CNE to be described below.

Each of the ends of the light emitting elements ED may each contact a contact electrodes CNE. An insulating film 38 (refer to FIG. 7) may not be formed on the first and second end surfaces of the light emitting elements ED, thereby partially exposing the semiconductor layers. The exposed semiconductor layers may contact the contact electrodes CNE. However, the embodiments are not limited thereto. In some cases, at least a part of the insulating film 38 of each light emitting element ED may be removed to partially expose side surfaces of the ends of the semiconductor layers. The exposed side surfaces of the semiconductor layers may directly contact the contact electrodes CNE. Each light emitting element ED may be electrically connected to the electrodes RME and the other light emitting elements ED through the contact electrodes CNE.

The second insulating layer PAS2 may be partially disposed on the first insulating layer PAS1 and the light emitting elements ED. For example, the second insulating layer PAS2 may partially surround an outer surface of each light emitting element ED not to cover the first end and the second end of the light emitting element ED. Of the second insulating layer PAS2, parts disposed on the light emitting elements ED may extend in the first direction DR1 on the first insulating layer PAS1 in a plan view to form linear or island-shaped patterns in each subpixel PXn. The second insulating layer PAS2 may protect the light emitting elements ED while fixing the light emitting elements ED during the manufacturing process of the display device 10. The second insulating layer PAS2 may fill the space between each light emitting element ED and the first insulating layer PAS1 disposed under the light emitting element ED.

The second insulating layer PAS2 may be disposed on the first bank BNL1, the second banks BNL2, and the third bank BNL3. The second insulating layer PAS2 may be disposed on the first insulating layer PAS1 and the first bank BNL1 but may partially expose parts where the electrodes RME are disposed as well as exposing both ends of each light emitting element ED. This shape of the second insulating layer PAS2 may be obtained by entirely covering the first insulating layer PAS1 with the second insulating layer PAS2 during the manufacturing process of the display device 10, and then removing the second insulating layer PAS2 to expose the ends of each light emitting element ED.

A part of the second insulating layer PAS2 may be disposed on the second bank part BP2 of the first bank BNL1, and the contact holes CNT1 and CNT2 formed in the second bank part BP2 may also penetrate the second insulating layer PAS2. According to an embodiment, in the first contact holes CNT1, the sidewalls of the second insulating layer PAS2 and the sidewalls of the second bank part BP2 may be aligned with each other. As described above, some of the contact holes CNT1 and CNT2 penetrating the second bank part BP2 of the first bank BNL1 are formed in the same process as the second insulating layer PAS2. The first contact holes CNT1 of the second bank part BP2 may be formed at the same time as the second insulating layer PAS2 to penetrate the second bank part BP2 and the second insulating layer PAS2 on the first contact portions CT1.

In an embodiment, a thickness of the second insulating layer PAS2 may be greater than the height HB2 of the second bank part BP2 of the first bank BNL1. The second insulating layer PAS2 may have a thickness of a certain level or more and may fix the light emitting elements ED. However, the embodiments are not limited thereto.

Although not illustrated in the drawings, a part of the second insulating layer PAS2 may be disposed in the sub area SA. The electrodes RME disposed in the subpixels PXn may be formed to extend in the first direction DR1 and to be connected to each other but may be separated in the sub area SA after the alignment of the light emitting elements ED and the formation of the second insulating layer PAS2. In the process of separating the electrodes RME, the first insulating layer PAS1 and the second insulating layer PAS2 as well as the electrodes RME may be partially removed, and the third insulating layer PAS3 to be described below may be directly disposed on the third interlayer insulating layer IL3 in the portions where the electrodes RME, the first insulating layer PAS1, and the second insulating layer PAS2 are removed. However, the embodiments are not limited thereto, and the third insulating layer PAS3 may also be removed from the part where the electrodes RME are separated in the sub area SA to expose a part of the third interlayer insulating layer IL3. Alternatively, another insulating layer disposed on the third insulating layer PAS3 to cover each member may be directly disposed on the third interlayer insulating layer IL3.

The contact electrodes CNE and the third insulating layer PAS3 may be disposed on the second insulating layer PAS2. Each of the contact electrodes CNE may contact an end of the light emitting elements ED and at least one electrode RME. For example, each of the contact electrodes CNE may contact an exposed end the light emitting elements ED on which the second insulating layer PAS2 is not disposed and may contact at least any one of the electrodes RME through the contact portion CT1 or CT2 formed in the first insulating layer PAS1 to expose a part of the electrode RME.

According to an embodiment, the contact electrodes CNE of the display device 10 may be divided into different types based upon the type of electrode they electrically connect. For example, the first contact electrode CNE1 and a second contact electrode CNE2 may be first type contact electrodes since they are disposed on the first electrode RME1 and the second electrode RME2 which are first type electrodes.

The first contact electrode CNE1 and the second contact electrode CNE2 may be disposed on the first electrode RME1 and the second electrode RME2, respectively. Each of the first contact electrode CNE1 and the second contact electrode CNE2 may extend in the first direction DR1 and may form a linear pattern in the emission area EMA of each subpixel PXn. The first contact electrode CNE1 may contact the first electrode RME1 through a second contact portion CT2 and a second contact hole CNT2 exposing an upper surface of the first electrode RME1, and the second contact electrode CNE2 may contact the second electrode RME2 through a second contact portion CT2 and a second contact hole CNT2 exposing an upper surface of the second electrode RME2. The first contact electrode CNE1 may contact the first ends of the first light emitting elements ED1, and the second contact electrode CNE2 may contact the second ends of the second light emitting elements ED2.

Each of the first contact electrode CNE1 and the second contact electrode CNE2 which are first type contact electrodes may transmit an electrical signal transmitted to a first type electrode to an end of the light emitting elements ED. The electrical signal may be directly transmitted to the first ends of the first light emitting elements ED1 and the second ends of the second light emitting elements ED2 and may be transmitted to other contact electrodes CNE and light emitting elements ED through the second ends of the first light emitting elements ED1 and the first ends of the second light emitting elements ED2.

The contact electrodes CNE may include a third contact electrode CNE3, a fourth contact electrode CNE4, and a fifth contact electrode CNE5 as second type contact electrodes disposed over one or more of the third through eighth electrodes RME3 through RME8 which are second type electrodes.

The third contact electrode CNE3 may be disposed on the third electrode RME3 and the fifth electrode RME5. The third contact electrode CNE3 may include a first extending part CN_E1 and a second extending part CN_E2 extending in the first direction DR1 and a first connecting part CN_B1 connecting the first extending part CN_E1 and the second extending part CN_E2. The third contact electrode CNE3 may generally extend in the first direction DR1 but may be bent so as to be disposed on the third electrode RME3 and the fifth electrode RME5. The first extending part CN_E1 may be disposed on the third electrode RME3, and the second extending part CN_E2 may be disposed on the fifth electrode RME5. Each of the first extending part CN_E1 and the second extending part CN_E2 may contact the third contact electrode RME3 or the fifth electrode RME5 exposed through a first contact portion CT1 and a first contact hole CNT1. The first extending part CN_E1 may contact the second ends of the first light emitting elements ED1, and the second extending part CN_E2 may contact the first ends of the third light emitting elements ED3. The first connecting part CN_B1 may be disposed between the third openings OP3.

The fourth contact electrode CNE4 may be disposed on the seventh electrode RME7 and the eighth electrode RME8. The fourth contact electrode CNE4 may include a third extending part CN_E3 and a fourth extending part CN_E4 extending in the first direction DR1 and a second connecting part CN_B2 connecting the third extending part CN_E3 and the fourth extending part CN_E4 in the emission area EMA. The fourth contact electrode CNE4 may be spaced apart from a fifth extending part CN_E5 of the fifth contact electrode CNE5 to be described below and may surround the fifth extending part CN_E5. The third extending part CN_E3 is disposed on the seventh electrode RME7, and the fourth extending part CN_E4 is disposed on the eighth electrode RME8. The third extending part CN_E3 and the fourth extending part CN_E4 may contact the seventh electrode RME7 and the eighth electrode RME8, respectively through a second contact portion CT2 or a second contact hole CNT2. The third extending part CN_E3 may contact the second ends of the third light emitting elements ED3, and the fourth extending part CN_E4 may contact the first ends of the fourth light emitting elements ED4. The first connecting part CN_B1 may be disposed between the third openings OP3.

The fifth contact electrode CNE5 may have a similar shape to the third contact electrode CNE3 and may be disposed on the sixth electrode RME6 and the fourth electrode RME4. The fifth contact electrode CNE5 may include the fifth extending part CN_E5 and a sixth extending part CN_E6 extending in the first direction DR1 and a third connecting part CN_B3 connecting the fifth extending part CN_E5 and the sixth extending part CN_E6 in the emission area EMA. The fifth extending part CN_E5 is disposed on the sixth electrode RME6, and the sixth extending part CN_E6 is disposed on the fourth electrode RME4. Each of the fifth extending part CN_E5 and the sixth extending part CN_E6 may contact the sixth electrode RME6 or the fourth electrode RME4 exposed through a first contact portion CT1 and a first contact hole CNT1. The fifth extending part CN_E5 may contact the second ends of the fourth light emitting elements ED4, and the sixth extending part CN_E6 may contact the first ends of the second light emitting elements ED2. The third connecting part CN_B3 may be disposed between the third openings OP3.

The first light emitting elements ED1 and the third light emitting elements ED3 may be electrically connected to each other through the third contact electrode CNE3. An electrical signal received through the first contact electrode CNE1 may be transmitted to the third light emitting elements ED3 through the first light emitting elements ED1 and the third contact electrode CNE3. Similarly, the electrical signal may be transmitted to the fourth light emitting elements ED4 and the second light emitting elements ED2 through the fourth contact electrode CNE4 and the fifth contact electrode CNE5. Thus, the light emitting elements ED disposed in a subpixel PXn may be connected in series to each other through second type contact electrodes.

The contact portions CT1 and CT2 and the contact holes CNT1 and CNT2 may be disposed not to overlap the light emitting elements ED in the first direction DR1. For example, each of the contact portions CT1 and CT2 and the contact holes CNT1 and CNT2 may be spaced apart in the first direction DR1 from an area where the light emitting elements ED are disposed and may be disposed in the second bank part BP2 of the first bank BNL1. Light is emitted from both ends of each light emitting element ED, and the contact portions CT1 and CT2 and the contact holes CNT1 and CNT2 may be located outside the travelling path of the light. However, the embodiments are not limited thereto, and the positions of the contact portions CT1 and CT2 and the contact holes CNT1 and CNT2 may vary according to the structures of the electrodes RME and the positions of the light emitting elements ED.

Although one each of the contact electrodes CNE is disposed in one subpixel PXn in the drawings, the embodiments are not limited thereto. The number and shape of each of the contact electrodes CNE may vary according to the number of electrodes RME disposed in each subpixel PXn.

The contact electrodes CNE may include a conductive material such as ITO, IZO, ITZO, or aluminum (Al). For example, the contact electrodes CNE may include a transparent conductive material, and light emitted from the light emitting elements ED may pass through the contact electrodes CNE and proceed toward the electrodes RME, but the embodiments are not limited thereto.

Some of the contact electrodes CNE may be disposed on the same layer, but the others may be disposed on a different layer. For example, the third contact electrode CNE3 and the fifth contact electrode CNE5 may be disposed on the second insulating layer PAS2, and the first contact electrode CNE1, the second contact electrode CNE2 and the fourth contact electrode CNE4 may be disposed on the third insulating layer PAS3. The third contact electrode CNE3 and the fifth contact electrode CNE5 may be disposed in areas exposed by patterning the second insulating layer PAS2, and the first contact electrode CNE1, the second contact electrode CNE2 and the fourth contact electrode CNE4 may be disposed in areas exposed by patterning the second insulating layer PAS2 and the third insulating layer PAS3. However, the first contact electrode CNE1, the second contact electrode CNE2 and the fourth contact electrode CNE4 may be directly disposed on the first insulating layer PAS1 in areas where the second insulating layer PAS2 and the third insulating layer PAS3 are not disposed and both ends of the light emitting elements ED are exposed.

The third insulating layer PAS3 is disposed on the third contact electrode CNE3 and the fifth contact electrode CNE5. Further, the third insulating layer PAS3 may be disposed on the second insulating layer PAS2 excluding the areas where the first contact electrode CNE1, the second contact electrode CNE2, and the fourth contact electrode CNE4 are disposed. The third insulating layer PAS3 may insulate the first contact electrode CNE1, the second contact electrode CNE2 and the fourth contact electrode CNE4 from the third contact electrode CNE3 and the fifth contact electrode CNE5 and may prevent them from directly contacting each other.

The third insulating layer PAS3 may be disposed between the first type contact electrodes and the second type contact electrodes to insulate them from each other. However, the third insulating layer PAS3 may also be omitted as described above. In this case, the contact electrodes CNE may be disposed on the same layer.

A part of the third insulating layer PAS3 may be disposed on the second bank part BP2 of the first bank BNL1, and the contact holes CNT1 and CNT2 formed in the second bank part BP2 may also penetrate the third insulating layer PAS3. According to an embodiment, in the second contact holes CNT2, the sidewalls of the second insulating layer PAS2 and the third insulating layer PAS3 may be aligned with the sidewalls of the second bank part BP2. As described above, some of the contact holes CNT1 and CNT2 penetrating the second bank part BP2 of the first bank BNL1 may be formed in the same process as the third insulating layer PAS3. The second contact holes CNT2 of the second bank part BP2 may be formed at the same time as the third insulating layer PAS3 to penetrate the second bank part BP2, the second insulating layer PAS2 and the third insulating layer PAS3 on the second contact portion CT2.

However, the embodiments are not limited thereto. In some embodiments, the contact holes CNT1 and CNT2 of the second bank part BP2 may be formed at the same time as the second insulating layer PAS2, and only the third insulating layer PAS3 covering the contact holes CNT1 and CNT2 may be removed in a process of forming the third insulating layer PAS3. In this case, in each second contact hole CNT2, the sidewalls of the third insulating layer PAS3 may not be aligned with the sidewalls of the second insulating layer PAS2 and the second bank part BP2. This will be described with further reference to other embodiments.

Although not illustrated in the drawings, another insulating layer may be further disposed on the contact electrodes CNE and the third insulating layer PAS3 to cover them. The insulating layer may be entirely disposed on the first substrate SUB to protect the members disposed on the first substrate SUB from the external environment.

In the display device 10 according to the embodiment, the first bank BNL1 including the first bank part BP1 and the second bank part BP2 may separate the subpixels PXn, the emission areas EMA and the sub areas SA while helping the smooth alignment of the light emitting elements ED. The second bank part BP2 of the first bank BNL1 may prevent a strong electric field from being generated in the contact portions CT1 and CT2 formed in the first insulating layer PAS1, thereby preventing the light emitting elements ED from being aligned in an unwanted area.

Figure 7:
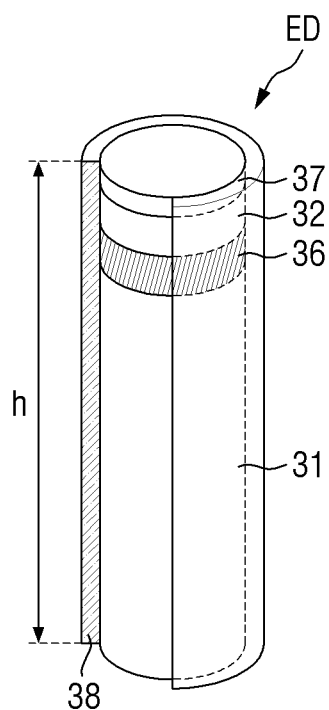
FIG. 7 is a schematic view of a light emitting element according to an embodiment.

FIG. 7 is a schematic view of a light emitting element ED according to an embodiment.

Referring to FIG. 7, the light emitting element ED may be a light emitting diode. Specifically, the light emitting element ED may be an inorganic light emitting diode having a size ranging from nanometers to micrometers and may be made of an inorganic material. When an electric field is formed in a specific direction between two electrodes facing each other, the light emitting element ED may be aligned between the two electrodes in which polarities are formed.

The light emitting element ED according to an embodiment may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with impurities of any conductivity type (e.g., ap type or an n type). The semiconductor layer may receive an electrical signal from an external power source and emit light of a specific wavelength band. The light emitting element ED may include a first semiconductor layer 31, a second semiconductor layer 32, the light emitting layer 36, an electrode layer 37, and the insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. An n-type dopant used to dope the first semiconductor layer 31 may be Si, Ge, Sn, or the like. The first end of the light emitting element ED may be a part in which the first semiconductor layer 31 is disposed with respect to the light emitting layer 36.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and A p-type dopant used to dope the second semiconductor layer 32 may be Mg, Zn, Ca, Se, Ba, or the like. The second end of the light emitting element ED may be a part in which the second semiconductor layer 32 is disposed with respect to the light emitting layer 36.

Although each of the first semiconductor layer 31 and the second semiconductor layer 32 is composed of one layer in the drawing, the embodiments are not limited thereto. Each of the first semiconductor layer 31 and the second semiconductor layer 32 may also include a larger number of layers, for example, may further include a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which multiple quantum layers and multiple well layers are alternately stacked. The light emitting layer 36 may emit light through combination of electron-hole pairs according to electrical signals received through the first semiconductor layer 31 and the second semiconductor layer 32. The light emitting layer 36 may include a material such as AlGaN or AlGaInN. In particular, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different group 3 to 5 semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic contact electrode. However, the embodiments are not limited thereto, and the electrode layer 37 may also be a Schottky contact electrode. The light emitting element ED may include at least one electrode layer 37. The light emitting element ED may include one or more electrode layers 37. However, the embodiments are not limited thereto, and the electrode layer 37 may also be omitted.

When the light emitting element ED is electrically connected to an electrode or a contact electrode in the display device 10, the electrode layer 37 may reduce the resistance between the light emitting element ED and the electrode or the contact electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layers described above. For example, the insulating film 38 may surround an outer surface of at least the light emitting layer 36 but may expose both ends of the light emitting element ED in a longitudinal direction. An upper surface of the insulating film 38 may be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the embodiments are not limited thereto. In some embodiments, the insulating film 38 may be formed in a multilayer structure in which multiple layers are stacked.

The insulating film 38 may protect the components of the light emitting element ED. The insulating film 38 may prevent an electrical short circuit that may occur in the light emitting layer 36 when the light emitting layer 36 directly contacts an electrode through which an electrical signal is transmitted to the light emitting element ED. The insulating film 38 may prevent a reduction in luminous efficiency of the light emitting element ED.

The outer surface of the insulating film 38 may be treated. The light emitting elements ED may be sprayed onto electrodes in a state where they are dispersed in a predetermined ink and then may be aligned. Here, the surface of the insulating film 38 may be hydrophobic or hydrophilic-treated so that each light emitting element ED remains separate from other adjacent light emitting elements ED in the ink without being agglomerated together.

The process of manufacturing the display device 10 will now be described with further reference to other drawings.

FIGS. 8 through 24 are schematic views illustrating a part of a process of manufacturing the display device 10 according to the embodiment. In the following drawings, the second banks BNL2 and the third bank BNL3 are not illustrated to describe a process of forming the electrodes RME and the insulating layers PAS1 through PAS3 in detail.

Figure 8:
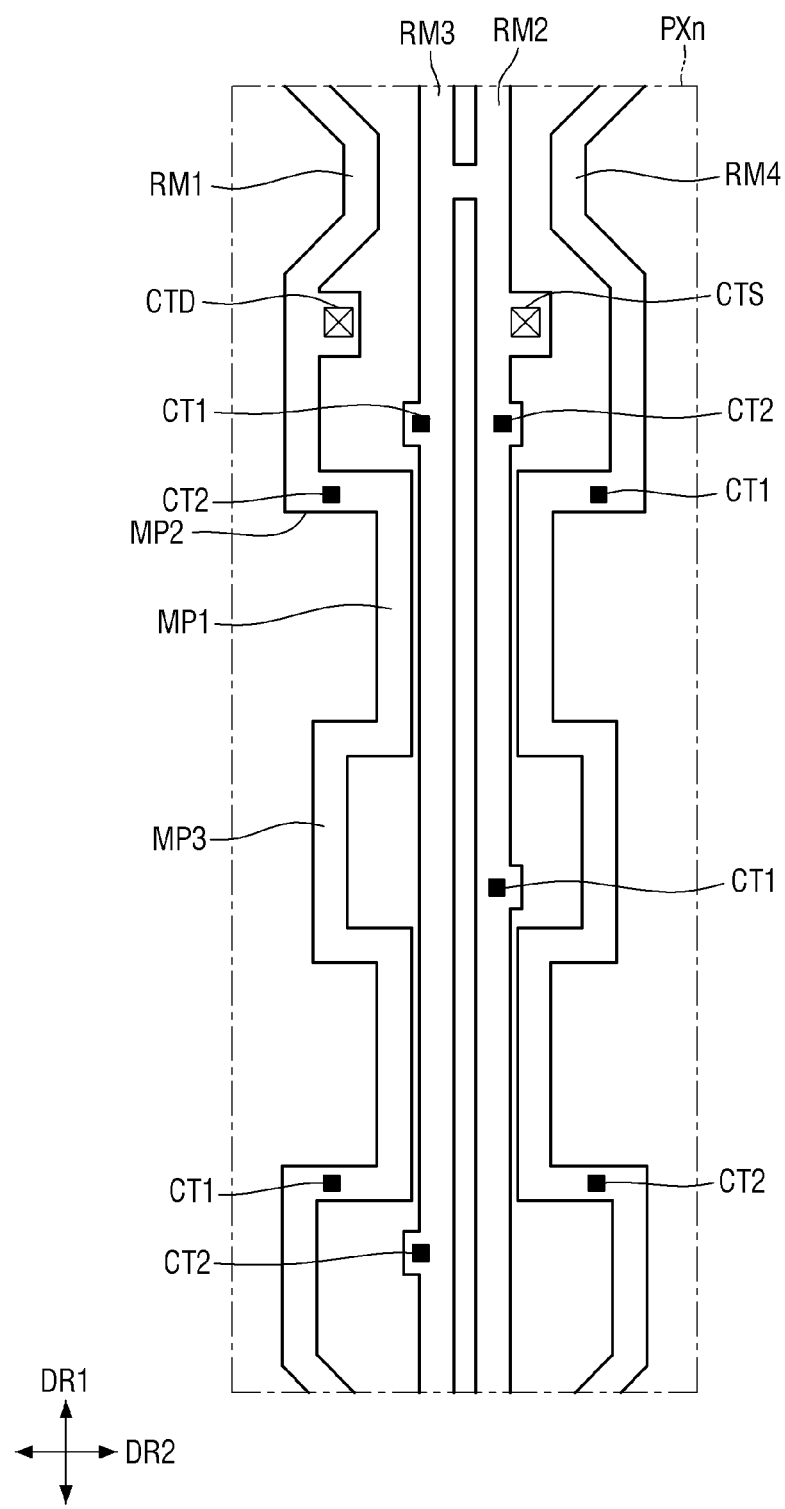
FIGS. 8 through 24 are schematic views illustrating a part of a process of manufacturing the display device according to an embodiment.

FIG. 8 illustrates an operation in the process of manufacturing the display device 10. Referring to FIG. 8, in the manufacturing process of the display device 10, the first substrate SUB and the circuit layer CCL disposed on the first substrate SUB are formed, and the second banks BNL2 (BNL_A and BNL_B), the third bank BNL3, electrode lines RM1 through RM4 and the first insulating layer PAS1 disposed on the third interlayer insulating layer IL3 are formed. Although not illustrated in the drawing, the structures of the second banks BNL2 and the third bank BNL3 are the same as those described above.

The electrode lines RM1 through RM4 may extend in the first direction DR1 across multiple subpixels PXn. The electrode lines RM1 through RM4 may be separated in the sub area SA and the emission area EMA to form the electrodes RME. A first electrode line RM1, a third electrode line RM3, a second electrode line RM2, and a fourth electrode line RM4 may be spaced apart from each other in the second direction DR2 and sequentially arranged. The first electrode line RM1 may be separated in the separation parts ROP1 and ROP2 of the sub area SA and the emission area EMA to form the first electrode RME1 and the fifth electrode RME5. The second electrode line RM2 may form the second electrode RME2 and the sixth electrode RME6, the third electrode line RM3 may form the third electrode RME3 and the seventh electrode RME7, and the fourth electrode line RM4 may form the fourth electrode RME4 and the eighth electrode RME8.

The structures of the electrode lines RM1 through RM4 may be the same as those of the electrodes RME except that they extend in the first direction DR1 without being separated in the sub area SA and the emission area EMA. Each of the first electrode line RM1 and the fourth electrode line RM4 may include a first line part MP1, a second line part MP2, and a third line part MP3 corresponding to the electrode parts RP1, RP2, and RP3, respectively.

Most of the electrode lines RM1 through RM4 may be disposed separately, but the second electrode line RM2 and the third electrode line RM3 may be connected to each other in the sub area SA. In the process of aligning the light emitting elements ED, the same electrical signal is transmitted to the second electrode line RM2 and the third electrode line RM3. Therefore, the second electrode line RM2 and the third electrode line RM3 may be connected to each other to prevent a voltage difference between them.

The first insulating layer PAS1 including the contact portions CT1 and CT2 is disposed on the electrode lines. The first insulating layer PAS1 may cover the electrode lines, but the contact portions CT1 and CT2 may be formed to partially expose the electrode lines. The contact portions CT1 and CT2 may be disposed in the emission area EMA and may be formed in parts where the electrode lines are not adjacent to each other in the second direction DR2.

For example, the contact portions CT1 and CT2 may be formed in the second line parts MP2 of the first electrode line RM1 and the fourth electrode line RM4 or may be spaced apart in the first direction DR1 from parts of the second electrode line RM2 and the third electrode line RM3 which face the first line part MP1 of another electrode line. However, the embodiments are not limited thereto.

Figure 9:
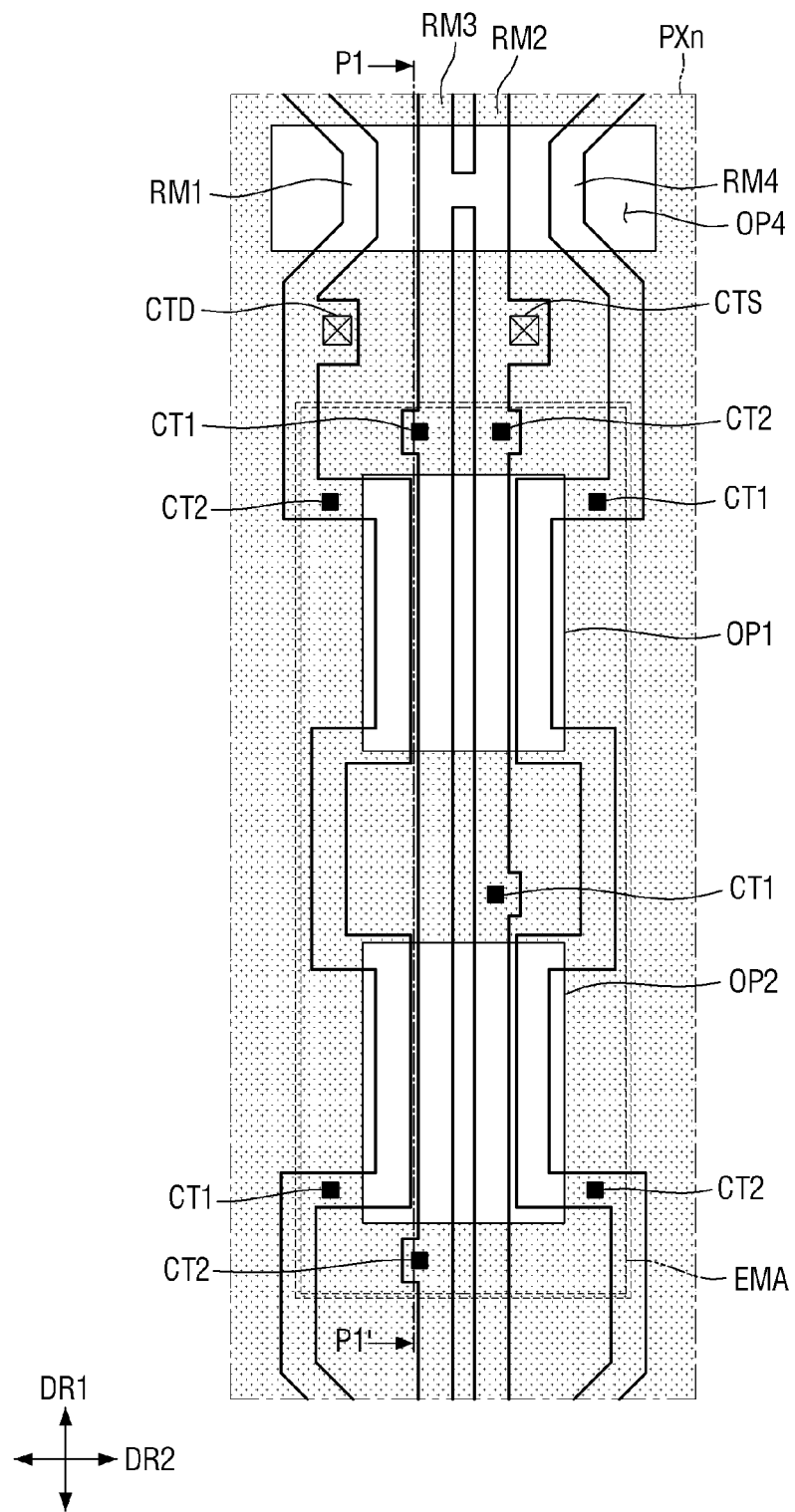
Figure 10:
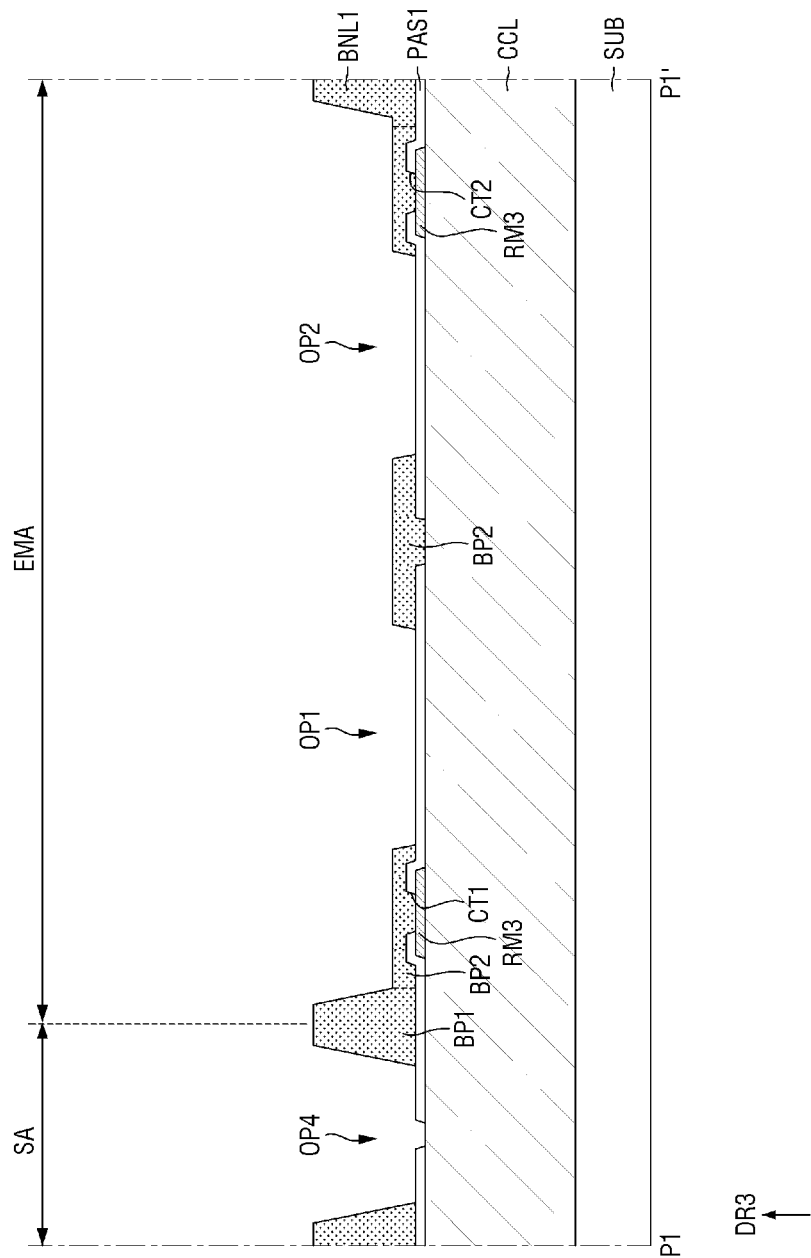

Referring to FIGS. 9 and 10, the first bank BNL1 is formed on the first insulating layer PAS1. FIG. 9 illustrates the planar arrangement of the first bank BNL1, and FIG. 10 illustrates a cross section taken along line P1-P1' of FIG. 9. The line P1-P1' of FIG. 9 cuts across the emission area EMA and the sub area SA in the first direction DR1 between the first electrode line RM1 and the third electrode line RM3.

The first bank BNL1 includes the first bank part BP1 surrounding the emission area EMA and the sub area SA and the second bank part BP2 disposed in the emission area EMA. The first bank part BP1 and the second bank part BP2 connected and integrated with each other may have different heights and play different roles. For example, the first bank part BP1 may prevent ink including the light emitting elements ED from overflowing in a subsequent process, and the second bank part BP2 may cover parts exposed by the contact portions CT1 and CT2.

In an embodiment, in a process of forming the first bank BNL1, the fourth opening OP4 which exposes the sub area SA and the first opening OP1 and the second opening OP2 which are located to partially overlap the electrode lines in the emission area EMA may be formed in the first bank BNL1. The fourth opening OP4 may be an opening formed in an area of the first insulating layer PAS1 which is located between subpixels PXn neighboring in the first direction DR1 and may be an opening formed in the first bank part BP1. The first opening OP1 and the second opening OP2 may be openings formed in the emission area EMA of the first insulating layer PAS1 and formed in the second bank part BP2. Unlike the third openings OP3 and the contact holes CNT1 and CNT2, the first opening OP1, the second opening OP2 and the fourth opening OP4 are formed when the first bank part BP1 of the first bank BNL1 itself is formed. As will be described below, the first opening OP1 and the second opening OP2 of the second bank part BP2 may form spaces in which the light emitting elements ED are disposed, and the fourth opening OP4 of the first bank part BP1 may form a space in which the electrode lines are separated.

Figure 11:
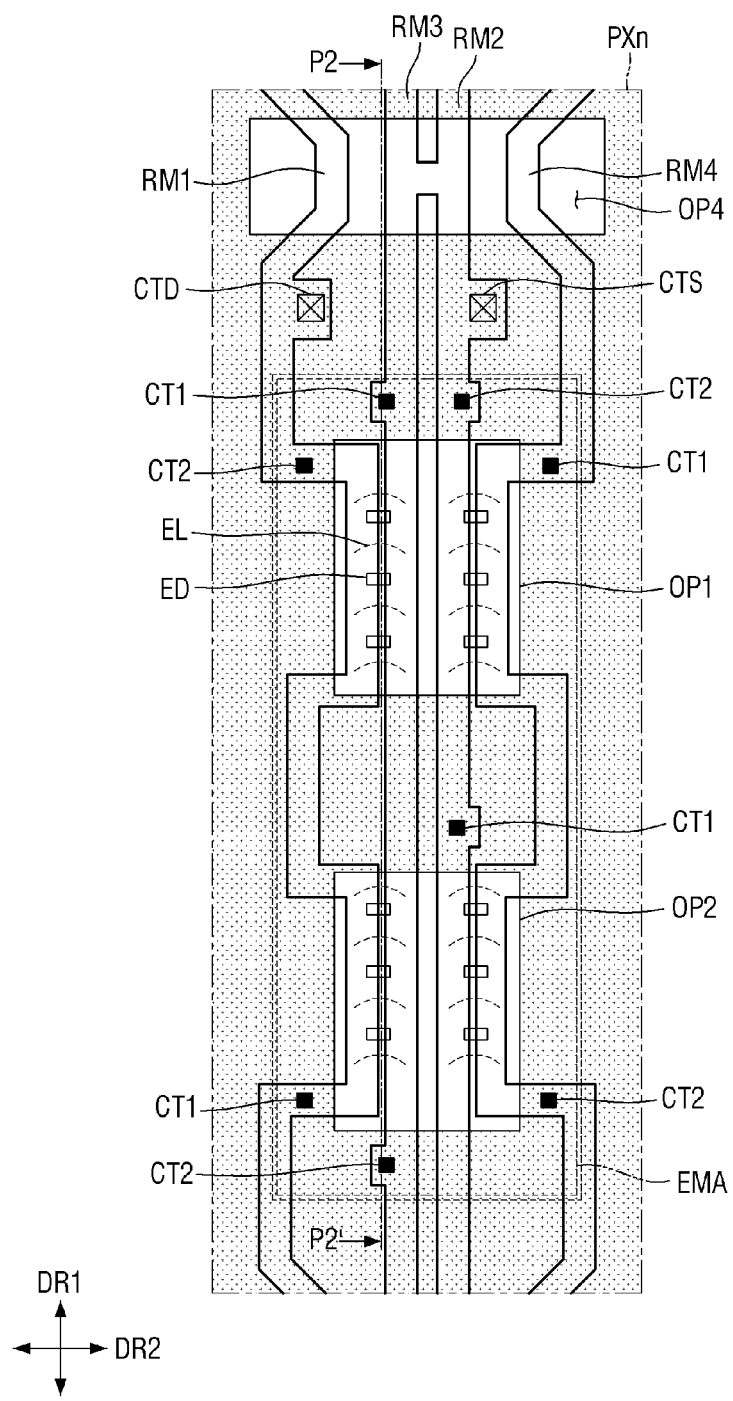
Figure 12:
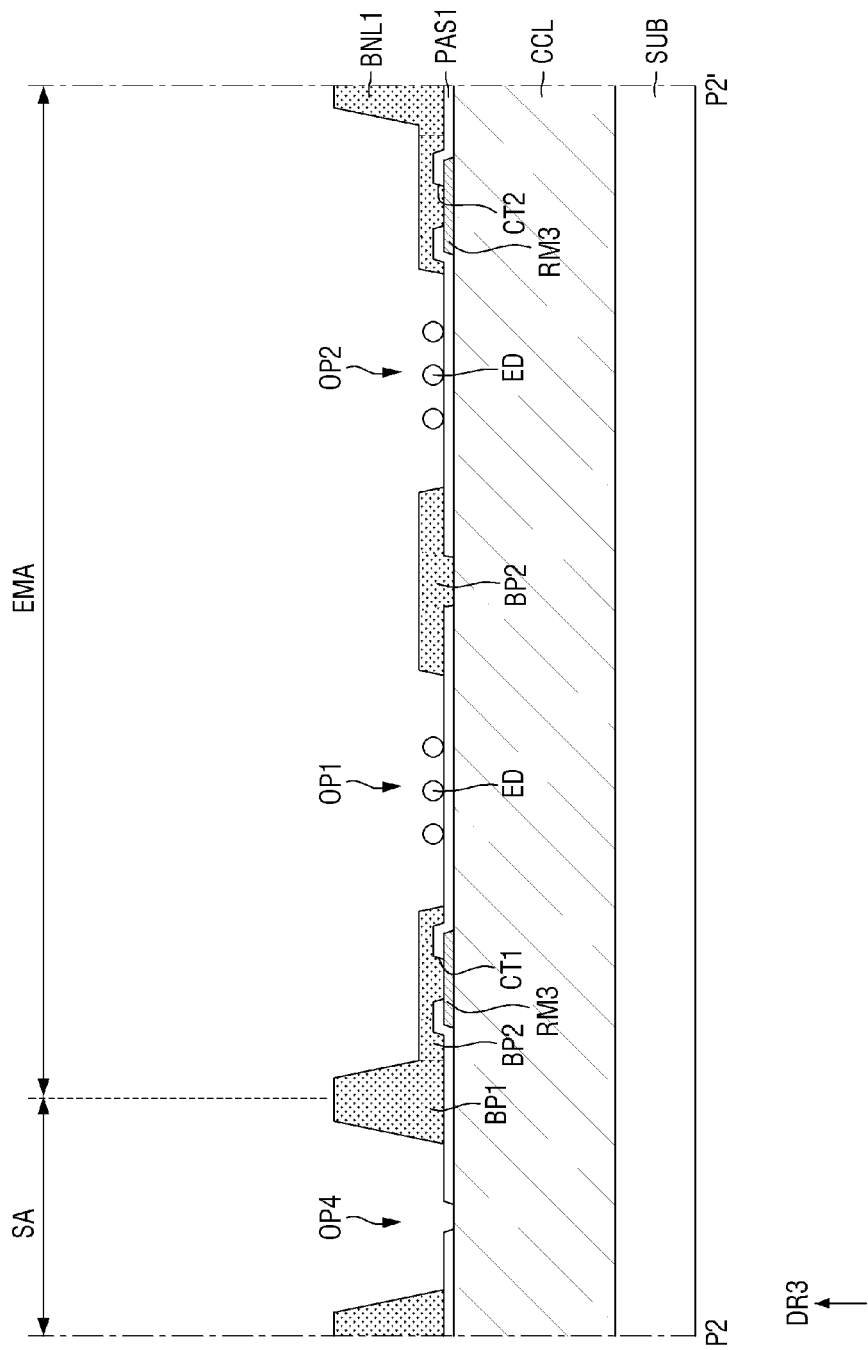

Referring to FIGS. 11 and 12, ink including the light emitting elements ED is sprayed into the emission area EMA, and an electric field EL is generated on the electrode lines to place the light emitting elements ED. FIG. 11 schematically illustrates the electric field EL generated on the electrode lines RM1 through RM4, and FIG. 12 illustrates a cross section taken along line P2-P2' of FIG. 11.

Each light emitting element ED including semiconductor layers doped with different conductivity types may have an intramolecular dipole and may be placed on the electrode lines by a dielectrophoretic force due to the electric field EL in the ink.

The ink sprayed to each subpixel PXn may settle in the emission area EMA surrounded by the first bank part BP1 of the first bank BNL1. The first bank part BP1 may prevent the ink from overflowing to other adjacent emission areas EMA. Thus, even if inks including different types of light emitting elements ED are sprayed to different subpixels PXn, they can be prevented from being mixed with each other.

The second bank part BP2 of the first bank BNL1 may prevent the light emitting elements ED from being concentrated in the contact portions CT1 and CT2 by the electric field EL generated on the electrode lines RM1 through RM4. The first insulating layer PAS1 and the second bank part BP2 are disposed on the electrode lines RM1 through RM4. The second bank part BP2 may cover the contact portions CT1 and CT2 but may expose areas, in which the electrode lines RM1 through RM4 are disposed adjacent to face each other, through the first opening OP1 and the second opening OP2. Since the contact portions CT1 and CT2 exposing upper surfaces of the electrode lines RM1 through RM4 are covered by the second bank part BP2, the strength of the electric field EL generated on the contact portions CT1 and CT2 may weaken.

The second bank part BP2 disposed at the top includes the first opening OP1 and the second opening OP2 to expose the first insulating layer PAS1 disposed at specific positions on the electrode lines RM1 through RM4. The light emitting elements ED may be concentrated in the first opening OP1 and the second opening OP2 due to a step difference of the second bank part BP2, and most of the light emitting elements ED may be electrically connected to the electrodes RME through a subsequent process. In the display device 10, the first bank BNL1 including the second bank part BP2 in addition to the first bank part BP1 that prevents overflowing of ink can reduce the number of light emitting elements ED that are aligned in an unwanted area and lost.

Figure 13:
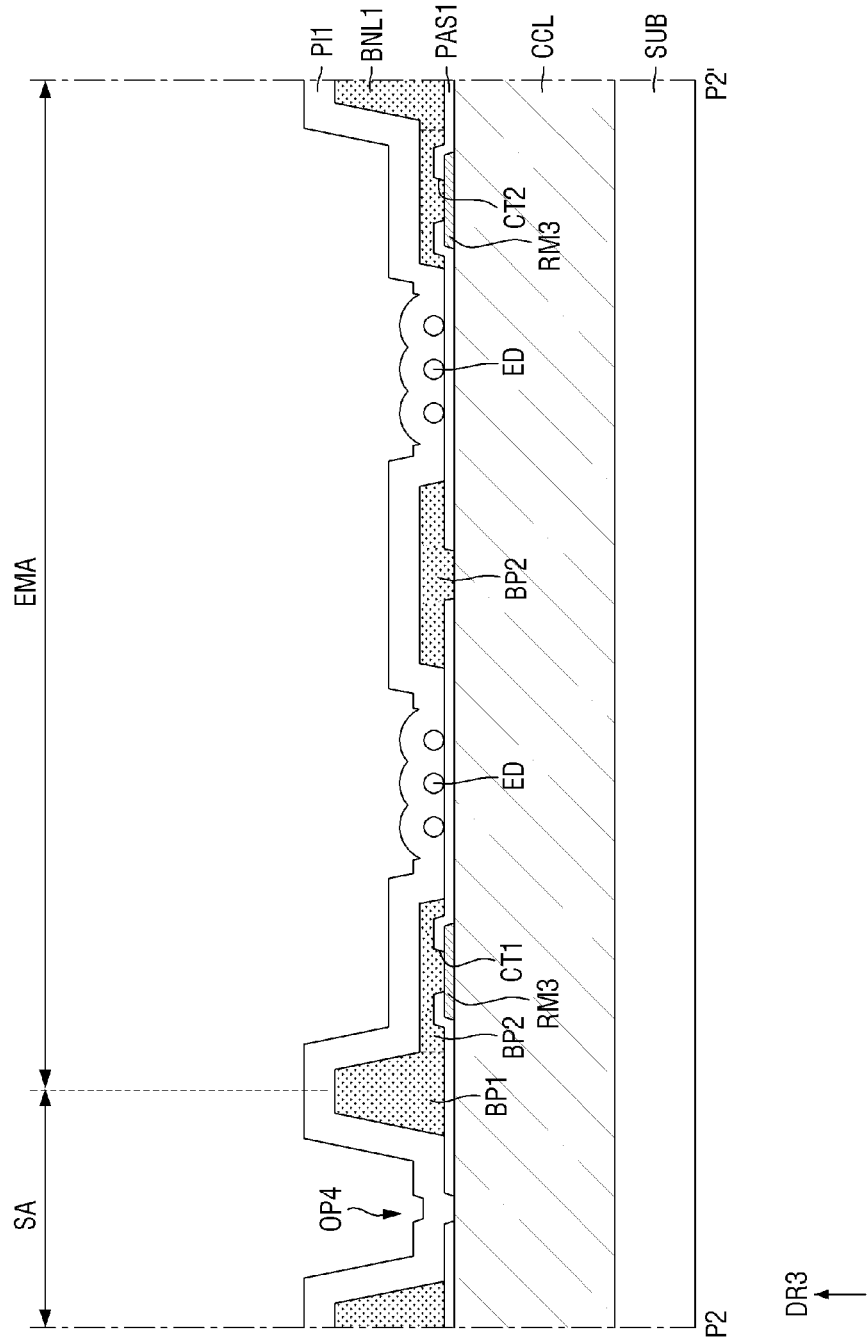
Figure 14:
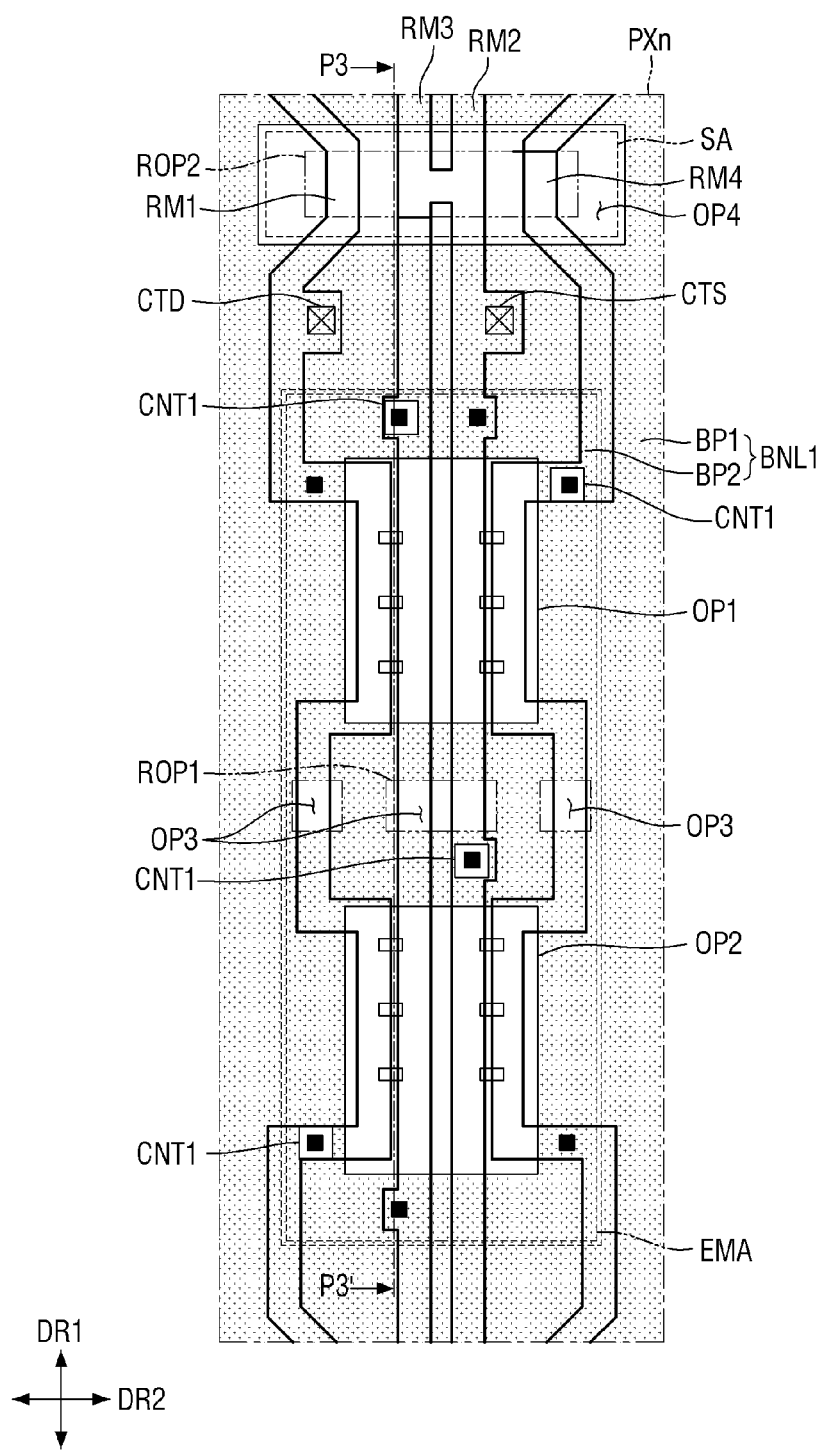

Referring to FIG. 13, a first insulating material layer PI1 may be formed on the first insulating layer PAS1, the first bank BNL1, and the light emitting elements ED. The first insulating material layer PI1 may cover the light emitting elements ED and may be entirely formed on the first insulating layer PAS1 and the first bank BNL1. The first insulating material layer PI1 may fix the light emitting elements ED and may be patterned in a subsequent process to form the second insulating layer PAS2.

Referring to FIGS. 14 through 19, the second insulating layer PAS2 may be formed by patterning the first insulating material layer PI1. FIGS. 15 through 19 illustrate cross sections taken along line P3-P3' of FIG. 14 and sequentially illustrate a process of forming the second insulating layer PAS2 by patterning the first insulating material layer PI1. According to an embodiment, in the process of forming the second insulating layer PAS2 by patterning the first insulating material layer PI1, the first contact holes CNT1 and the third openings OP3 may be formed in the second bank part BP2. The second insulating layer PAS2 may be formed to expose an end of each light emitting element ED while the first contact holes CNT1 and the third openings OP3 are formed together with the second bank part BP2. The process of patterning the first insulating material layer PI1 may include a first etching process for etching parts of the first insulating material layer PI1 in which the first contact holes CNT1 and the third openings OP3 are formed and a second etching process for etching the second bank part BP2 and exposing an end of each light emitting element ED. The process of etching the first insulating material layer PI1 may be performed through two different processes, and a photoresist for patterning the first insulating material layer PI1 may be formed using a halftone mask to partially include holes PH1 through PH3 and HT having different depths.

Figure 15:
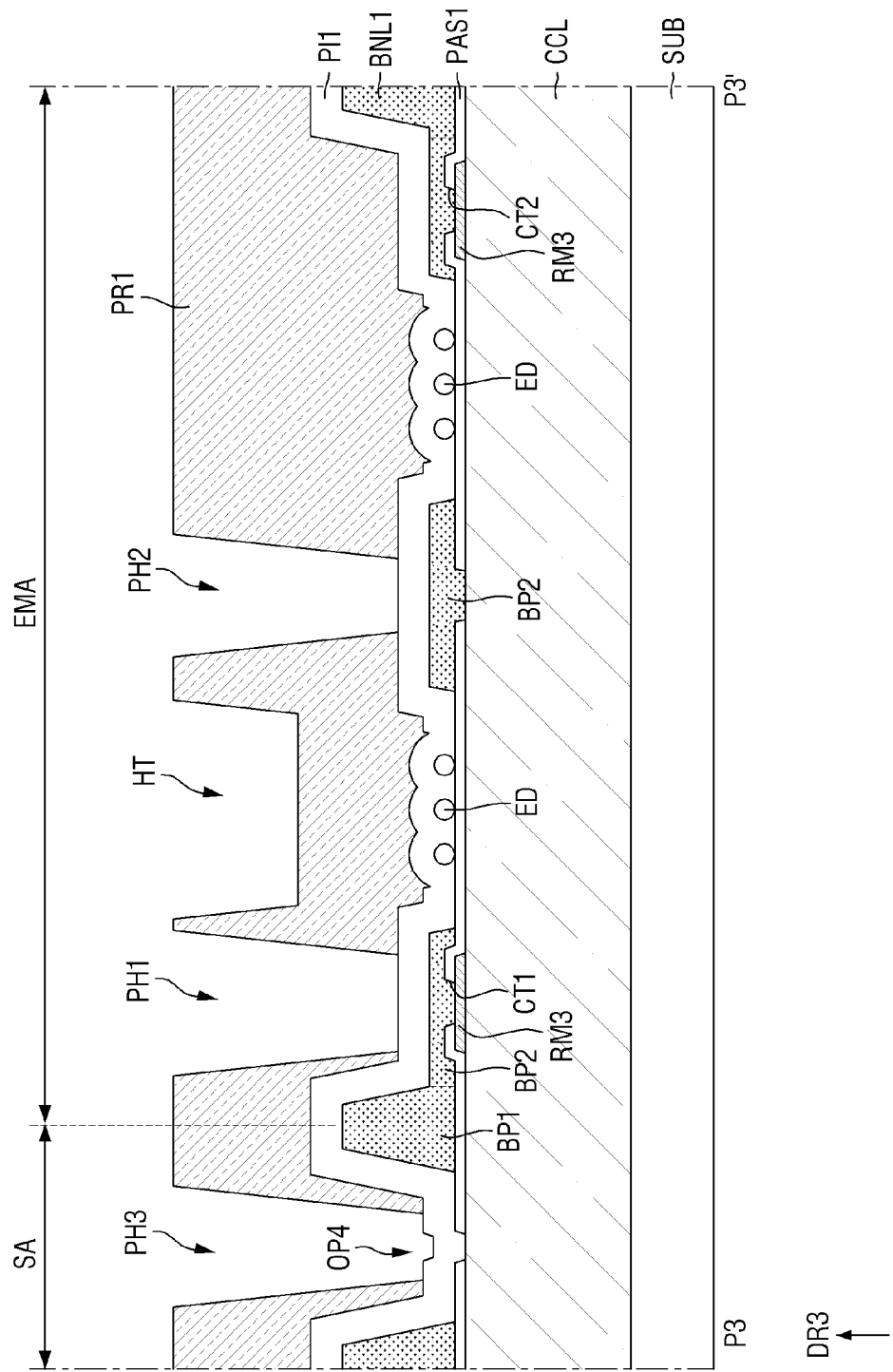

Referring to FIG. 15, a first photoresist PR1 including multiple holes PH1 through PH3 and HT may be formed on the first insulating material layer PI1. The first photoresist PR1 may include first through third holes PH1 through PH3 formed to expose an upper surface of the first insulating material layer PI1 and a half hole HT having a lower depth than the first hole PH1 and formed to have a recessed upper surface. The first through third holes PH1 through PH3 may be holes for etching the first insulating material layer PI1 in the first etching process, and the half hole HT may be a hole for exposing an end of each light emitting element ED in the second etching process. This shape of the first photoresist PR1 may be formed using a halftone mask.

A process of forming the first insulating material layer PI1 may be performed through two etching processes. Only the first insulating material layer PI1 may be disposed on the light emitting elements ED, and the second bank part BP2 and the first insulating material layer PI1 may be stacked in other areas. The first insulating material layer PI1 and the second bank part BP2 may be etched through the same etching process, for example, a dry etching process. When the first insulating material layer PI1 and the second bank part BP2 are simultaneously etched in parts where the third openings OP3 and the first contact holes CNT1 may be formed, an end of each light emitting element ED may be exposed. Thus, the insulating film 38 of each light emitting element ED can be damaged. To prevent this, the process of forming the second insulating layer PAS2 may be performed through the first etching process for etching the first insulating material layer PI1 in the parts where the third openings OP3 and the first contact holes CNT1 are formed and the second etching process for exposing the second bank part BP2 and an end of each light emitting element ED. In order to prevent the first insulating material layer PI1 covering the light emitting elements ED from being removed in the first etching process, the first photoresist PR1 may be formed using a halftone mask to include the half hole HT having a different depth. The half hole HT is a hole for an etching process for exposing an end of each light emitting element ED and may be formed on the first opening OP1 in which the light emitting elements ED are disposed. Although not illustrated in the drawing, the half hole HT may also be formed on the second opening OP2. The half hole HT of the first photoresist PR1 may be a hole for exposing an end of each light emitting element ED which contacts the third contact electrode CNE3 or the fifth contact electrode CNE5 among the light emitting elements ED.

The first hole PH1 may be a part where a first contact hole CNT1 is formed and exposes the first insulating material layer PI1 on a first contact portion CT1, and the second hole PH2 may be a part where a third opening OP3 is formed and exposes the first insulating material layer PI1 between the first opening OP1 and the second opening OP2. The third hole PH3 may expose the first insulating material layer PI1 in a part where the process of separating the electrode lines is performed in the sub area SA.

Figure 16:
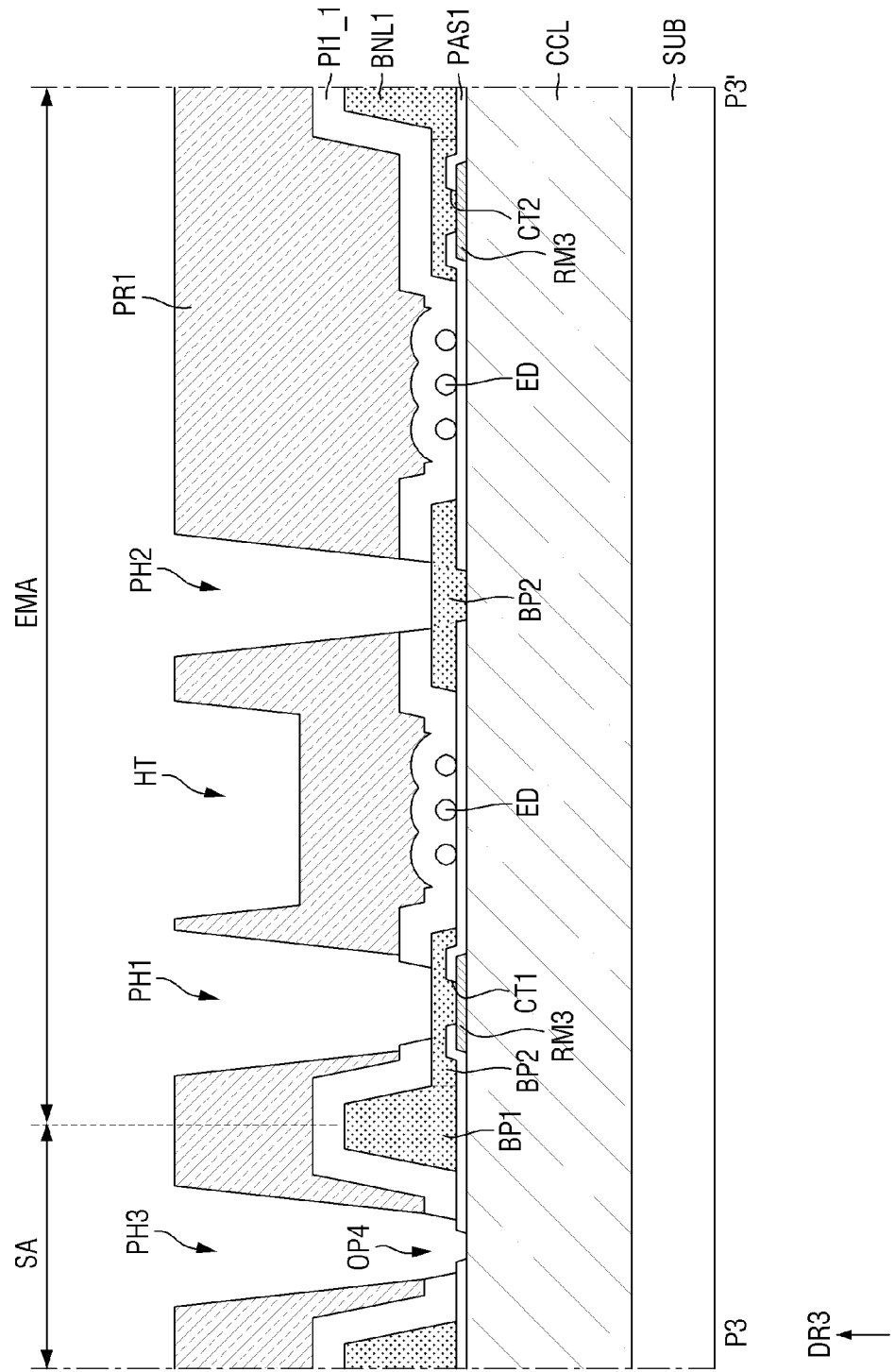

Referring to FIG. 16, the first etching process may be performed to pattern the first insulating material layer PI1 along the first hole PH1, the second hole PH2 and the third hole PH3 of the first photoresist PR1. The first insulating material layer PI1_1 formed after the first etching process may expose the second bank part BP2 located on the first contact portion CT1 of the emission area EMA and the second bank part BP2 between the first opening OP1 and the second opening OP2.

Figure 17:
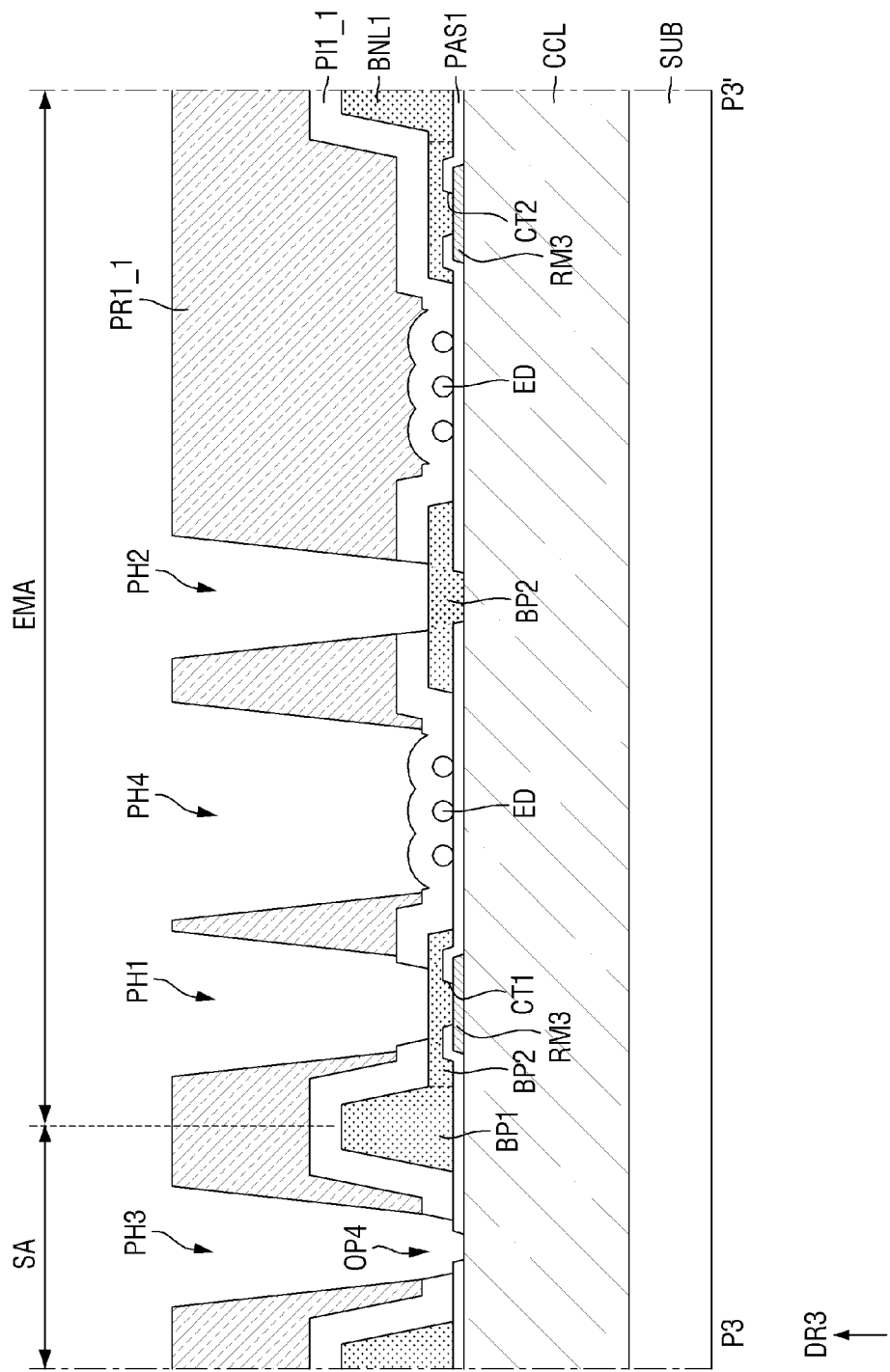

Referring to FIG. 17, the half hole HT of the first photoresist PR1 may be exposed and developed to form a fourth hole PH4. The first photoresist PR1_1 having the fourth hole PH4 may be utilized as a mask in a patterning process for forming the second insulating layer PAS2. The fourth hole PH4 may expose the first insulating material layer PI1_1 disposed in the first opening OP1 and may be formed on an end of each light emitting element ED. Although not illustrated, the first photoresist PR1_1 may include more fourth holes PH4 to expose parts of the first insulating material layer PI1_1 disposed in the second opening OP2.

Figure 18:
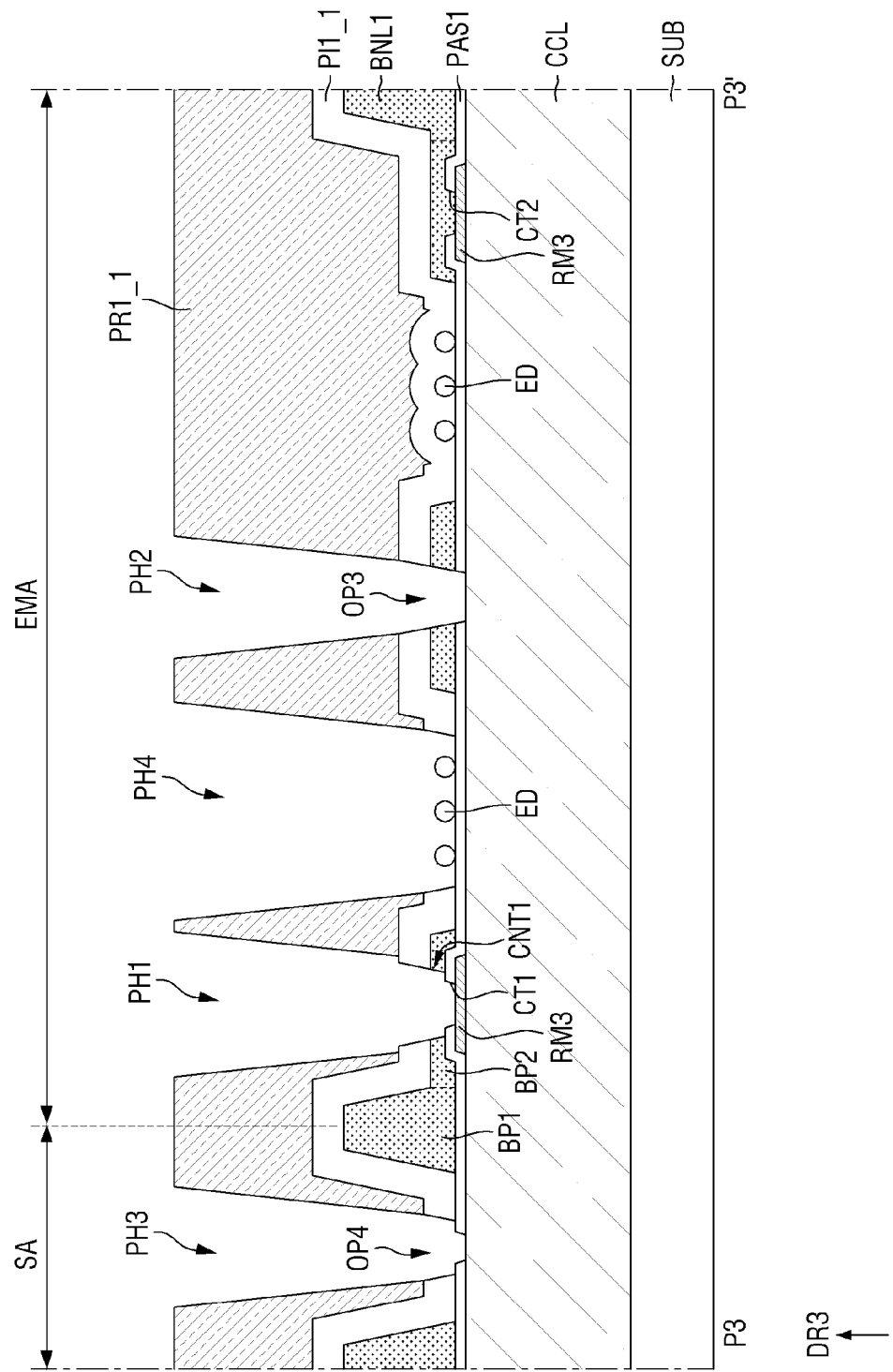

Referring to FIG. 18, the second etching process may be performed to etch the first insulating material layer PI1_1 and the second bank part BP2 along the holes PH1, PH2 and PH4 of the first photoresist PR1_1. The first insulating material layer PI1_1 patterned in the second etching process may form the second insulating layer PAS2 that exposes only an end of each light emitting element ED. The second insulating layer PAS2 may be shaped as in FIG. 5 by exposing the other end of each light emitting element ED in a process of forming the third insulating layer PAS3 to be described below.

In some embodiments, each of the first etching process and the second etching process may be performed as a dry etching process, and the first insulating material layer PI1_1 and the second bank part BP2 may be simultaneously etched in the second etching process. The first insulating material layer PI1_1 may include a material that forms the second insulating layer PAS2 and may include a material that is not the same as that of the second bank part BP2. However, the first insulating material layer PI1_1 and the second bank part BP2 may be simultaneously etched according to process conditions of the second etching process.

A first contact hole CNT1 penetrating the second insulating layer PAS2 and the second bank part BP2 may be formed in the second bank part BP2 etched along the first hole PH1, and a third opening OP3 may be formed in the second bank part BP2 etched along the second hole PH2. The first insulating layer PAS1 may not be disposed in the third opening OP3, and the upper surfaces of the electrode lines RM1 through RM4 may be exposed. The first insulating material layer PI1_1 etched along the fourth hole PH4 may expose an end of each light emitting element ED disposed in the first opening OP1. Although not illustrated in the drawing, the first insulating material layer PI1_1 etched along the fourth hole PH4 formed on the second opening OP2 may expose the ends of the light emitting elements ED disposed in the second opening OP2.

Figure 19:
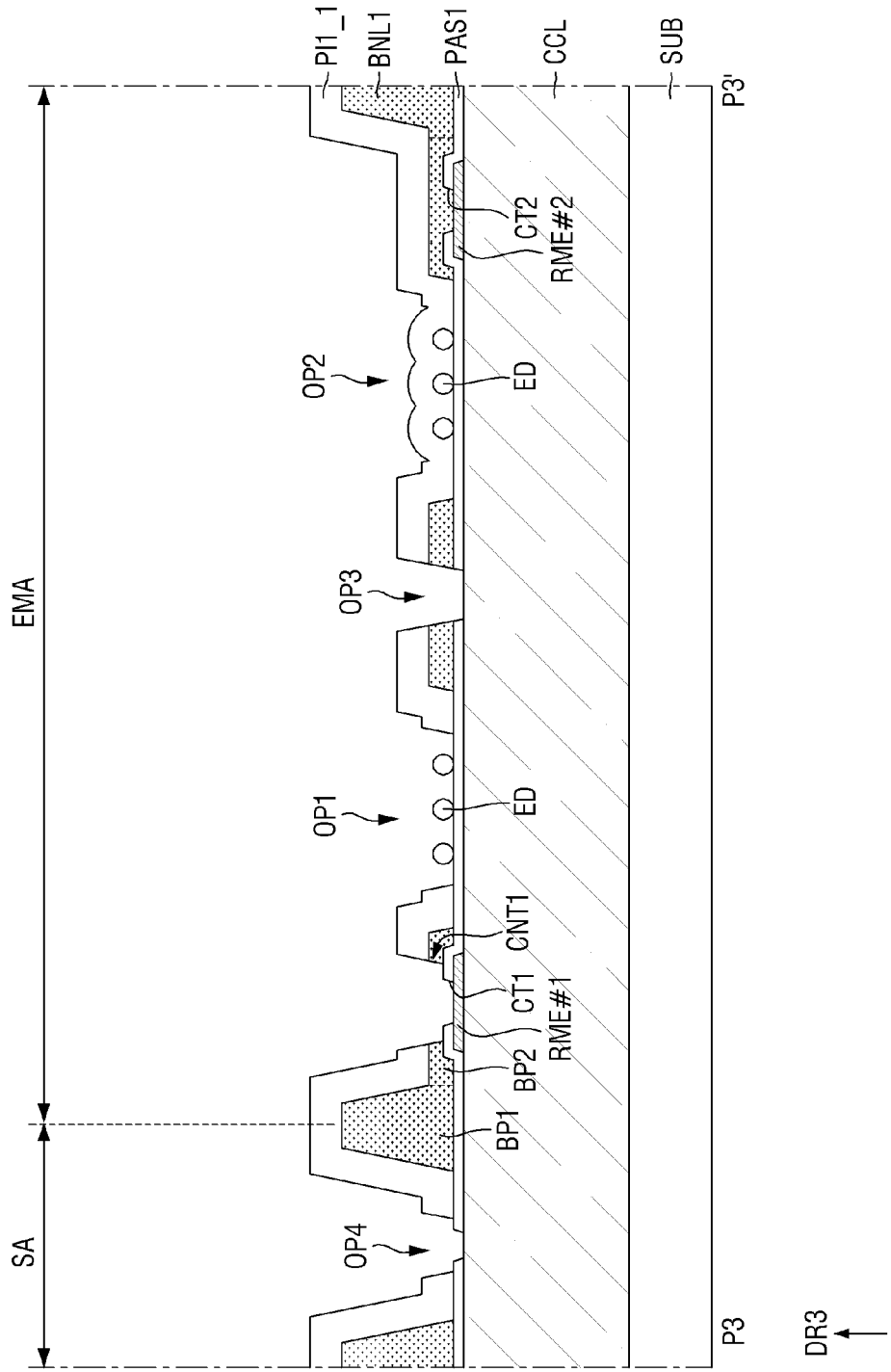

Referring to FIG. 19, the second insulating layer PAS2 may be formed by removing the first photoresist PR1_1.

Figure 20:
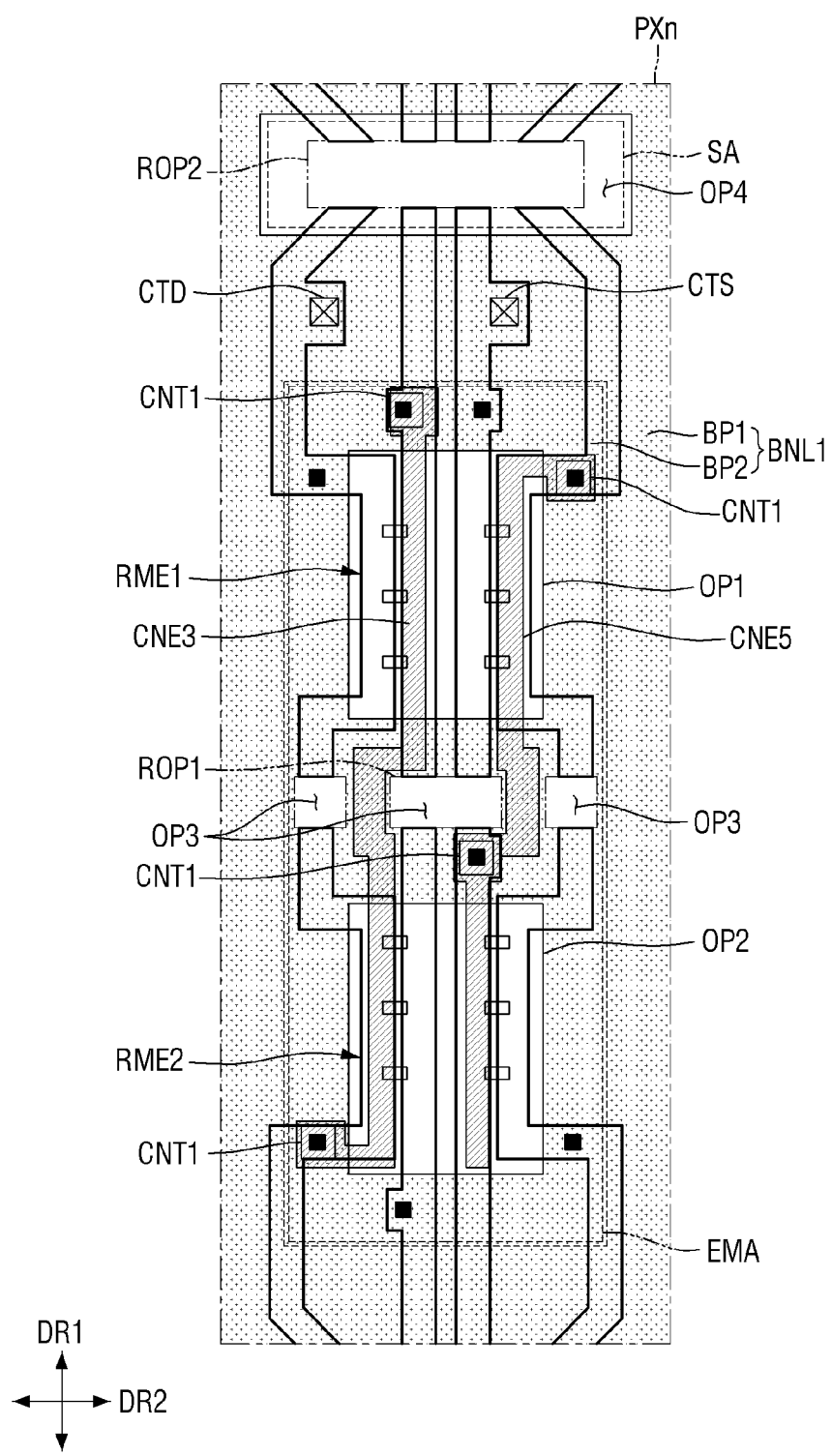
Figure 21:
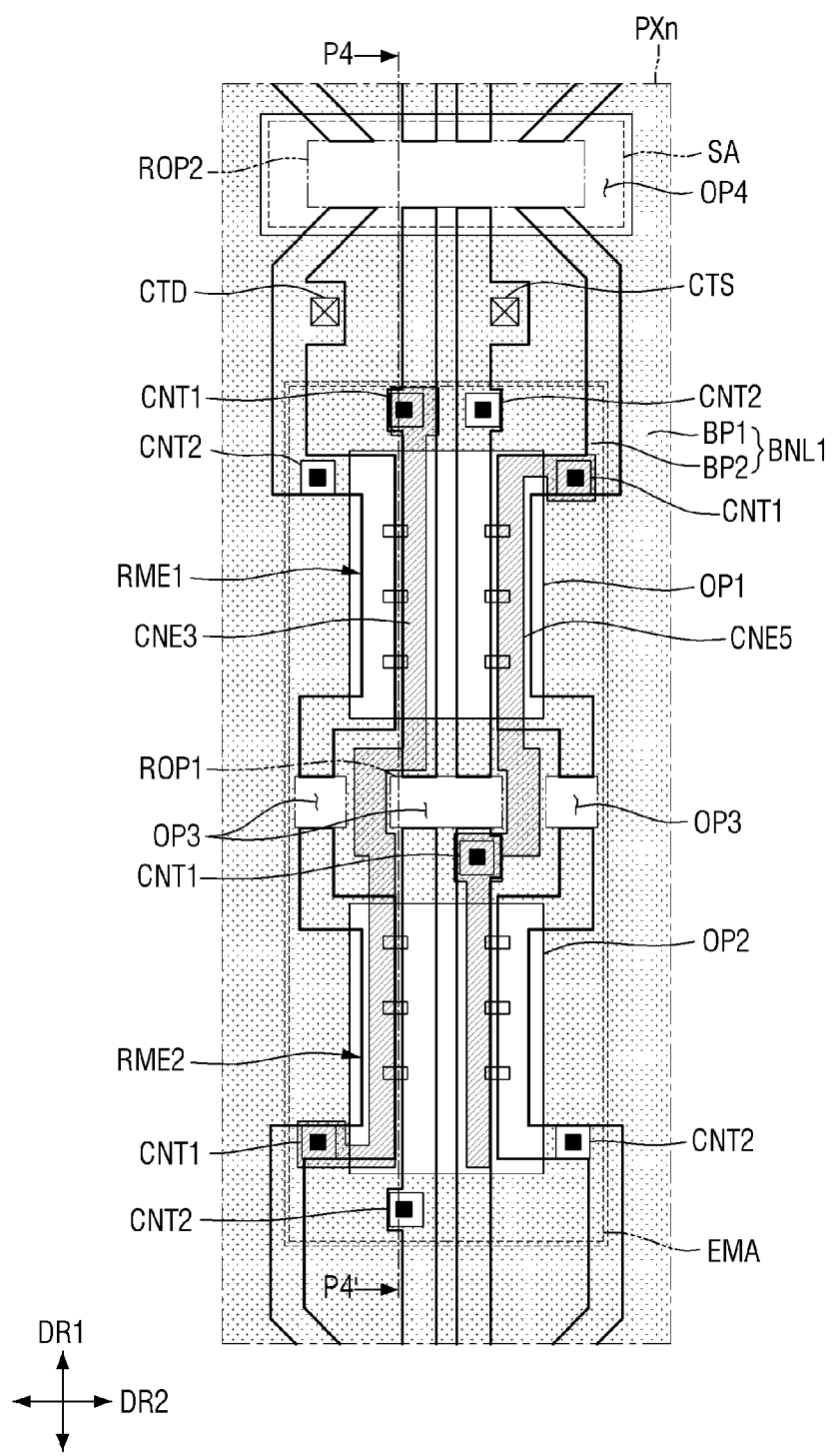

Referring to FIG. 20, the electrode lines exposed without having the second insulating layer PAS2 and the second bank part BP2 disposed thereon may be separated in the third openings OP3 and the fourth opening OP4 to form the electrodes RME, and the third contact electrode CNE3 and the fifth contact electrode CNE5 are formed on the second insulating layer PAS2.

The process of separating the electrode lines may be performed by a process of patterning the electrode lines using the second bank part BP2 and the second insulating layer PAS2 disposed in the third openings OP3 or the fourth opening OP4 as a mask. The electrode lines separated in the third openings OP3 and the fourth opening OP4 may form the electrodes RME, and the electrodes RME may be divided into different electrode groups RME #1 and RME #2 by the first separation part ROP1 of the third openings OP3. The electrodes RME of different subpixels PXn may be separated from each other by the second separation part ROP2 of the fourth opening OP4.

A process of forming the third contact electrode CNE3 and the fifth contact electrode CNE5 may be performed by a conventional patterning process. Each of the third contact electrode CNE3 and the fifth contact electrode CNE5 may contact an exposed end of each light emitting element ED disposed in the first opening OP1 and the second opening OP2. The third contact electrode CNE3 and the fifth contact electrode CNE5 may contact some of the electrodes RME through the first contact holes CNT1 and the first contact portions CT1 penetrating the second insulating layer PAS2 and the second bank part BP2.

Figure 22:
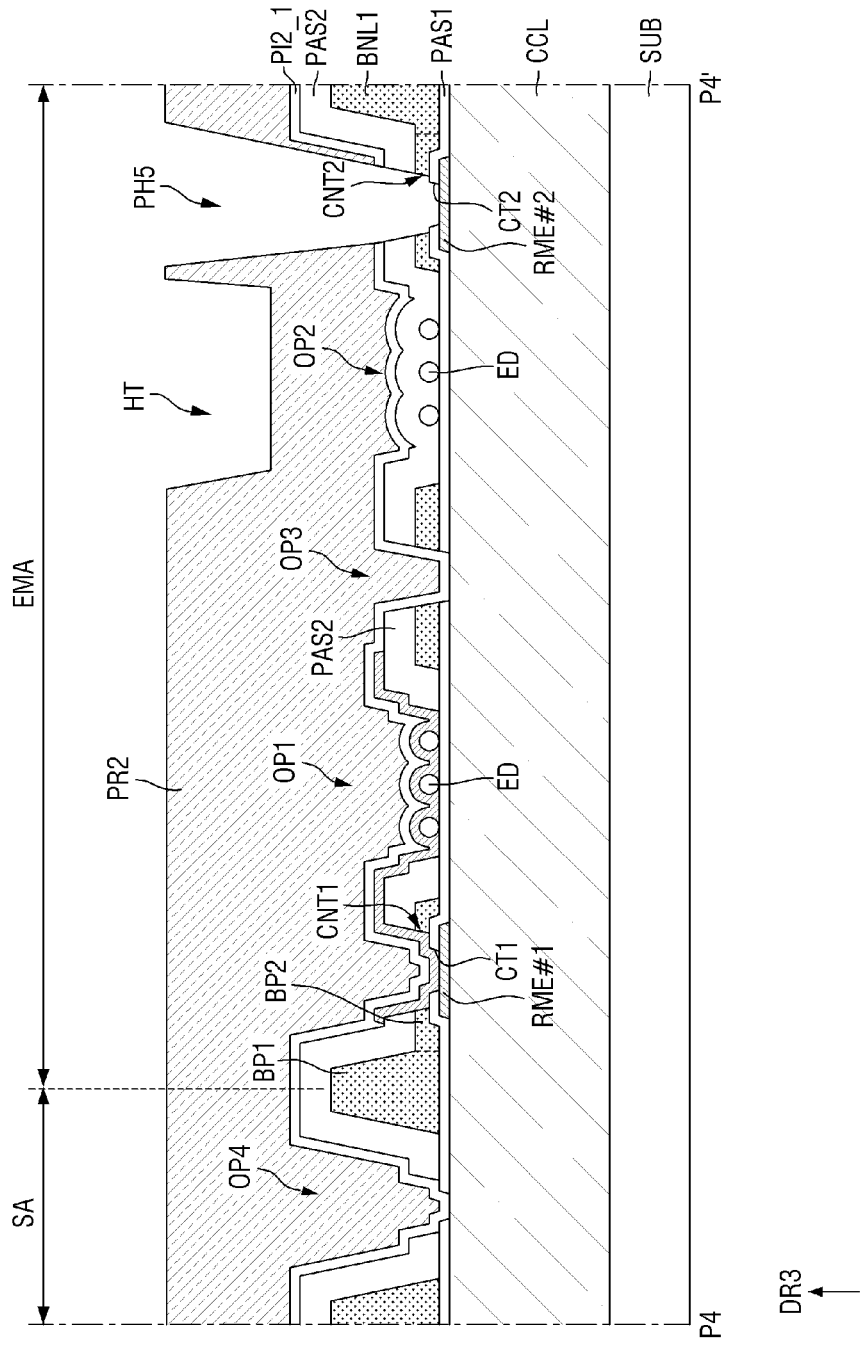
Figure 23:
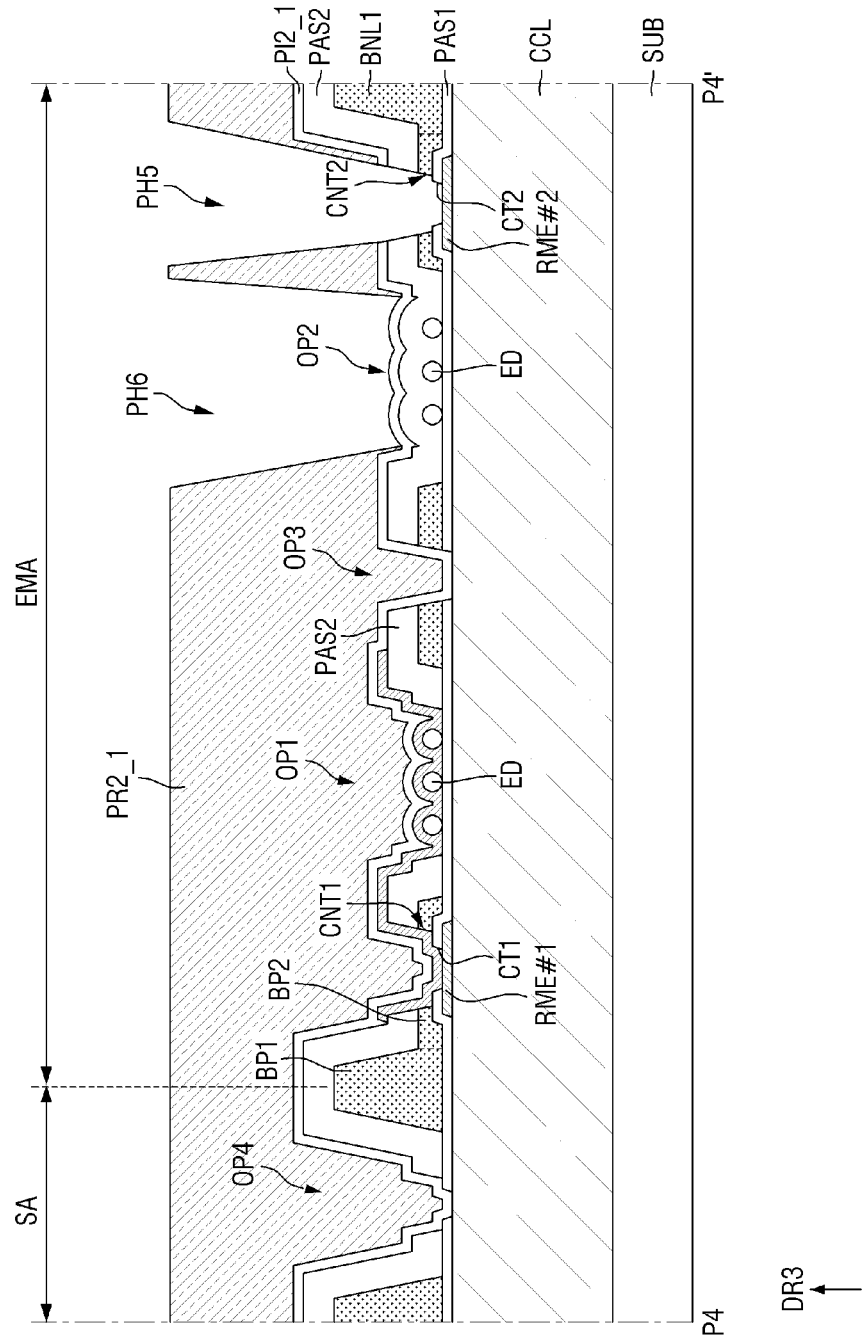
Figure 24:
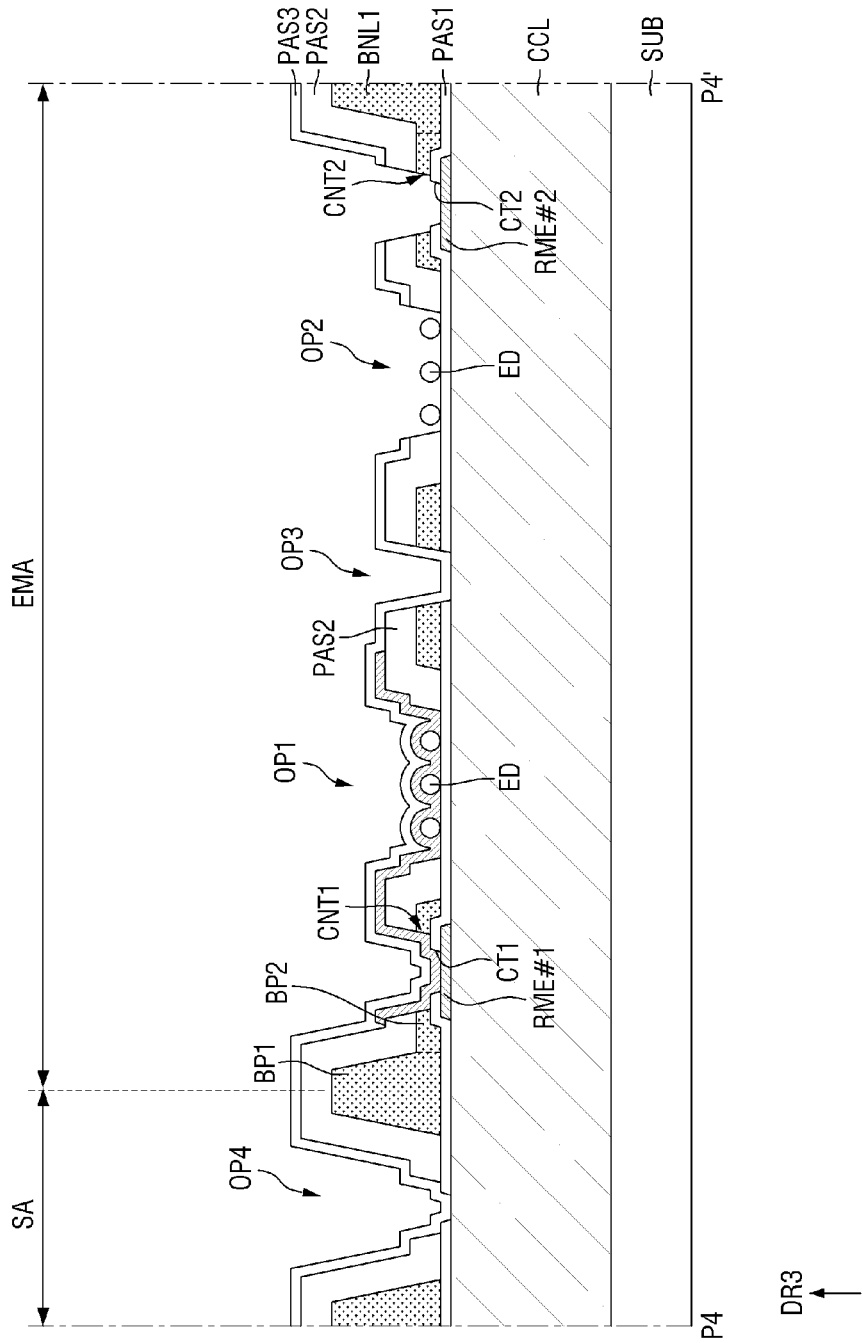

Referring to FIGS. 21 through 24, a second insulating material layer PI2 is formed on the third contact electrode CNE3, the fifth contact electrode CNE5 and the second insulating layer PAS2 and is patterned to form the third insulating layer PAS3. The process of forming the third insulating layer PAS3 by patterning the second insulating material layer PI2 may be performed similarly to the process of forming the second insulating layer PAS2 by patterning the first insulating material layer PI1. In an embodiment, the process of patterning the second insulating material layer PI2 may be performed by forming a second photoresist PR2 including multiple holes PH5 and HT on the second insulating material layer PI2 using a halftone mask and then performing a third etching process and a fourth etching process to etch the second photoresist PR2. FIGS. 22 through 24 illustrate cross sections taken along line P4-P4' of FIG. 21

Referring to FIG. 22, the second insulating material layer PI2 may be entirely formed on the second insulating layer PAS2, the third contact electrode CNE3 and the fifth contact electrode CNE5, and the second photoresist PR2 may be formed on the second insulating material layer PI2. The second photoresist PR2 may include a fifth hole PH5 exposing an upper surface of the second insulating material layer PI2 and a half hole HT having a lower depth than the fifth hole PH5 and formed to have a recessed upper surface. The fifth hole PH5 is a hole for etching the second insulating material layer PI2 in the third etching process, and the half hole HT is a hole for exposing the other end of each light emitting element ED in the fourth etching process. The fifth hole PH5 is a part where a second contact hole CNT2 is formed and exposes the second insulating material layer PI2 disposed on a second contact portion CT2.

Referring to FIG. 23, the third etching process is performed to pattern the second insulating material layer PI2 along the fifth hole PH5 of the second photoresist PR2. The second insulating material layer PI2_1 formed after the third etching process may expose the second bank part BP2 located on the second contact portion CT2 of the emission area EMA.

The half hole HT of the second photoresist PR2 is exposed and developed to form a sixth hole PH6. The second photoresist PR2_1 having the sixth hole PH6 may be utilized as a mask in a patterning process for forming the third insulating layer PAS3. The sixth hole PH6 may expose the second insulating material layer PI2_1 disposed in the second opening OP2 and may be formed on the other end of each light emitting element ED. Although not illustrated in the drawing, the second photoresist PR2_1 may include more sixth holes PH6 to expose parts of the second insulating material layer PI2_1 disposed in the first opening OP1.

Referring to FIG. 24, the fourth etching process may be performed to etch the second insulating material layer PI2_1 and the second bank part BP2 along the holes PH5 and PH6 of the second photoresist PR2_1. The second insulating material layer PI2_1 patterned in the fourth etching process may form the third insulating layer PAS3 that exposes the other end of each light emitting element ED. In the fourth etching process, the second insulating layer PAS2 may also be formed to expose the other end of each light emitting element ED. In the fourth etching process, the second insulating layer PAS2 and the second insulating material layer PI2_1 may be simultaneously etched along the sixth hole PH6.

In some embodiments, the second insulating material layer PI2_1 and the second bank part BP2 may be simultaneously etched in the fourth etching process. A second contact hole CNT2 penetrating the second insulating layer PAS2, the third insulating layer PAS3 and the second bank part BP2 is formed in the second bank part BP2 etched along the fifth hole PH5. The second insulating layer PAS2 and the second insulating material layer PI2_1 etched along the sixth hole PH6 may expose the other end of each light emitting element ED disposed in the second opening OP2. Although not illustrated in the drawing, the second insulating layer PAS2 and the second insulating material layer PI2_1 etched along the sixth hole PH6 formed on the first opening OP1 may expose the other end of each light emitting element ED disposed in the first opening OP1.

The third insulating layer PAS3 may be formed by removing the second photoresist PR2_1.

Finally, although not illustrated in the drawing, the first contact electrode CNE1, the second contact electrode CNE2 and the fourth contact electrode CNE4 may be formed on the third insulating layer PAS3. The first contact electrode CNE1, the second contact electrode CNE2 and the fourth contact electrode CNE4 may contact the other exposed end of each light emitting element ED disposed in the first opening OP1 and the second opening OP2. The first contact electrode CNE1, the second contact electrode CNE2 and the fourth contact electrode CNE4 may contact some of the electrodes RME through the second contact holes CNT2 and the second contact portions CT2 penetrating the second insulating layer PAS2, the third insulating layer PAS3 and the second bank part BP2.

The display device 10 according to an embodiment may be manufactured through the above-described process. In the display device 10, the first bank BNL1 including the first bank part BP1 and the second bank part BP2 may induce smooth alignment of the light emitting elements ED while preventing ink including the light emitting elements ED from overflowing. Since the second bank part BP2 covers the contact portions CT1 and CT2 exposing the electrode lines, the light emitting elements ED may be prevented from being disposed in an unwanted area and lost.

In the process of manufacturing the display device 10, the process of forming the second insulating layer PAS2 and the third insulating layer PAS3 may be performed through two etching processes. In the process of patterning the insulating material layers PI1 and PI2 for forming the second insulating layer PAS2 and the third insulating layer PAS3, the photoresists PR1 and PR2 used as masks may be formed using halftone masks. According to an embodiment, even if the display device 10 includes the second bank part BP2 disposed in the emission area EMA, it is possible to form the contact holes CNT1 and CNT2 penetrating the second bank part BP2 while minimizing damage to the light emitting elements ED.

Other embodiments of the display device 10 will now be described with reference to the drawings.

Figure 25:
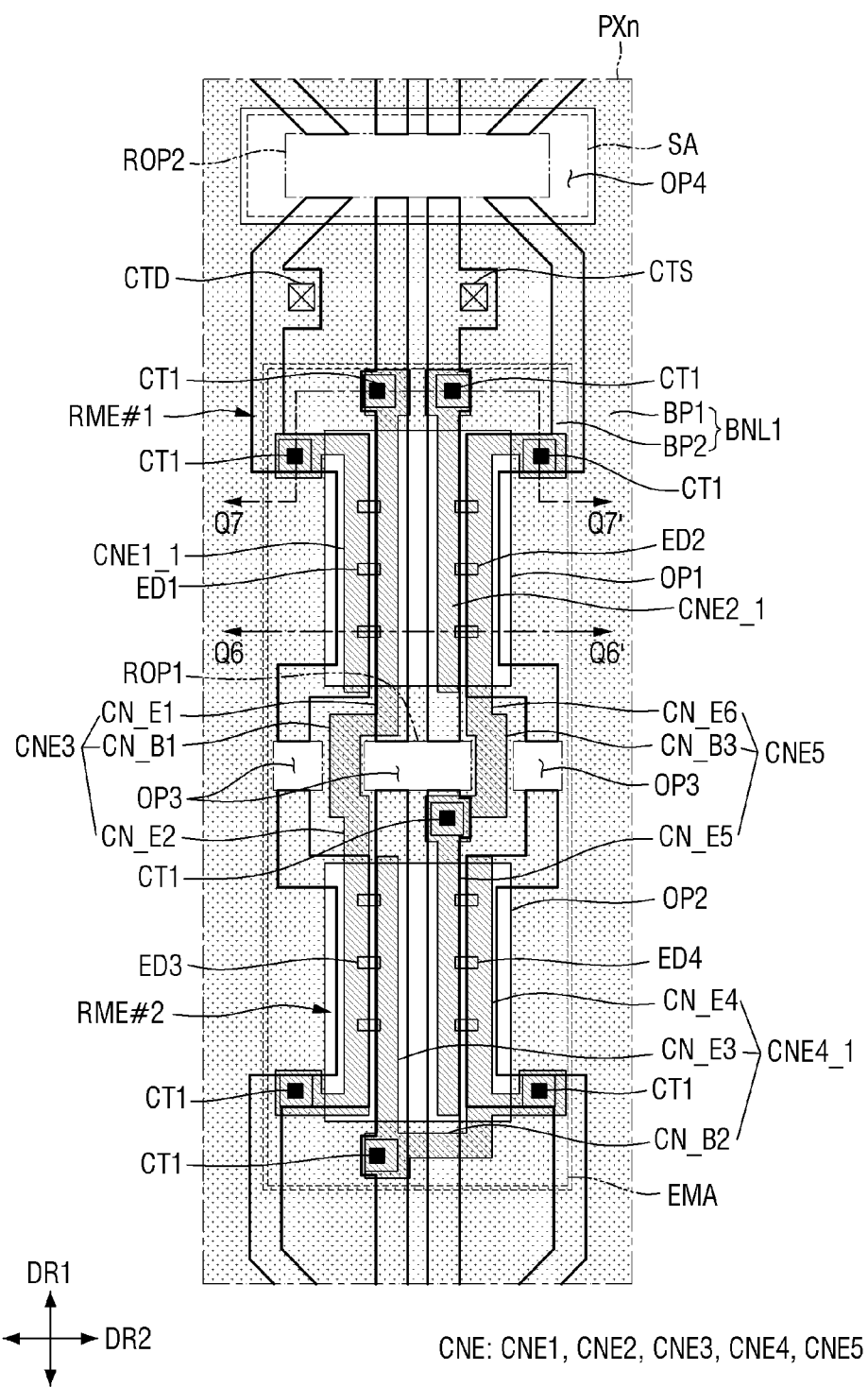
FIG. 25 is a schematic plan view of a subpixel of a display device according to an embodiment.
Figure 26:
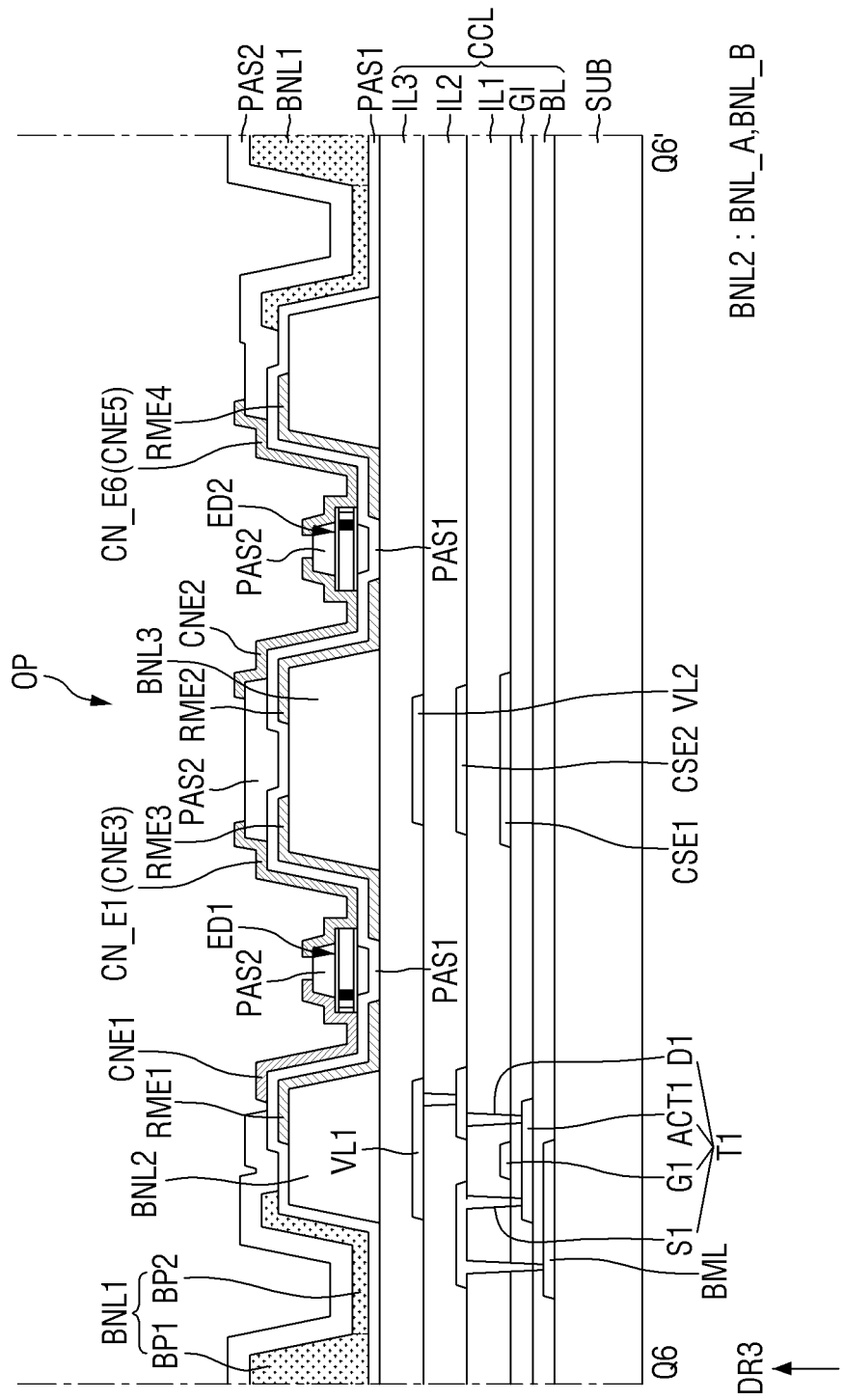
FIG. 26 is a schematic cross-sectional view taken along line Q6-Q6' of FIG. 25.
Figure 27:
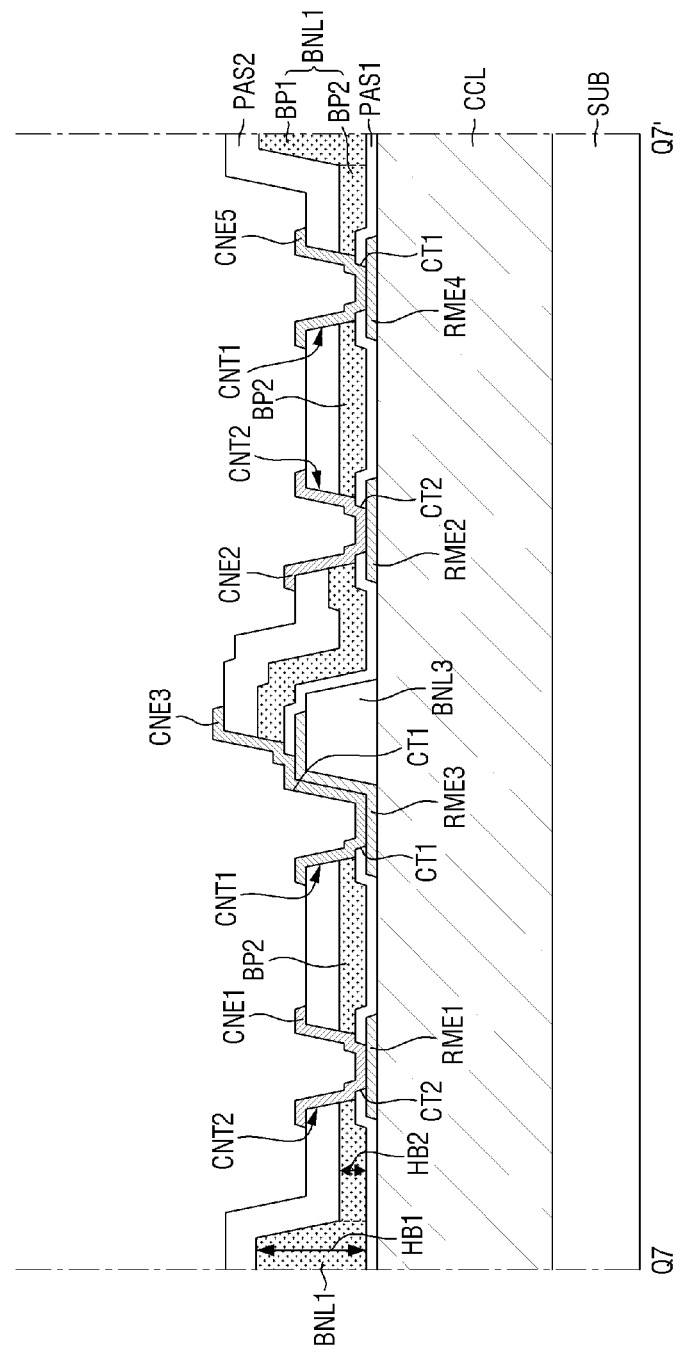
FIG. 27 is a schematic cross-sectional view taken along line Q7-Q7' of FIG. 25.

FIG. 25 is a plan view of a subpixel of a display device 10_1 according to an embodiment. FIG. 26 is a cross-sectional view taken along line Q6-Q6' of FIG. 25. FIG. 27 is a cross-sectional view taken along line Q7-Q7' of FIG. 25.

Referring to FIGS. 25 through 27, in the display device 10_1 according to an embodiment, a third insulating layer PAS3 may be omitted, and the contact electrodes CNE may be disposed on the same layer. The third insulating layer PAS3 may be omitted from the display device 10 as described above. Accordingly, the contact electrodes CNE may be disposed on substantially the same layer regardless of their type.

In the display device 10_1 according to an embodiment, the third insulating layer PAS3 may be omitted, and each of a first contact electrode CNE1, a second contact electrode CNE2 and a fourth contact electrode CNE4 may be directly disposed on a second insulating layer PAS2. The contact electrodes CNE may be formed in the same process but may be spaced apart from each other so that they are not directly connected to each other. For example, the contact electrodes CNE disposed on electrodes RME spaced apart from each other in the first direction DR1 may be spaced apart from each other on the second insulating layer PAS2 covering light emitting elements ED. In a process of forming the second insulating layer PAS2, a first insulating material layer PI1_1 may be patterned to expose both ends of each light emitting element ED. Similar to the first contact holes CNT1, the second contact holes CNT2 may also penetrate the second insulating layer PAS2 and a second bank part BP2. The second contact holes CNT2 may also be formed in the process of forming the second insulating layer PAS2. In the display device 10_1 according to the embodiments, since the third insulating layer PAS3 is omitted and the contact electrodes CNE are simultaneously formed, the number of manufacturing processes can be reduced.

Figure 28:
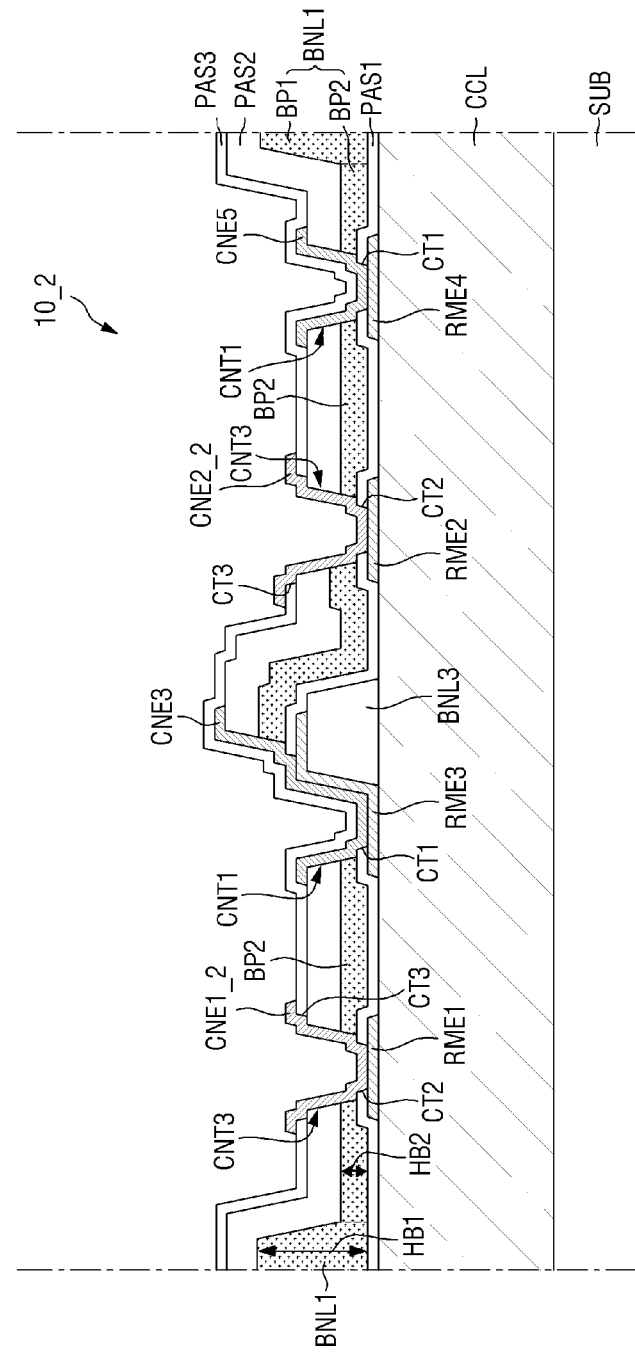
FIG. 28 is a schematic cross-sectional view illustrating the contact holes of a display device according to an embodiment.

FIG. 28 is a cross-sectional view illustrating the contact holes of a display device 10_2 according to an embodiment.

Referring to FIG. 28, the display device 10_2 according to an embodiment may include third contact holes CNT3 penetrating a second bank part BP2 and a second insulating layer PAS2 and third contact portions CT3 formed on the third contact holes CNT3. In the display device 10_2, second contact holes CNT2 through which contact electrodes CNE disposed on a third insulating layer PAS3 contact electrodes RME may be composed of the third contact holes CNT3 formed at the same time as first contact holes CNT1 and the third contact portions CT3 penetrating the third insulating layer PAS3. The display device 10_2 is different from the embodiments of FIG. 6 in that the second bank part BP2 on second contact portions CT2 is also etched in a process of forming the first contact holes CNT1, and the third contact portions CT3 penetrating the third insulating layer PAS3 are formed in a separate process. Thus, redundant descriptions will be omitted, and differences will be described below.

As the contact electrodes CNE disposed on the third insulating layer PAS3, a first contact electrode CNE1, a second contact electrode CNE2 and a fourth contact electrode CNE4 may contact the electrodes RME exposed through the second contact portions CT2, the third contact portions CT3 and the third contact holes CNT3. The second contact portions CT2 may penetrate a first insulating layer PAS1, the third contact holes CNT3 may penetrate the second insulating layer PAS2 and the second bank part BP2, and the third contact portions CT3 may penetrate the third insulating layer PAS3.

According to an embodiment, sidewalls of the second bank part BP2 are aligned with sidewalls of the second insulating layer PAS2 in the third contact holes CNT3, but sidewalls of the third insulating layer PAS3 in the third contact portions CT3 may not be aligned with the sidewalls of the second insulating layer PAS2 in the third contact holes CNT3. The third contact portions CT3 may be wider than the third contact holes CNT3. Since the third contact holes CNT3 and the third contact portions CT3 are formed separately in separate processes, the sidewalls of the third insulating layer PAS3 may not be aligned with the sidewalls of the second insulating layer PAS2.

Unlike in the embodiments of FIG. 6, the third contact portions CT3 penetrating the third insulating layer PAS3 may be formed in a different process from the third contact portions CT3 penetrating the second bank part BP2. The third contact holes CNT3 may be formed together with the first contact holes CNT1 in a process of forming the second insulating layer PAS2.

Figure 29:
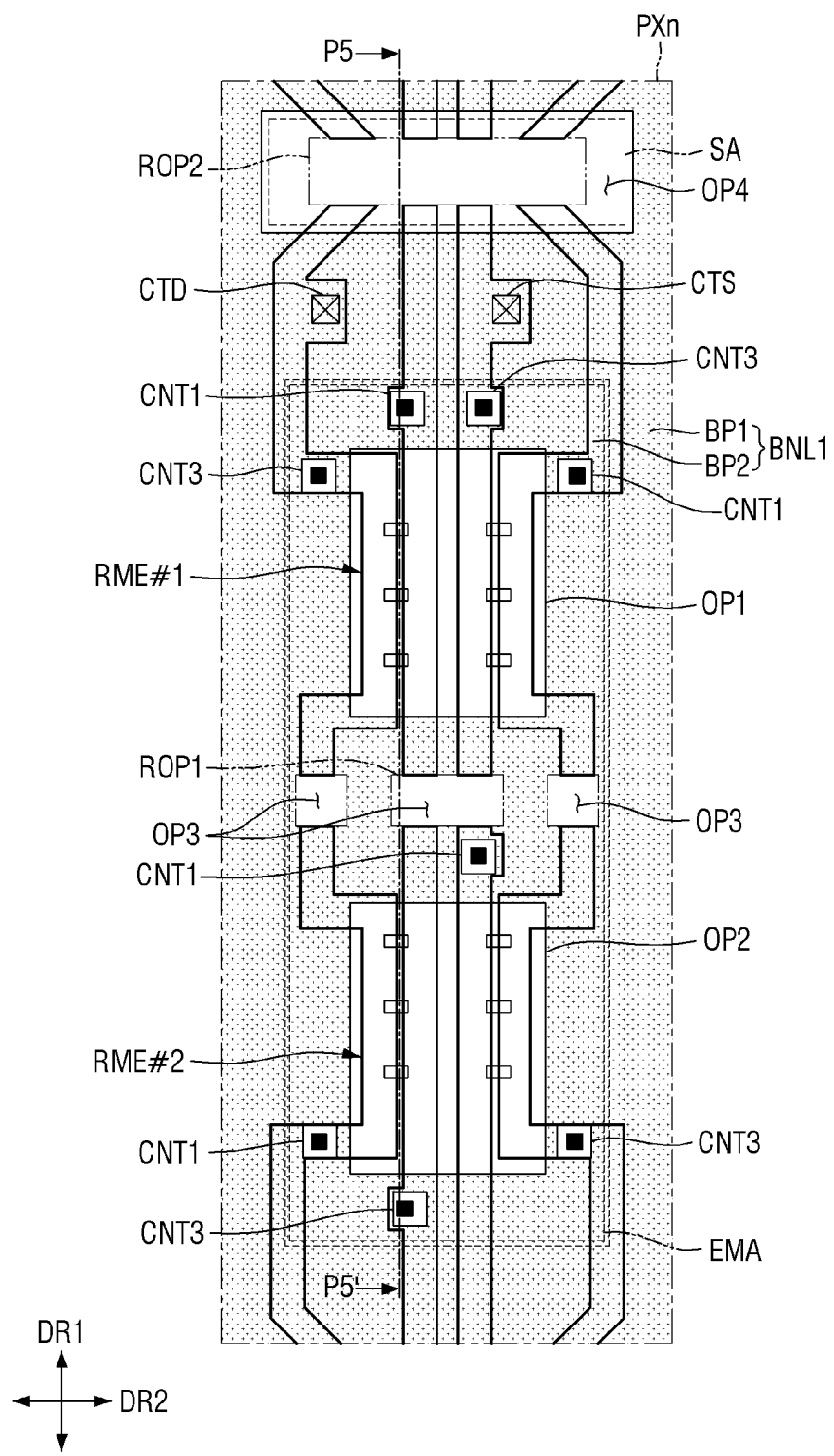
FIG. 29 is a schematic plan view illustrating an operation in a process of manufacturing the display device of FIG. 28.
Figure 30:
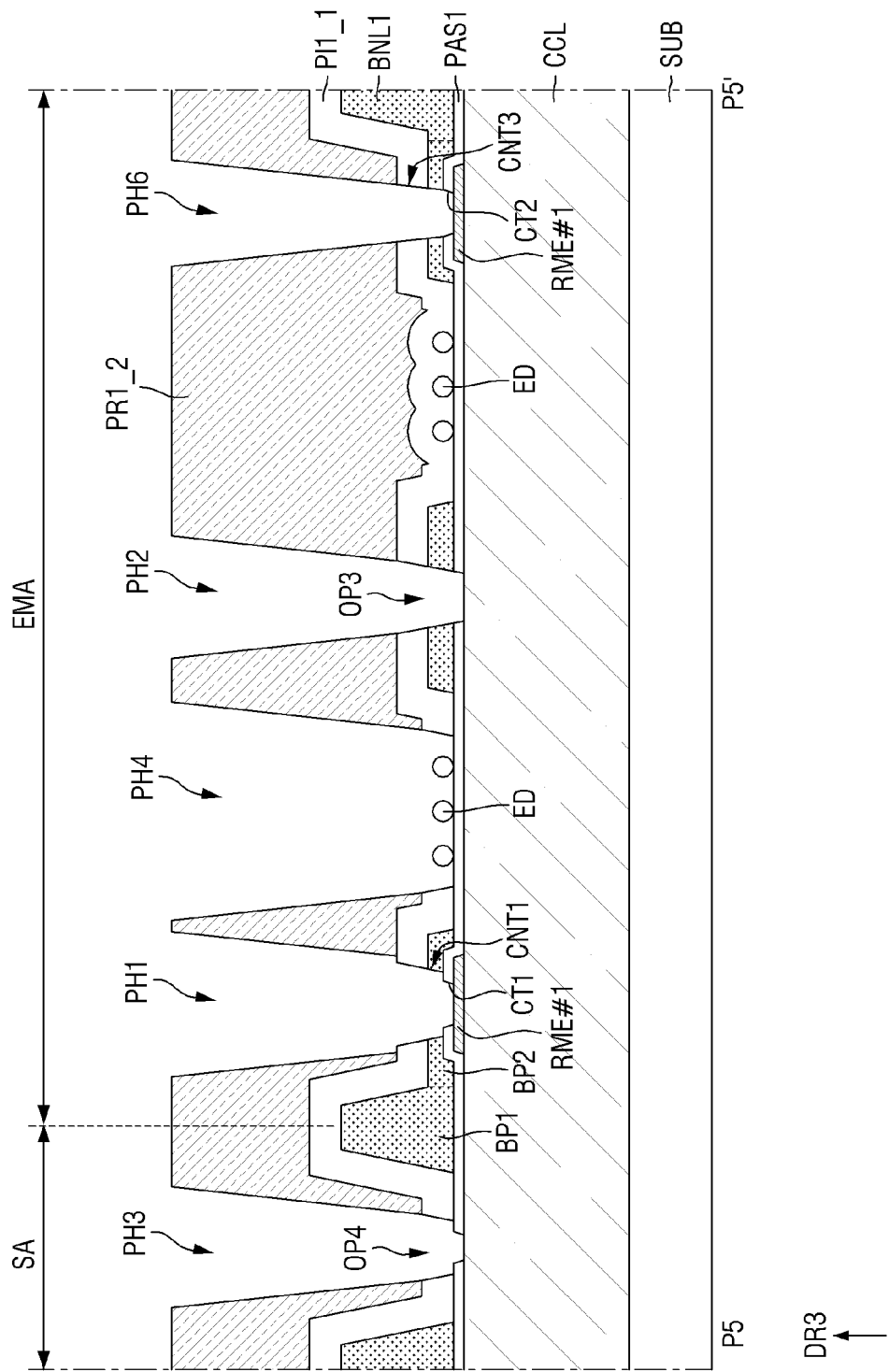
FIG. 30 is a schematic cross-sectional view taken along line P5-P5' of FIG. 29.

FIG. 29 is a plan view illustrating an operation in a process of manufacturing the display device 10_2 of FIG. 28. FIG. 30 is a cross-sectional view taken along line P5-P5' of FIG. 29.

Referring to FIGS. 29 and 30, in a second etching process for forming the second insulating layer PAS2 during the manufacturing process of the display device 10_2, a first photoresist PR1_2 formed on a first insulating material layer PI1_1 may further include a sixth hole PH6 formed on each second contact portion CT2. Accordingly, the third contact holes CNT3 penetrating the second bank part BP2 and the second insulating layer PAS2 may be formed in the second insulating layer PAS2 formed after the second etching process.

In a process of forming the third insulating layer PAS3, a process of exposing the other end of each light emitting element ED and a third etching process for forming the third contact portions CT3 on the third contact holes CNT3 may be performed. Unlike in the embodiment of FIG. 23, the second bank part BP2 is not etched in the process of forming the third insulating layer PAS3. Therefore, the process of forming the third insulating layer PAS3 may be performed through only one etching process. Accordingly, the manufacturing process of the display device 10_2 has a process advantage because the number of patterning processes using a halftone mask can be reduced to one.

Figure 31:
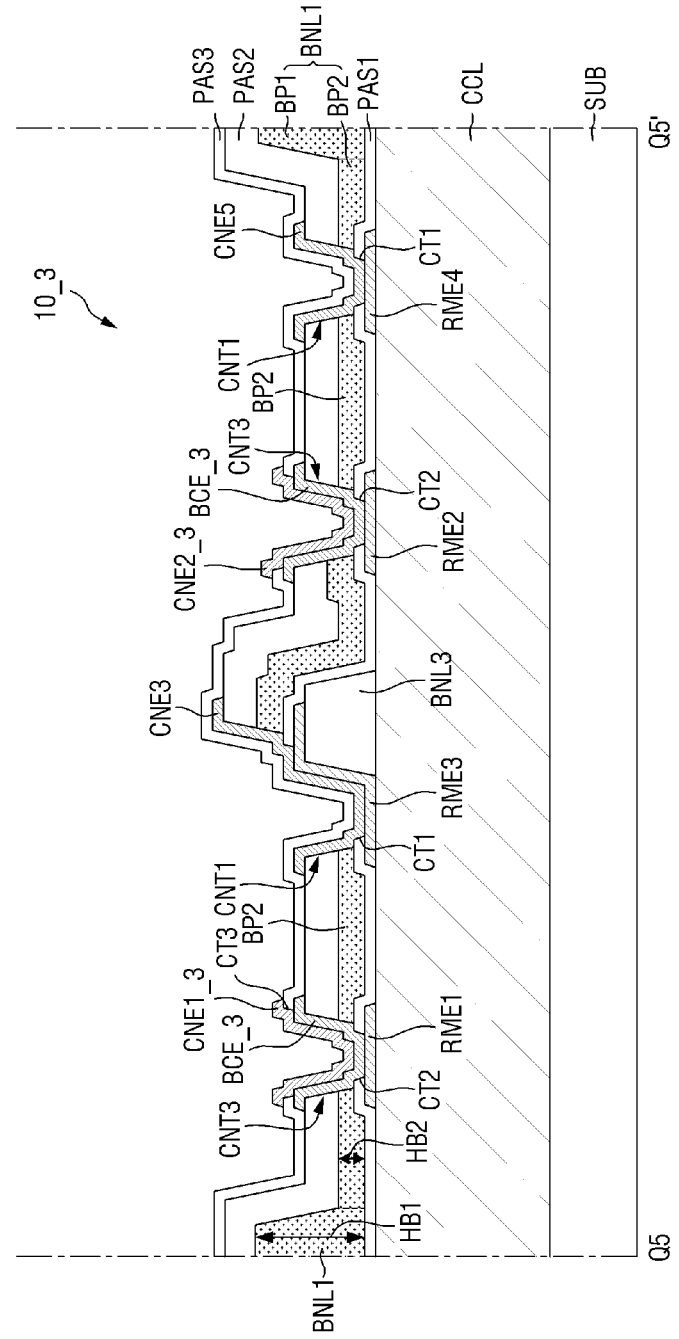
FIG. 31 is a schematic cross-sectional view illustrating the contact holes of a display device according to an embodiment.

FIG. 31 is a cross-sectional view illustrating the contact holes of a display device 10_3 according to an embodiment.

Referring to FIG. 31, the display device 10_3 according to an embodiment may further include bridge electrodes BCE_3 disposed in third contact holes CNT3. In the display device 10_3, as contact electrodes CNE disposed on a third insulating layer PAS3, a first contact electrode CNE1, a second contact electrode CNE2 and a fourth contact electrode CNE4 may contact the electrodes RME through the bridge electrodes BCE_3 disposed on the third contact holes CNT3.

The bridge electrodes BCE_3 may be disposed after a process of forming the second insulating layer PAS2 and may be formed in the same process as a third contact electrode CNE3 and a fifth contact electrode CNE5. The bridge electrodes BCE_3 may be disposed on the second insulating layer PAS2. The bridge electrodes BCE_3 may contact the electrodes RME exposed by second contact portions CT2. The display device 10_3 according to the current embodiment is different from the embodiment of FIG. 28 in that it further includes the bridge electrodes BCE_3. The bridge electrodes BCE_3 may cap the third contact holes CNT3 formed in the same process as first contact holes CNT1 and may protect the electrodes RME exposed by the third contact holes CNT3 in a subsequent process.

Figure 32:
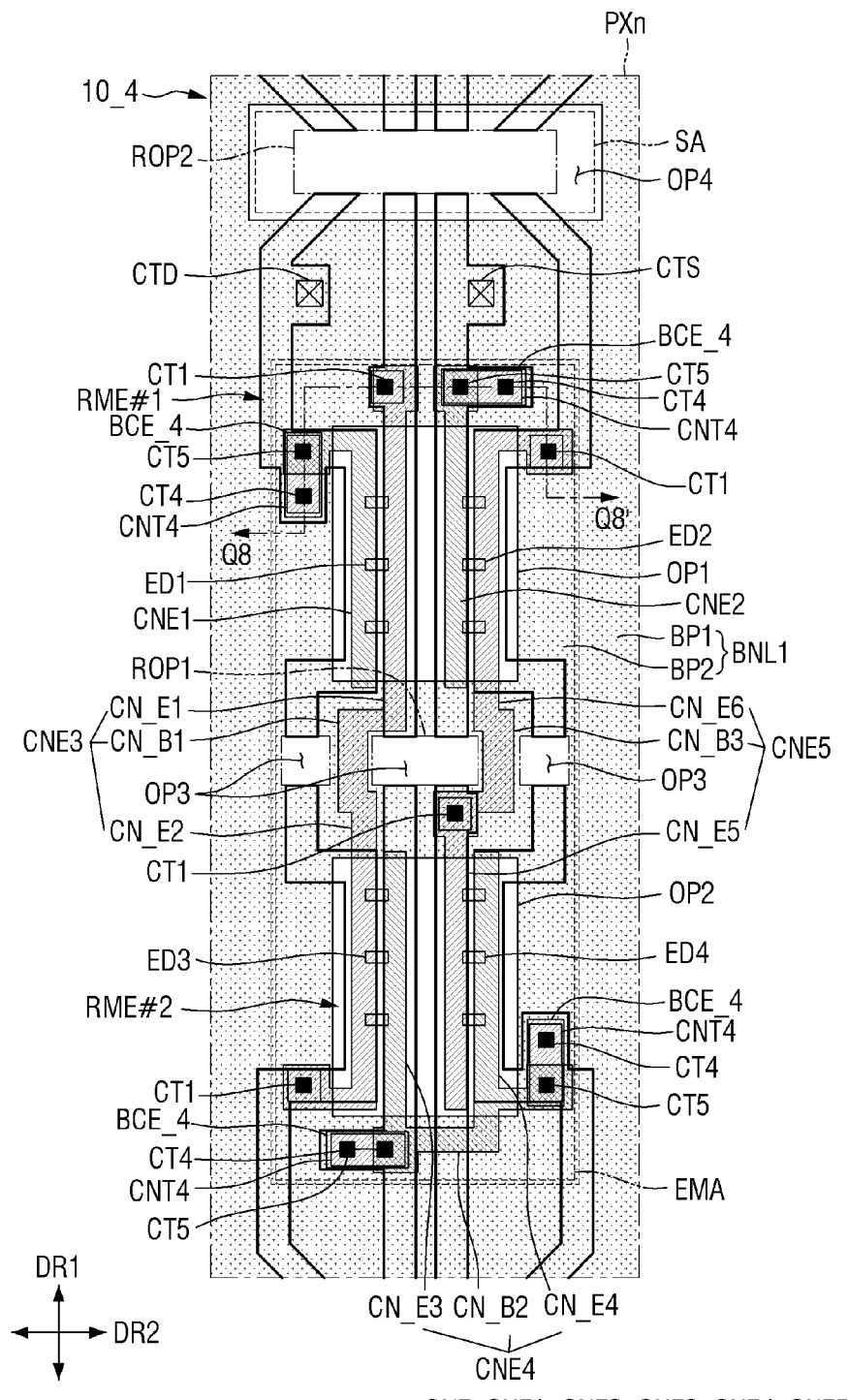
FIG. 32 is a schematic plan view of a subpixel of a display device according to an embodiment.
Figure 33:
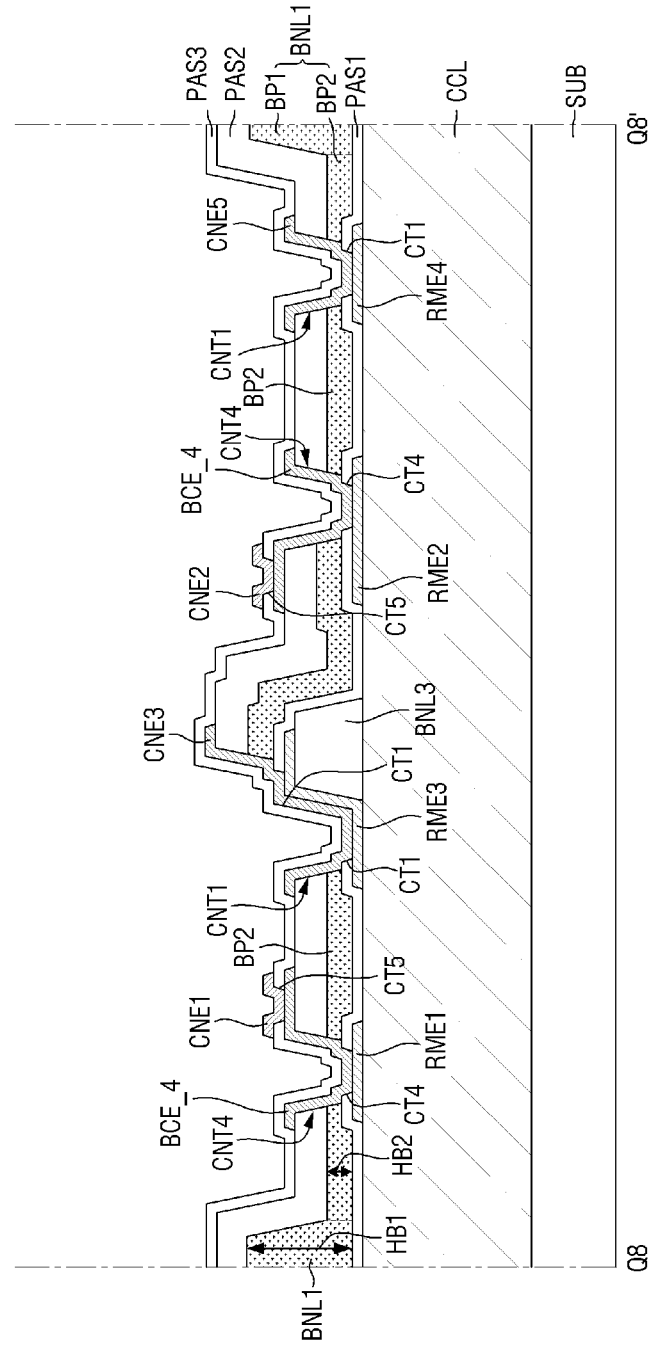
FIG. 33 is a schematic cross-sectional view taken along line Q8-Q8' of FIG. 32.

FIG. 32 is a plan view of a subpixel of a display device 10_4 according to an embodiment. FIG. 33 is a cross-sectional view taken along line Q8-Q8' of FIG. 32.

Referring to FIGS. 32 and 33, in the display device 10_4 according to the embodiments, contact electrodes CNE disposed on a third insulating layer PAS3 may be connected to electrodes RME through bridge electrodes BCE_4, and contact portions CT4 penetrating a first insulating layer PAS1 and contact holes CNT4 penetrating a second insulating layer PAS2 and a second bank part BP2 may not overlap contact portions CT5 penetrating the third insulating layer PAS3. Other contact holes formed in the same process as first contact holes CNT1 may be damaged in a subsequent process of forming the third insulating layer PAS3. To prevent this, the display device 10_4 may further include the bridge electrodes BCE_4 covering the contact holes and contact portions through which the bridge electrodes BCE_4 may contact the contact electrodes CNE disposed on the third insulating layer PAS3 may be formed not to overlap the contact holes.

Of the electrodes RME, each of a first electrode RME1, a second electrode RME2, a seventh electrode RME7 and an eighth electrode RME8 which are electrodes RME contacting the contact electrodes CNE disposed on the third insulating layer PAS3 may further include an electrode extension part EP_4. The electrode extension parts EP_4 may be disposed under the second bank part BP2, and the first insulating layer PAS1 may include fourth contact portions CT4 exposing upper surfaces of the electrode extension parts EP_4. The electrode extension part EP_4 of each of the first electrode RME1 and the eighth electrode RME8 may be formed in a second electrode part RP2. The electrode extension part EP_4 of each of the first electrode RME1 and the eighth electrode RME8 may be located between a first opening OP1 or a second opening OP2 and a first bank part BP1. The electrode extension part EP_4 of the first electrode RME1 may be located on a second side of the first opening OP1 in the second direction DR2, and the electrode extension part EP_4 of the eighth electrode RME8 may be disposed on a first side of the second opening OP2 in the second direction DR2. The electrode extension part EP_4 of each of the second electrode RME2 and the seventh electrode RME7 may also be located between the first opening OP1 or the second opening OP2 and the first bank part BP1. The electrode extension part EP_4 of the second electrode RME2 may be located on a first side of the first opening OP1 in the first direction DR1, and the electrode extension part EP_4 of the seventh electrode RME7 may be located on a second side of the second opening OP2 in the first direction DR1.

The first insulating layer PAS1 may not include second contact portions CT2 but may include the fourth contact portions CT4 respectively exposing the upper surfaces of the electrode extension parts EP_4.

The fourth contact holes CNT4 may be located on the fourth contact portions CT4. The fourth contact holes CNT4 may be formed in the same process as the first contact holes CNT1 and penetrate the second insulating layer PAS2 and the second bank part BP2. The sidewalls of the second insulating layer PAS2 may be aligned with the sidewalls of the second bank part BP2 in the fourth contact holes CNT4.

The bridge electrodes BCE_4 may be disposed on the fourth contact holes CNT4. The bridge electrodes BCE_4 may be disposed after a process of forming the second insulating layer PAS2 and may be formed in the same process as a third contact electrode CNE3 and a fifth contact electrode CNE5. The bridge electrodes BCE_4 may be disposed on the second insulating layer PAS2. The bridge electrodes BCE_4 may contact the electrodes RME exposed by the fourth contact portions CT4.

The third insulating layer PAS3 may include the fifth contact portions CT5 exposing upper surfaces of the bridge electrodes BCE_4. The fifth contact portions CT5 may penetrate the third insulating layer PAS3 and expose the bridge electrodes BCE_4. In an embodiment, the fifth contact portions CT5 may overlap the electrode extension parts EP_4 but may not overlap the fourth contact portions CT4 and the fourth contact holes CNT4. As the contact electrodes CNE disposed on the third insulating layer PAS3, a first contact electrode CNE1, a second contact electrode CNE2 and a fourth contact electrode CNE4 may contact the bridge electrodes BCE_4 exposed through the fifth contact portions CT5. Even if the first contact electrode CNE1, the second contact electrode CNE2 and the fourth contact electrode CNE4 do not overlap the fourth contact portions CT4 exposing upper surfaces of the electrodes RME, they may be electrically connected to the electrodes RME through the bridge electrodes BCE_4.

A display device according to an embodiment includes a bank having different heights and having a part disposed in an emission area. Thus, it is possible to induce smooth alignment of light emitting elements while preventing ink including the light emitting elements from overflowing. In particular, the part of the bank which is disposed in the emission area can prevent the light emitting elements from being disposed in an unwanted area and lost.

In concluding the detailed description, those skilled in the art will appreciate that many variations and modifications can be made to the embodiments without substantially departing from the principles of the disclosure. Therefore, the disclosed embodiments of the invention are used in a generic and descriptive sense only and not for purposes of limitation.

What is claimed is:
1. A display device comprising:
subpixels each comprising an emission area;
electrodes which are disposed in the emission area, extend in a first direction, and are spaced apart in a second direction intersecting the first direction;
a first insulating layer disposed on the electrodes;
a first bank comprising:
  a first bank part disposed on the first insulating layer and surrounding the emission area; and
  a second bank part connected to the first bank part and disposed in the emission area;
light emitting elements disposed on the electrodes spaced apart in the second direction, wherein a height of the second bank part of the first bank is lower than a height of the first bank part of the first bank;
a second insulating layer which is dispose on the light emitting elements and the second bank part and exposes ends of each of the light emitting elements; and
contact electrodes which are disposed on the electrodes and the second insulating layer and contact the light emitting elements.

2. The display device of claim 1, wherein
the first insulating layer comprises first contact portions which partially expose upper surfaces of the electrodes, and
the display device further comprises:
first contact holes which are formed on the first contact portions and penetrate the second bank part and the second insulating layer.

3. The display device of claim 2, wherein a sidewall of the second insulating layer is aligned with a sidewall of the second bank part in the first contact holes.

4. The display device of claim 2, wherein at least one of the contact electrodes electrically contacts at least one of the electrodes through at least one of the first contact holes and at least one of the first contact portions.

5. The display device of claim 1, wherein
the first insulating layer comprises second contact portions which partially expose the upper surfaces of the electrodes, and
the display device further comprises:
a third insulating layer disposed on the second insulating layer; and
second contact holes which are formed on the second contact portions and penetrate the second bank part, the second insulating layer, and the third insulating layer.

6. The display device of claim 5, wherein at least one of the contact electrodes electrically contacts at least one of the electrodes through at least one of the second contact holes and at least one of the second contact portions.

7. The display device of claim 5, further comprising:
third contact holes which are formed on the second contact portions and penetrate the second bank part and the second insulating layer; and
third contact portions which are formed on the third contact holes and penetrate the third insulating layer,
wherein at least one of the contact electrodes electrically contacts at least one of the electrodes through at least one of the third contact portions, at least one of the third contact holes, and at least one of the second contact portions.

8. The display device of claim 7, further comprising:
bridge electrodes which are disposed on the second insulating layer and disposed on the second contact portions and the third contact holes,
wherein at least one of the contact electrodes electrically contacts at least one of the bridge electrodes through at least one of the third contact portions.

9. The display device of claim 8, wherein the third contact portions are formed on the second contact portions.

10. The display device of claim 5, wherein
the first insulating layer comprises fourth contact portions partially exposing the upper surfaces of the electrodes, and
the display device further comprises:
fourth contact holes which are formed on the fourth contact portions and penetrate the second bank part and the second insulating layer; and
fifth contact portions which penetrate the third insulating layer and do not overlap the fourth contact holes.

11. The display device of claim 10, further comprising:
bridge electrodes which are disposed on the second insulating layer and disposed on the fourth contact portions and the fourth contact holes,
wherein at least one of the contact electrodes electrically contacts at least one of the bridge electrodes through at least one of the fifth contact portions.

12. The display device of claim 1, wherein
the electrodes comprise:
a first electrode group; and
a second electrode group spaced apart from the first electrode group in the first direction, and
the first bank comprises:
a first opening which overlaps the first electrode group and exposes the first insulating layer; and
a second opening which is spaced apart from the first opening in the first direction, overlaps the second electrode group, and exposes the first insulating layer.

13. The display device of claim 12, wherein the light emitting elements are disposed on the first insulating layer in the first opening and in the second opening.

14. The display device of claim 12, wherein
the second bank part further comprises a third opening which is disposed between the first opening and the second opening,
the first insulating layer is not disposed in the third opening, and
the first electrode group and the second electrode group are spaced apart in the first direction in the third opening.

15. The display device of claim 12, further comprising:
a sub area located in the first direction of the emission area,
wherein the first bank part surrounds the sub area.

16. A display device comprising:
an emission area;
a sub area spaced apart from the emission area in a first direction;
a first electrode group including electrodes that extend in the first direction and are spaced apart in a second direction intersecting the first direction;
a second electrode group which is spaced apart from the first electrode group in the first direction and comprises electrodes;
a first insulating layer disposed on the electrodes of the first electrode group and the second electrode group, and including first contact portions and second contact portions that expose upper surfaces of the electrodes of the first electrode group and the second electrode group;
a first bank including:
a first bank part disposed on the first insulating layer and surrounding the emission area and the sub area; and
a second bank part connected to the first bank part, disposed in the emission area, and partially overlapping the electrodes of the first electrode group and the second electrode group; and
light emitting elements disposed on the electrodes of the first electrode group and the second electrode group that are spaced apart in the second direction, wherein
the second bank part comprises:
a first opening which overlaps the first electrode group and exposes the first insulating layer; and
a second opening which overlaps the second electrode group and exposes the first insulating layer, and
the light emitting elements are disposed in the first opening or the second opening.

17. The display device of claim 16, wherein a height of the second bank part is lower than a height of the first bank part.

18. The display device of claim 16, further comprising:
a second insulating layer which is disposed on the second bank part and the light emitting elements and exposes ends of each of the light emitting elements;
a third insulating layer which is disposed on the second insulating layer;
first contact holes which penetrate the second insulating layer and the second bank part and are disposed on the first contact portions; and
second contact holes which penetrate the second bank part, the second insulating layer and the third insulating layer and are disposed on the second contact portions.

19. The display device of claim 18, further comprising:
contact electrodes which are disposed on the electrodes of the first electrode group and the second electrode group and electrically contact the light emitting elements, wherein
at least one of the contact electrodes is disposed on the second insulating layer and electrically contacts at least one of the electrodes through at least one of the first contact holes, and
at least one of the contact electrodes is disposed on the third insulating layer and electrically contacts at least one of the electrodes through at least one of the second contact holes.

\* \* \* \* \*